(12) United States Patent
Stein

(10) Patent No.: US 11,521,803 B2
(45) Date of Patent: Dec. 6, 2022

(54) BIOCHEMICAL ENERGY CONVERSION CELL

(71) Applicant: Bugsy Solar LLC, Los Altos Hills, CA (US)

(72) Inventor: Emily A. Stein, San Leandro, CA (US)

(73) Assignee: Bugsy Solar LLC, Los Altos Hills, CA (US)

( * ) Notice: Subject to any disclaimer, the term of this patent is extended or adjusted under 35 U.S.C. 154(b) by 37 days.

(21) Appl. No.: 16/949,145

(22) Filed: Oct. 15, 2020

(65) Prior Publication Data
US 2021/0043394 A1 Feb. 11, 2021

Related U.S. Application Data

(63) Continuation of application No. 15/962,931, filed on Apr. 25, 2018, now Pat. No. 10,847,322, which is a
(Continued)

(51) Int. Cl.
*H01G 9/20* (2006.01)
*H01L 51/00* (2006.01)

(52) U.S. Cl.
CPC ......... *H01G 9/2018* (2013.01); *H01G 9/2059* (2013.01); *H01G 9/2072* (2013.01);
(Continued)

(58) Field of Classification Search
CPC .................................................... C12M 23/06
See application file for complete search history.

(56) References Cited

U.S. PATENT DOCUMENTS

| 4,886,752 A | 12/1989 | Lovley |
| 5,324,491 A | 6/1994 | Lovley |

(Continued)

FOREIGN PATENT DOCUMENTS

| CN | 101299463 | 11/2008 |
| CN | 101409355 | 4/2009 |

(Continued)

OTHER PUBLICATIONS

Hai et al, Leachate treatment and electricity generation using an algae-cathode microbial fuel cell with continuous flow through the chambers in series, Science of the Total Environment 723, 2002, 138054 (Year: 2002).*

(Continued)

*Primary Examiner* — Shannon M Gardner
(74) *Attorney, Agent, or Firm* — Weaver Austin Villeneuve & Sampson LLP

(57) ABSTRACT

Presented herein is a voltaic cell containing light harvesting antennae or other biologically-based electron generating structures optionally in a microbial population, an electron siphon population having electron conductive properties with individual siphons configured to accept electrons from the light harvesting antennae and transport the electrons to a current collector, an optional light directing system (e.g., a mirror), and a regulator having sensing and regulatory feedback properties for the conversion of photobiochemical energy and biochemical energy to electricity. Also presented herein is a voltaic cell having electricity-generating abilities in the absence of light. Also presented herein is the use of the voltaic cell in a solar panel.

16 Claims, 23 Drawing Sheets

Related U.S. Application Data continuation of application No. 14/315,226, filed on Jun. 25, 2014, now Pat. No. 10,090,113.

(60) Provisional application No. 61/991,335, filed on May 9, 2014, provisional application No. 61/879,612, filed on Sep. 18, 2013, provisional application No. 61/957,147, filed on Jun. 25, 2013.

(52) U.S. Cl.
CPC ........ *H01L 51/0093* (2013.01); *Y02E 10/542* (2013.01); *Y02E 10/549* (2013.01)

(56) References Cited

U.S. PATENT DOCUMENTS

| | | | |
|---|---|---|---|
| 8,283,076 | B2 | 10/2012 | Lovley et al. |
| 10,090,113 | B2 | 10/2018 | Stein |
| 10,847,322 | B2 | 11/2020 | Stein |
| 2004/0241771 | A1 | 12/2004 | Zeikus et al. |
| 2006/0257985 | A1 | 11/2006 | Lovley et al. |
| 2008/0286624 | A1 | 11/2008 | Lovley et al. |
| 2010/0059436 | A1 | 3/2010 | Lovley et al. |
| 2010/0224246 | A1 | 9/2010 | Tender |
| 2010/0304189 | A1 | 12/2010 | Lovley et al. |
| 2011/0151544 | A1 | 6/2011 | Lovley et al. |
| 2012/0164544 | A1 | 6/2012 | Nevin et al. |
| 2014/0373920 | A1 | 12/2014 | Stein |
| 2016/0230206 | A1 | 8/2016 | Lovley et al. |
| 2018/0247771 | A1 | 8/2018 | Stein |

FOREIGN PATENT DOCUMENTS

| | | | | |
|---|---|---|---|---|
| CN | 102324546 | A | 1/2012 | |
| CN | 102674529 | | 9/2012 | |
| CN | 105593957 | B | 12/2019 | |
| GB | 2466415 | B | 2/2011 | |
| JP | 2010-218690 | A | 9/2010 | |
| WO | WO-03006713 | A1 * | 1/2003 | ............... C12P 1/00 |
| WO | WO-2009040546 | A1 | 4/2009 | |
| WO | WO2011/087821 | A2 | 7/2011 | |
| WO | WO 2011/113154 | A1 | 9/2011 | |
| WO | WO 2014/210216 | | 12/2014 | |
| WO | WO2017/015306 | A2 | 1/2017 | |

OTHER PUBLICATIONS

U.S. Office Action dated Jan. 19, 2017 issued in U.S. Appl. No. 14/315,226.
U.S. Final Office Action dated Jul. 5, 2017 issued in U.S. Appl. No. 14/315,226.
U.S. Notice of Allowance dated Jan. 26, 2018 issued in U.S. Appl. No. 14/315,226.
U.S. Supplemental Notice of Allowance dated Mar. 7, 2018 issued in U.S. Appl. No. 14/315,226.
U.S. Office Action dated Oct. 4, 2019 issued in U.S. Appl. No. 15/962,931.
U.S. Notice of Allowance dated Jul. 13, 2020 issued in U.S. Appl. No. 15/962,931.
AU Examination Report dated May 12, 2017, issued in Application No. 2014302421.
AU Examination Report No. 1 dated Mar. 27, 2019, issued in Application No. 2018201828.
AU Examination Report No. 2 dated Jul. 19, 2019, issued in Application No. 2018201828.
BR Office Action dated Mar. 3, 2020, issued in Application No. 1120150322220.
CA Office Action dated Apr. 8, 2020, issued in Application No. 2,916,659.
CN Office Action dated Aug. 14, 2017, issued in Application No. 201480041193.3.
CN Office Action dated Apr. 16, 2018, issued in Application No. 201480041193.3 [English summary].
CN Office Action dated Sep. 17, 2018, issued in Application No. 201480041193.3.
CN Office Action dated Feb. 27, 2019, issued in Application No. 201480041193.3.
IL Office Action dated Jul. 17, 2019, issued in Application No. 243104.
IL Office Action dated May 26, 2020, issued in Application No. 243104.
IN Office Action dated Dec. 23, 2019, issued in Application No. 4246/KOLNP/2015.
Japanese Office Action dated Aug. 16, 2016 in JP Application No. 2015-563182.
Japanese Office Action dated May 16, 2017, issued in Application No. 2015-563182.
Korean Office Action dated May 6, 2020, issued in Application No. 10-2016-7001815.
Japanese Office Action dated Jun. 4, 2019, issued in Application No. 2018-043654.
MX Office Action dated Jul. 2, 2019, issued in Application No. MX/a/2015/017422.
MX Office Action dated Feb. 7, 2020, issued in Application No. MX/a/2015/017422.
International Search Report and Written Opinion dated Mar. 27, 2015 in PCT Application No. PCT/US2014/044178.
International Preliminary Report on Patentability Dec. 29, 2015 in PCT Application No. PCT/US2014/044178.
Chiao, M. et al., "Micromachined microbial and photosynthetic fuel cells," Journal of Micromechanics and Microengineering, vol. 16, Apr. 26, 2006, pp. 2547-2553.
"Dye-sensitized solar cell", Wikipedia article, as revised Jun. 5, 2014. [https://en.wikipedia.org/w/index.php?title=Dye-sensitized_solar_cell&diff=611689947&oldid=607179000].
Futterer, et al., "Genome sequence of Picrophilus torridus and its implications for life around pH 0," PNAS vol. 101, No. 24, Jul. 15, 2004, 6 pages.
He et al., "Self-sustained phototrophic microbial fuel cells based on the synergistic cooperation between photosynthetic microorganisms and heterotrophic bacteria," environ sci tech, 2009, 43, 1648-1654.
Islam, "Augmentation of air cathode microbial fuel cell performance using wild type Klebsiella variicola," RSC Adv., 2017, 7, 4798, Dec. 26, 2016, 8 pages.
Jochum, T. et al., "The supramolecular organization of self-assembling chlorosomal bacteriochlorophyll c, d, or e mimics," Proceedings of the National Academy of Sciences (PNAS), vol. 105, No. 35, Sep. 2, 2008, pp. 12736-12741.
Kumar, A., et al. "Does Bioelectrochemical Cell Configuration and Anode Potential Affect Biofilm Response?," *Biochem. Soc. Trans.*, 2012, vol. 40, pp. 1308-1314; doi:10.1042/BST20120130.
Logan, B. E., "Scaling up microbial fuel cells and other bioelectrochemical systems," *Appl Microbiol Biotechnol* (2010), 85, pp. 1665-1671.
McKinlay, et al., "Insights into Actinobacillus succinogenes Fermentative Metabolism in a Chemically Defined Growth Medium," Applied and Environmental Microbiology, vol. 71, No. 11, Nov. 2005, 6 pages.
Newton, et al., "Analyses of Current-Generating Mechanisms of Shewanella loihica PV-4 and Shewanella oneidensis MR-1 in Microbial Fuel Cells," Applied and Environmental Microbiology, Vo. 75, No. 24, Dec. 2009, 8 pages.
Nielsen, L.P., et al., "Electric Currents Couple Spatially Separated Biogeochemical Processes in Marine Sediment," *Nature*, vol. 463, No. 25, Feb. 2010, pp. 1071-1074.
Pant, D. et al., "A review of the substrates used in microbial fuel cells (MFCs) for sustainable energy production," Bioresource Technology (2009), <doi:10.1016/i.biortech.2009.10.017>.
Perkins, R., "Bacterial nanowires not what scientists thought they were," R&D Mag.com, Aug. 19, 2014, 3 pages. [http://www.rdmag.com/videos/2014/08/bacterial-nanowires-not-what-scientists-thought-they-were].

(56) References Cited

OTHER PUBLICATIONS

Rabaey, K., et al., "Microbial Ecology Meets Electrochemistry: Electricity-Driven and Driving Communities," 2007 International Society for Microbial Ecology, The ISME Journal, Feb. 2007, Vo.1, pp. 9-18.
Rabaey, R. et al., "Microbial fuel cells: novel biotechnology for energy generation," Trends in Biotechnology, vol. 23, No. 6, Jun. 2005, pp. 291-297.
Rahimnejad, M., et al. "Microbial fuel cell as new technology for bioelectricity generation: A review," Alexandria Engineering Journal, vol. 54, 2015, pp. 745-756.
Rosenbaum, M., et al., "In Situ Electrooxidation of Photobiological Hydrogen in a Photobioelectrochemical Fuel Cell Based on Rhodobacter Sphaeroides," *American Chemical Society*, Environ. Sci. & Technol., published Jul. 9, 2005, 6 pages (A-F).
Schleper, et al., "*Picrophilus* gen. nov., fam. nov.: a Novel Aerobic, Heterotrophic, Thermoacidophilic Genus and Family Comprising Archaea Capable of Growth around pH 0," Journal of Bacteriology, vol. 177, No. 24, Dec. 1995, 10 pages.
Schleper, et al., "Picrophilus oshimae and *Picrophilus tomdus* fam. nov., gen. nov., sp. nov., Two Species of Hyperacidophilic, Thermophilic,Heterotrophic, Aerobic Archaea," International Journal of Systematic Bacteriology, vol. 46, No. 3, Jul. 1996, 3 Pages.
Strik, D., et al., "Microbial solar cells: applying photosynthetic and electrochemically active organisms," Trends in Biotechnology, vol. 29, No. 1, Jan. 2011, pp. 41-49.
Tsujimura, et al., "Recent Development of Enzyme-based Biofuel Cells," GS Yuasa Technical Report vol. 5, No. 2, pp. 1-6, Dec. 25, 2008, vol. 5, 6 pages.
van de Vossenberg, et al., "Bioenergetics and cytoplasmic membrane stability of the extremely acidophilic, thermophilic archaeon Picrophilus oshimae," Extremophiles, Jun. 1998, 8 pages.
Wei, J., et al., "Recent progress in electrodes for microbial fuel cells," (Accepted Manucript) *Bioresource Technology*, 102, Jul. 2011, 46 pp., <10.1016/j.biortech.2011.07.019>.
Wintermute, E.H., et al., "Emergent cooperation in microbial metabolism," *Molecular Systems Biology*, 6:407, 2010, pp. 1-7.
Xie, X. et al., "Microbial battery for efficient energy recovery," Proceedings of the National Academy of Sciences (PNAS), vol. 110, No. 40, Apr. 18, 2013, pp. 15925-15930. [www.pnas.org/cgi/doi/10.1073/pnas.1307327110].
Arizona State University, "How Blue and Green Clays Kill Bacteria," ScienceDaily, Jan. 11, 2016, www.sciencedaily.com/releases/2016/01/160111121446.htm, 3 pages.
Baldwin, R. P. "Electrochemical determination of carbohydrates: Enzyme electrodes and amperometric detection in liquid chromatography and capillary electrophoresis," Journal of Pharmaceutical and Biomedical Analysis, 1999, vol. 19, pp. 69-81.
Balk, M. et al., "*Thermotoga lettingae* sp. nov., a novel thermophilic, methanol-degrading bacterium isolated from a thermophilic anaerobic reactor," International Journal of Systematic and Evolutionary Microbiology, 2002, vol. 52, pp. 1361-1368.
Bjerg, J.T. et al., "Long-distance electron transport in individual, living cable bacteria," PNAS, May 29, 2018, vol. 115, No. 22, pp. 5786-5791.
Boden, R. et al., "Evaluation of the genus *Thiothrix winogradsky* 1888 (Approved Lists 1980) emend. Aruga et al. 2002: reclassification of Thiothrix disciformis to *Thiolinea disciformis* gen. nov., comb. nov., and of Thiothrix flexilis to *Thiofilum flexile* gen. nov., comb nov., with emended description of Thiothrix," J Syst Evol Microbiol, 2018, vol. 68, pp. 2226-2239.
Boudemagh, A. et al., "Biodegradation of methanol in a batch reactor by a microbial flora isolated from a wastewater treatment plant sludge at Elmenia in Constantine," Fresenius Environmental Bulletin, Dec. 2006, vol. 15, No. 12, pp. 1590-1594.
BR Office Action dated Nov. 16, 2021, in Application No. BR1120150322220 with English translation.
Brown, M., "Electrons charge down DNA molecular wire," Chemistry World, Jan. 20, 2011, 3 pages.
CA Office Action dated Aug. 17, 2021, issued in Application No. 2,916,659.
Cannella, D. et al., "Light-driven oxidation of polysaccharides by photosynthetic pigments and a metalloenzyme," Nature Communications, Apr. 4, 2016, vol. 7, No. 11134, 8 pages.
Cardinal Health, "Hydrogel—customized for unique specifications," Brochure, 2020, 4 pages.
Cardinal Health, "Wound care: Skin health is mission critical," Catalog, 2019, 70 pages.
Choo, H. et al., "Effects of clay fraction and pore water conductivity on electrical conductivity of sand-kaolinite mixed soils," Journal of Petroleum Science and Engineering, 2016, vol. 147, pp. 735-745.
CN Office Action dated Mar. 10, 2021, issued in Application No. 201911107176.6.
Covidien, "Hydrogels: The Industry's Choice in Gel," Brochure, 2009, 4 pages.
Electric cable bacteria breathe oxygen with unheard efficiency (Feb. 10, 2021) retrieved Mar. 5, 2021 from https://phys.org/news/2021-02-electric-cable-bacteria-oxygen-unheard.html, 3 pages.
EP Search Report dated May 19, 2021, issued in Application No. 20206692.4.
Hashidoko, Y. et al., "Soft Gel Medium Solidified with Gellan Gum for Preliminary Screening for Root-associating, Free-living Nitrogen-fixing Bacteria Inhabiting the Rhizoplane of Plants," Biosci. Biotechnol. Biochem., 2002, vol. 66 No. 10, pp. 2259-2263.
He, Z. et al., "Anti-biofilm Activities from Resveratrol against Fusobacterium nucleatum," Frontiers in Microbiology, Jul. 2016, vol. 7, Article 1065, 9 pages.
IL Office Action dated Oct. 25, 2020, issued in Application No. 243104.
IN Office action dated Oct. 14, 2021, in IN Application No. IN202038032154.
Knoll, A. H., "Winogradsky Column: Microbial Ecology in a Bottle." Holiday Lectures on Science, Changing Planet: Past, Present, Future, Howard Hughes Medical Institute, 2012, https://www.biointeractive.org/sites/default/files/Biointeractive_Winogradsky.jpg (last visited Apr. 26, 2022).
Kolb, S. "Aerobic methanol-oxidizing Bacteria in soil," FEMS Microbiol Lett, 2009, vol. 300, pp. 1-10.
Korean Office Action dated May 26, 2021, issued in Application No. 10-2016-7001815.
Korean Office Action dated Nov. 26, 2020, issued in Application No. 10-2016-7001815.
Korean Office Action dated Sep. 8, 2021, issued in Application No. 10-2021-7019996.
KR Office Action dated Feb. 8, 2022, in Application No. KR1020217033249 with English translation.
Kusoglu, A. et al., "New Insights into Perfluorinated Sulfonic-Acid Ionomers," Chem. Rev., 2017, vol. 117, pp. 987-1104.
Leimin, X. et al., "Investigation of a Novel Catalyst Coated Membrane Method to Prepare Low-Platinum-Loading Membrane Electrode Assemblies for PEMFCs," Fuel Cells, 2009, vol. 08, No. 2, pp. 101-105.
Litster, S. et al., "PEM fuel cell electrodes," Journal of Power Sources, 2004, vol. 130, pp. 61-76.
Meysman, J.R. et al., "A highly conductive fibre network enables centimetre-scale electron transport in multicellular cable bacteria," Nature Communications, 2019, vol. 10, No. 4120, pp. 1-8.
Morawe, M. et al., "Acidotolerant Bacteria and Fungi as a Sink of Methanol-Derived Carbon in a Deciduous Forest Soil," Frontiers in Microbiology, Jul. 24, 2017, vol. 8, Article 1361, pp. 1-18. www.frontiersin.org.
Mueller, B., "Experimental Interactions Between Clay Minerals and Bacteria: A Review," Pedosphere, 2015, vol. 25, No. 6, pp. 799-810.
Neburchilov, V. et al., "A review of polymer electrolyte membranes for direct methanol fuel cells," Journal of Power Sources, 2007, vol. 169, pp. 221-238.
PennState Extension, "Researchers Identify the Key to Bacteria Converting Methane to Methanol," May 31, 2019, 1 page.
Richter, H. et al., "Electricity Generation by Geobacter Sulfurreducens Attached to Gold Electrodes", Langmuir, Apr. 1, 2008, vol. 24, No. 8, pp. 4376-4379.

(56) References Cited

OTHER PUBLICATIONS

Rollefson, J. B. et al., "Identification of an Extracellular Polysaccharide Network Essential for Cytochrome Anchoring and Biofilm Formation in Geobacter sulfurreducens," Journal of Bacteriology, Mar. 2011, vol. 193. No. 5, pp. 1023-1033.

Ross, M. O. et al., "Particulate methane monooxygenase contains only mononuclear copper centers," Science, May 10, 2019, vol. 364, pp. 566-570.

Shad, M. et al., "Microbial Production of Methanol," PowerPoint Presentation, Apr. 18, 2016, Retrieved on Apr. 25, 2022 from https://www.slideshare.net/MohsinShad/microbial-production-of-methanol-1, 12 pages.

Sharma, S. et al., "Support materials for PEMFC and DMFC electrocatalysts—A review," Journal of Power Sources, 2012, vol. 208, pp. 96-119.

Skinner, S. O. et al., "Measuring mRNA copy number in individual *Escherichia coli* cells using single-molecule fluorescent in situ hybridization," Nature Protocols, 2013, vol. 8, No. 6, pp. 1100-1113.

Sone, Y. et al., "Proton Conductivity of Nation 117 as Measured by a Four-Electrode AC Impedance Method," J. Electrochem. Soc., Apr. 1996, vol. 143, No. 4, pp. 1254-1259.

Su, Y et al., "Bioaugmented methanol production using ammonia oxidizing bacteria in a continuous flow process," Bioresource Technology, 2019, vol. 279, pp. 101-107.

Taher, E. et al., "High-Rate, High-Yield Production of Methanol by Ammonia-Oxidizing Bacteria," Environ. Sci. Technol. 2013, vol. 47, pp. 3167-3173.

Tambekar, D.H. et al., "Bioremediation of C1 Compounds from Methylotrophic Bacteria isolated from Lonar lake," IJAPBC, 2014, vol. 3, No. 3, 2014, pp. 612-616.

Tang, H. et al., "Performance of direct methanol fuel cells prepared by hot-pressed MEA and catalyst-coated membrane (CCM)," Electrochimica Acta, 2007, vol. 52, pp. 3714-3718.

Thulasi, K. et al., "Efficient methanol-degrading aerobic bacteria isolated from a wetland ecosystem," Archives of Microbiology, 2018, vol. 200, pp. 829-833.

U.S. Appl. No. 15/962,931, inventors Stein, filed Apr. 25, 2018.

Wang, S. et al., "Improvement of direct methanol fuel cell performance by modifying catalyst coated membrane structure," Electrochemistry Communications, 2005, vol. 7, pp. 1007-1012.

Wang, W. et al., "Fabrication of catalyst coated membrane with screen printing method in a proton exchange membrane fuel cell," International Journal of Hydrogen Energy, 2015, vol. 40, pp. 4649-4658.

Westereng, B. et al., "Enzymatic cellulose oxidation is linked to lignin by long-range electron transfer," Scientific Reports, Dec. 21, 2015, vol. 5, No. 18561, 9 pages.

Xiao, Y. et al., "Extracellular polymeric substances are transient media for microbial extracellular electron transfer," Science Advances, Jul. 5, 2017, vol. 3, pp. 1-8.

Yang, L. et al., "Chapter Three: Biogas and Syngas Upgrading," Advances in Bioenergy, 2016, vol. 1, pp. 125-188.

Bombelli, P. et al., "Powering a microprocessor by photosynthesis", Energy & Environmental Science, The Royal Society of Chemistry, 2022, 8 pages.

KR Office action dated Apr. 26, 2022 in Application No. KR20217019996 with translation.

Sparkes, M., "Computer Powered by Colony of Blue-green Algae Has Run for Six Months", Technology, May 12, 2022, 3 pages.

U.S. Appl. No. 17/833,697, inventors Stein et al., filed Jun. 6, 2022.

\* cited by examiner

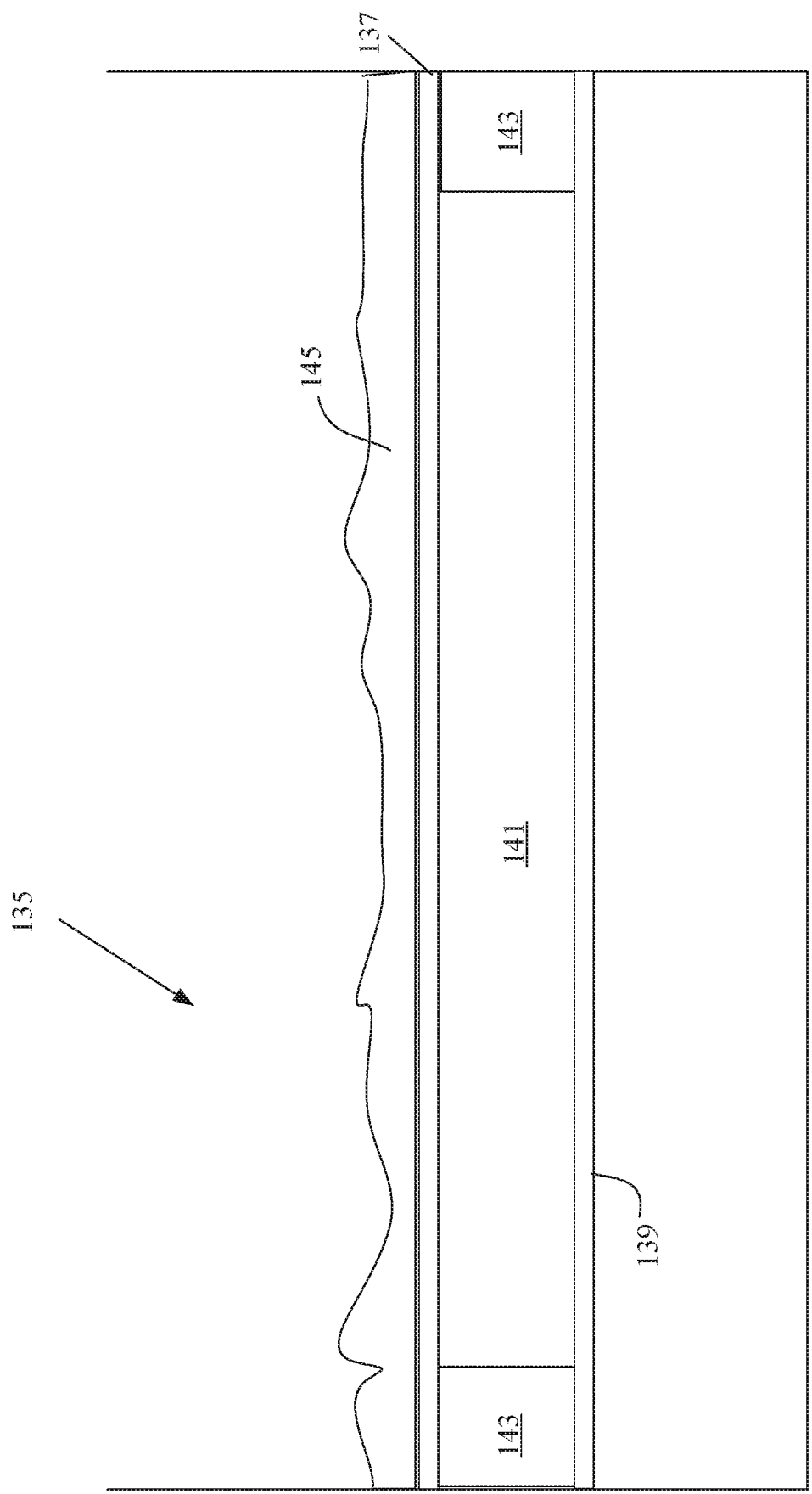

A

B

C

A

B

A

B

BIOCHEMICAL ENERGY CONVERSION CELL

CROSS-REFERENCE TO RELATED APPLICATIONS

This application is a continuation of U.S. patent application Ser. No. 15/962,931, filed Apr. 25, 2018, titled "BIOCHEMICAL ENERGY CONVERSION CELL," which is a continuation of U.S. patent application Ser. No. 14/315,226, filed Jun. 25, 2014, titled "BIOCHEMICAL ENERGY CONVERSION CELL," which claims benefit of priority under 35 U.S.C. § 119(e) to U.S. Provisional Applications No. 61/957,147, titled "PHOTOVOLTAIC CELLS AND PANELS," filed Jun. 25, 2013, U.S. Provisional Application No. 61/879,612, titled "BIOCHEMICAL ENERGY CONVERSION CELL," filed Sep. 18, 2013, and U.S. Provisional Application No. 61/991,335, titled "BIOCHEMICAL VOLTAIC CELLS," filed May 9, 2014, all of which are incorporated herein in their entireties for all purposes.

BACKGROUND

Current voltaic cells and solar panel systems have limited efficiency and require complex materials resulting in significant associated costs. Many solar panels use wafer-based crystalline silicon cells or cadmium or silicon-based thin-film cells. These cells are fragile and must be protected from moisture through adding multiple protective layers. Panels are deployed in series for increased voltage and/or in parallel for increased current. Panels are interconnected through conducting metallic wires. An inherent problem with common systems is the susceptibility of the cells to overheat due to reverse current flow when a portion of the panel is shaded and another portion of the panel is in direct sunlight. Another inherent problem is that solar cells become less efficient at higher temperatures, which limits the geographical effectiveness of light conversion to electricity. Improvements such as arrayed lenses and mirrors improve the focusing of light to increase efficiency but have higher fabrication complexity and associated costs.

Dye-sensitized solar cell (DSSC) is a solar cell technology based on semiconducting material placed between a light-sensitized anode and an electrolyte. Fabrication of DSSCs is not cost-effective and requires expensive materials such as platinum and ruthenium. Additionally, DSSC stability is a concern, as there exists a climate-related sensitivity of the liquid electrolyte.

Quantum dot solar cell (QDSC) technology is based on dye-sensitized solar cells but utilizes low band gap semiconductor nanoparticles, also known as quantum dots, which include CdS, CdSe, $Sb_2S_3$, PbS and other metalloid salts as light absorbers. The advantages of quantum dots are that band gap preferences are dictated by particle size and that they offer high extinction coefficients. The efficiencies of QDSCs are still low with over 5% demonstrated for both liquid-junction and solid-state cell types and the fabrication costs are still prohibitive.

Polymer (and copolymer) solar cells are made from thin films of organic semiconducting polymers such as polyphenylene vinylene and copper phthalocyanine. These cells differ from the aforementioned inorganic solar cells because they do not require a built-in electric field of P-N junctions to separate electrons from holes. Instead, organic cells contain an electron donor and an electron acceptor. In a polymeric solar cell, the electron donor is excited by a photon, the energy of which is converted to an electron and hole pair. The pair diffuses to the donor-acceptor interface whereby the electron and hole are separated and current is generated.

Existing photovoltaic panels produce electricity from a range of wavelengths of light but cannot harness wavelengths in the ultraviolet and infrared ranges (except for recent conceptual studies with polymeric and copolymeric solar panels, although these efficiencies remain low at 3-4%). The available panels also produce little electricity from low light or diffuse light. Increased effort in design concepts split light into monochromatic wavelengths and to direct these wavelengths to different solar cells specifically tuned to those wavelengths and are projected to increase the efficiency by up to 50%, but require significant technical advances and are very costly.

Field experiments involving solar panel technology reveal that a drop of 1.1% in peak output occurs for every increase in degrees Celsius past a threshold temperature of 42-44 degrees Celsius. This is problematic as on hot and sunny days, the surface temperature of a panel can exceed 90 degrees Celsius and can often experience localized heat buildup within the panel causing spots to be as high as 800 degrees Celsius due to the reflective layering needed in current solar panels. Cold and sunny environments are the optimal conditions for maximal efficiency of the current solar panels.

Photovoltaic solar panels have been used since the 1950s for the conversion of sunlight to electricity, and decades of technological advancements have only increased the efficiency to 12-28.8%. Recently, significant nanotechnological advancements have been made to increase the efficiency from 10% to almost 29% but at increased design complexity and fabrication cost.

SUMMARY

Certain aspects of the disclosure pertain to voltaic cells characterized by the following features: (a) a buffer containing an ionically conductive medium with an electron donor population provided therein; (b) a vessel at least partially containing the buffer electron donor population; (c) an anode for receiving electrons from the electron donor population and providing electrons to an external circuit or load; and (d) a cathode for donating electrons to, e.g., a species in the buffer. In certain embodiments, the electron donor population may be further characterized by a first species of microbe having a first primary metabolic pathway and a second species of microbe having a second primary metabolic pathway, which is complementary to the first primary metabolic pathway. In some implementations, neither primary metabolic pathway is primarily glucose fermentative.

In certain embodiments, the voltaic cell additionally includes an ion permeable and electron donor impermeable barrier separating the buffer into an anode compartment and a cathode compartment, thereby preventing the electron donor population from contacting the cathode. In some implementations, the barrier is electronically conductive. In some implementations, the barrier contacts the anode. Some voltaic cells include a current collector in electrical communication with the anode.

In some implementations, the first species of microbe and/or the second species of microbe comprises light harvesting antennae. As an example, the first species of microbe is excited by electromagnetic radiation in a first band, and at least one other species of microbe in the buffer is excited by electromagnetic radiation in a second band. The first band and the second band do not substantially overlap.

In certain embodiments, the first species of microbe is a phototrophic or chemo-trophic microbe. In certain embodiments, the first species of microbe is a chemotroph and the second species of microbe is a phototroph. In certain embodiments, the first species of microbe has pili, fibrils, flagella, and/or a filamentous shape.

In some implementations, the first primary metabolic pathway oxidizes a compound containing carbon, nitrogen, phosphorous, or sulfur, and the second primary metabolic pathway reduces the oxidized compound produced by the first primary metabolic pathway. In some implementations, the first species of microbe has a plurality of metabolic pathways. In some embodiments, the first primary metabolic pathway and the second primary metabolic pathway each participate in cellular respiration. In some implementations, the first species of microbe is a naturally occurring microbial species.

In certain embodiments, the voltaic cell additionally includes a population of electron siphons, where each electron siphon includes an electron accepting component for receiving electrons from the electron donor population, and an electron conducting element for directly or indirectly conducting electrons from the electron accepting component to the anode. In some cases, the electron siphons have a median principal dimension of at most about 500 micrometers. In certain embodiments, the electron siphons together form an assembly within the buffer, with the assembly configured to conduct electrons from the electron donor population to the anode.

Another aspect of the disclosure concerns method of converting chemical and/or light energy to electrical energy by operating the voltaic cell having any combination of the features presented above in this section.

Another aspect of the disclosure pertains to buffers for voltaic cells. Such buffers may be characterized the following components: (a) an ionically conductive medium; and (b) an electron donor population provided in the ionically conductive medium. In certain embodiments, the electron donor population includes: (i) a first species of microbe having a first primary metabolic pathway, and (ii) a second species of microbe having a second primary metabolic pathway, which is complementary to the first primary metabolic pathway, where neither primary metabolic pathway is primarily glucose fermentative In certain embodiments, the first species of microbe and/or the second species of microbe are light harvesting antennae. As an example, the first species of microbe may be excited by electromagnetic radiation in a first band, and at least one other species of microbe in the buffer may be excited by electromagnetic radiation in a second band. In this example, the first band and the second band do not substantially overlap.

In certain embodiments, first species of microbe in the buffer is a phototrophic or chemo-trophic microbe. As an example, the first species of microbe is a chemotroph and the second species of microbe is a phototroph.

In certain embodiments of the buffer, the first primary metabolic pathway oxidizes a compound containing carbon, nitrogen, phosphorous, or sulfur, and the second primary metabolic pathway reduces the oxidized compound produced by the first primary metabolic pathway. In some examples of the buffer, the first primary metabolic pathway and the second primary metabolic pathway each participate in cellular respiration. In some buffers, the first or second species of microbe has a plurality of metabolic pathways. In some buffer examples, the first primary metabolic pathway and the second primary metabolic pathway each participate in cellular respiration.

In some buffers, the first species of microbe has pili, fibrils, flagella, and/or a filamentous shape. In some buffers, the first species of microbe is a naturally occurring microbial species.

In certain embodiments, the buffer additionally includes a population of electron siphons, where each electron siphon includes an electron accepting component for receiving electrons from the electron donor population, and an electron conducting element for directly or indirectly conducting electrons from the electron accepting component to the anode. In some cases, the electron siphons have a median principal dimension of at most about 500 micrometers. In some examples, the siphons collectively make up an assembly within the buffer, which assembly is configured to conduct electrons from the electron donor population to the anode.

Another aspect of the disclosure pertains to voltaic cells characterized by the following features: (a) a buffer containing an ionically conductive medium with (i) an electron donor population provided therein, and (ii) an electron siphon population provided therein; (b) a vessel at least partially containing the buffer electron donor population; (c) an anode for receiving electrons from the electron donor population and providing electrons to an external circuit or load; and (d) a cathode for donating electrons to a species in, e.g., the buffer. In certain embodiments, each electron siphon contains an electron accepting component for receiving electrons from the electron donor population, and an electron conducting element for directly or indirectly conducting electrons from the electron accepting component to the anode.

In some implementations, the electron siphons have a median principal dimension of at most about 500 micrometers. In some implementations, the electron siphons together make up an assembly within the buffer, which assembly is configured to conduct electrons from the electron donor population to the anode. In some implementations, the electron siphons include a docking moiety for docking with the electron donor population, but not lysing cells containing the electron donor population.

In certain embodiments, the voltaic cell additionally includes an ion permeable and electron donor impermeable barrier separating the buffer into an anode compartment and a cathode compartment, thereby preventing the electron donor population from contacting the cathode. In certain embodiments, the voltaic cell additionally includes a current collector in electrical communication with the anode.

Another aspect of the disclosure pertains to buffers for voltaic cells, which buffers may be characterized by an ionically conductive medium including: (i) an electron donor population; and (ii) an electron siphon population. In certain embodiments, each electron siphon includes an electron accepting component for receiving electrons from the electron donor population, and an electron conducting element for directly or indirectly conducting electrons from the electron accepting component to the anode. In certain embodiments, the electron siphons have a median principal dimension of at most about 500 micrometers. In certain embodiments, the electron siphons collectively make up an assembly within the buffer, which assembly is configured to conduct electrons from the electron donor population to the anode. In certain embodiments, the electron siphons include a docking moiety for docking with the electron donor population, but not lysing cells containing the electron donor population. These and other features of the disclosed embodiments will be set forth below regarding the associated drawings.

These and other features of the disclosure will be further described below with reference to the drawings.

BRIEF DESCRIPTION OF THE DRAWINGS

FIGS. 1B-1D depict variations of the cell shown in FIG. 1A.

DESCRIPTION OF AN EMBODIMENT

Definitions

Figure 1A:
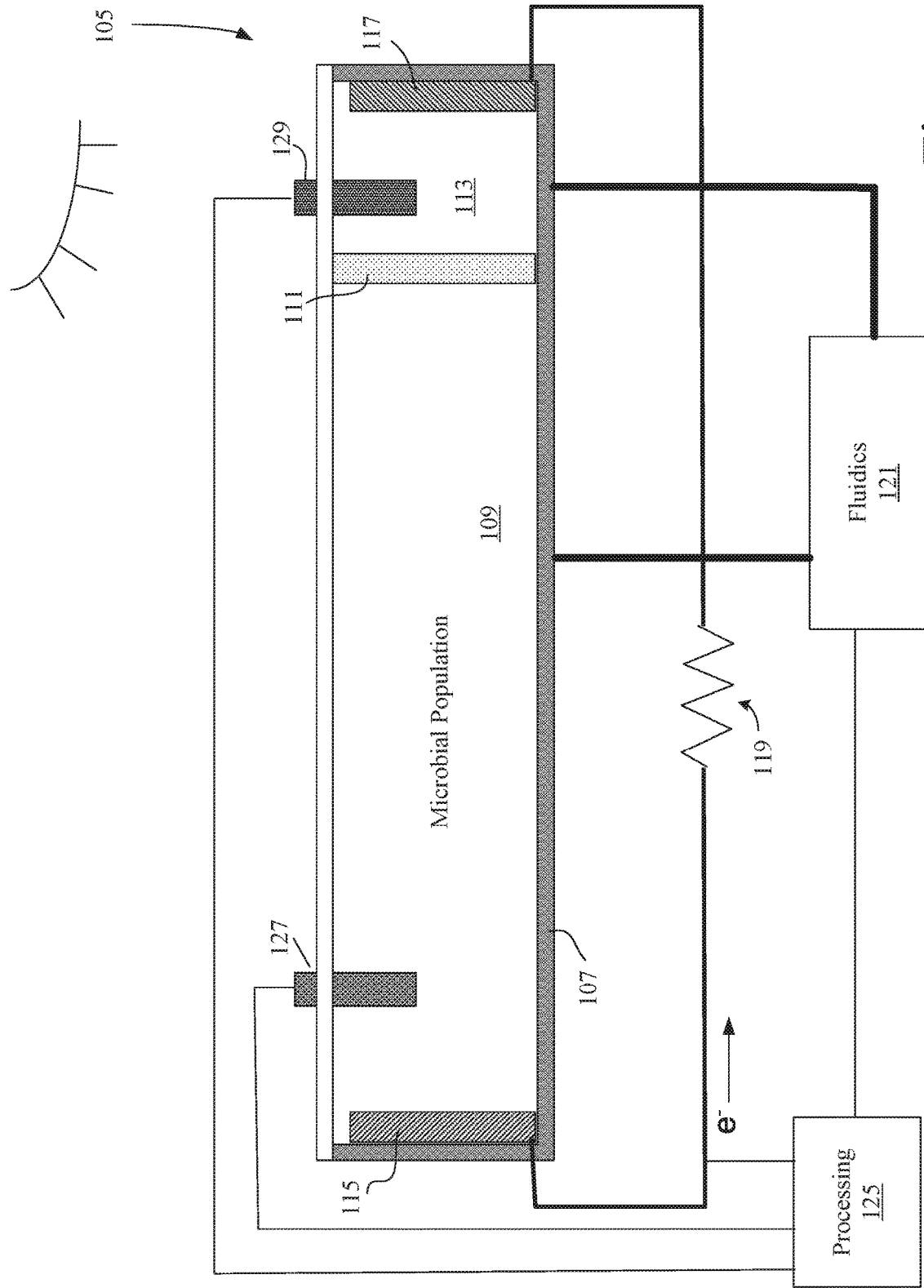
FIG. 1A schematically depicts an energy conversion cell.

Unless defined otherwise, all technical and scientific terms used herein have the same meaning as commonly understood by one of ordinary skill in the art. Various scientific dictionaries that include the terms included herein are well known and available to those in the art. Any methods and materials similar or equivalent to those described find use in the practice of the embodiments disclosed.

The terms defined immediately below are more fully understood by reference to the specification. The definitions are provided to describe particular embodiments only and aiding in understanding the complex concepts described in this specification. They are not intended to limit the full scope of the disclosure. Specifically, it is to be understood that this disclosure is not limited to the particular compositions, systems, designs, methodologies, protocols, and/or reagents described, as these may vary, depending upon the context they are used by those of skill in the art.

As used in this specification and appended claims, the singular forms "a", "an", and "the" include plural referents unless the content and context dictates otherwise. For example, reference to "a cell" includes a combination of two or more such cells. Unless indicated otherwise, an "or" conjunction is used in its correct sense as a Boolean logical operator, encompassing both the selection of features in the alternative (A or B, where the selection of A is mutually exclusive from B) and the selection of features in conjunction (A or B, where both A and B are selected).

"Light-harvesting antennae" are biochemical or chemical structures capable of being excited by light energy. Of interest, light may excite the antennae to a state allowing them to generate electrical or electrochemical energy. Sometimes, a photosynthetic microbe contains light harvesting antennae.

An "electron donor" is a component that donates electrons as part of a process that involves conversion of energy from radiation (e.g., light), chemical components, mechanical manipulation, or other process. In this disclosure, examples of electron donors include photosynthetic and non-photosynthetic microbes, light-harvesting antennae, and pigments.

A 'photosynthetic microbe' is a microbial cell that uses light energy for growth and metabolic processes. Such microbe typically contains light-harvesting antennae capable of harnessing light energy and electron transport components, which may be embedded in the cytoplasmic membrane and/or membrane invaginations and/or membrane vesicles and/or organelles.

A "pigment" is any composition capable of being excited by light energy, typically through wavelength-selective absorption. A pigment is one light-harvesting antennae or a component thereof. A pigment may be synthetically or biologically produced.

A "non-photosynthetic microbe" is a microbial cell that does not need light energy for growth and metabolic processes. Such microbe may contain electron transport components, which may be embedded in the cytoplasmic membrane and/or membrane invaginations and/or membrane vesicles and/or organelles.

An "electron siphon" is small structure configured to remove electrons from the light harvesting antennae and directly or indirectly transport the electrons to a current collector (sometimes serving as an electrode) of a voltaic cell. In certain embodiments, a siphon contains one or more electron accepting elements (e.g., electron coordinating moieties) attached to (e.g., on the surface of) an electron transporting structure. The electron transporting structure may be a single atom thick (e.g., a graphene matrix) or may be multiple atoms thick.

An "electron siphon matrix" is a collection of electron siphons that may substantially overlap with one another. In some embodiments, an electron siphon matrix provides a conductive pathway that spans multiple individual electron siphons. In some embodiments, the matrix provides a conductive pathway extending from a current collector of a voltaic cell well into a buffer where the matrix contacts a plurality of biologically-based electron generating structures. In some implementations, the electron siphon matrix is an arrayed configuration of electron siphons.

An "electron conductive material" is a material that enables the transfer of electrons from one location of the electron conductive material to another location. The electron conductive material may be electronically conductive or semiconductive. It may conduct holes. In some embodiments, the electron transporting structure of an electron siphon contains an electron conductive material.

Introduction and Context

Photosynthetic microbes and plants remain the most efficient at converting light energy into other usable forms of energy at about 40-80% light absorption. It is estimated that the average rate of energy capture by photosynthetic organisms is 130 terawatts globally, which is approximately six-times larger than the current power consumption capabilities of the human civilization (Nealson, 1999; Whitmarsh 1999; Steger, 2005; Energy Information Administration, 2006). Photosynthetic microbes contain light-harvesting pigments and antenna systems or reaction centers in their membranes to harness the energy delivered by a photon. Electron carriers serially pass excited electrons through the electron transport chain and simultaneously facilitate the coordinated effort of proton separation across the membrane to generate potential energy.

There are two types of photosynthesis, nonoxygenic and oxygenic. Nonoxygenic photosynthesis is thought to historically precede oxygenic photosynthesis and does not produce oxygen. Oxygenic photosynthesis occurs in plants and cyanobacteria and uses $H_2O$ as an electron donor for phototrophy. Nonoxygenic photosynthesis can utilize hydrogen, sulfur and certain compounds as electron donors for phototrophy.

The documented ability of maximal light harnessing has been identified in green sulfur bacteria that reside almost 1 mile below the ocean's surface in deep-sea thermal vents where very minimal light reaches these microbes. These microbes can utilize nearly 100% of the residual light in non-oxygenic photosynthesis.

The use of photosynthetic microbes to generate usable energy has focused mainly on biofuel generation.

Disclosed herein is a microbe-based electricity generating cell having lower energy fabrication processes, producing high light-to-electricity conversion rates, having regulators and having less geographical constraints compared to current solar technologies. The cell may be customizable to address requirements of geography, climate, season, structural needs, etc. In certain embodiments, a cell has one or more light-harvesting antennae populations and optionally includes one or more of the following features: electron siphons having electron conductive properties, an optical coupling system, and regulator having sensing and regulatory feedback properties. In some designs, the cell has electricity-generating abilities absent light. In some implementations, the cell is deployed in a solar panel.

In one form, a voltaic cell includes a vessel containing a buffer system, a microbial cell population, a conductive electron siphon population and a current collector (e.g., a wire).

In certain embodiments, a voltaic cell includes a vessel containing a buffer system, a microbial cell population, an electron siphon population and a current collector. In other embodiments, a voltaic cell includes a vessel containing a buffer system, a microbial cell population, a conductive electron siphon matrix, and a wire (an example of a current collector). In other embodiments, a voltaic cell includes a vessel containing a buffer system, a microbial cell population, a conductive electron siphon matrix, and a current collector. In some aspects, a voltaic cell includes a vessel containing a light harvesting antennae population, a buffer system, an electron siphon population, a conductive electron siphon matrix, a mirror system and a regulator system. The electron siphon population and the electron siphon matrix may be physically different structures, with the population containing functional groups that facilitate docking with electron donor and the matrix designed to transport electrons from the population to an electrode. The siphons of the population may move about with the microbes while the siphons of the matrix may have a fixed location. In some aspects may, a voltaic cell includes a vessel containing a light harvesting antennae population, buffer system, arrayed electron siphon population, electron conductive material, mirror system and regulator system. In yet other aspects may, the voltaic cell includes a vessel containing a microbial population, buffer system, electron siphon population, regulator system and charge storage device.

FIG. 1A schematically depicts an energy conversion cell 105 having a containment vessel 107 which holds in its interior 109 a fluid in which one or more microbial populations exist. Cell 105 also includes a cover element 131 fitted on top of vessel 107. Element 131 is transparent to radiation in a wavelength range to which the microbial population responds. Optionally, cell 105 includes an ionically permeable barrier 111 disposed within the vessel 107 to prevent microbes and/or other electron donors in the region 109 from passing into a compartment 113 on the opposite side of permeable barrier 111. It should be understood that permeable barrier 111 is optional and sometimes only a single solution is provided within vessel 107.

Cell 105 will include an anode 115 and a cathode 117 electronically separated from one another by ionically conductive fluid in compartment 109 and optionally in compartment 113 if present. During operation, the microbial population(s) in compartment 109 produces electrons that are collected at anode 115. These electrons work by flowing through a load 119 in a circuit coupling cathode 117 and anode 115. If compartment 113 is used, it may include a separate microbial population. In some implementations, microbes in compartment 113 donate protons or other positively charged species to cathode 117. The microbes in fluids 109 and 113 convert energy by different mechanisms. In various embodiments, at least the microbes within compartment 109 are phototrophic.

In certain embodiments, a fluidics system 121 is coupled to the vessel 107 and optionally has separate ports for compartments 109 and 113. The fluidics system 121 may include various elements such as a reservoir for holding make up fluids for compartments 109 and/or 113, one or more pumps, one or more pressure gauges, mass flow rate meters, baffles, and the like. The fluidics system 121 may provide fresh buffer solution and/or microbes to cell 105. It may also deliver one or more of various regulating agents to these fluids. Such regulating agents may include acid, base, salts, nutrients, dyes, and the like.

Cell 105 may also interface with a controller 125 that controls fluidic system 121. Controller 125 may have one or more other functions. For example, it may receive input from various components of the system such as the circuit coupling anode 115, cathode 117, the fluidics system 121, and/or sensors 127 and 129 provided in compartments 109 and 113, respectively. The sensors may monitor any one or more relevant operating parameters for cell 105. Example such parameters include temperature, chemical properties (e.g., component concentration and pH), optical properties (e.g., opacity), electrical properties (e.g., ionic conductivity), and the like.

FIG. 1B depicts a variation of cell 105. Specifically, the figure depicts an alternative cell 135 having an anode plate 137, a cathode plate 139, and a compartment 141 between plates 137 and 139 as defined by a spacer 143. Within compartment 141 is an ionically conductive medium. Anode plate 137 may contain or be made from a semipermeable material that allows ionic communication between the two sides of the plate but does not permit passage of microbes or microbial components. Provided on top of anode plate 137 is a population 145 of phototrophic microbes containing photon harvesting antennae.

Figure 1C:
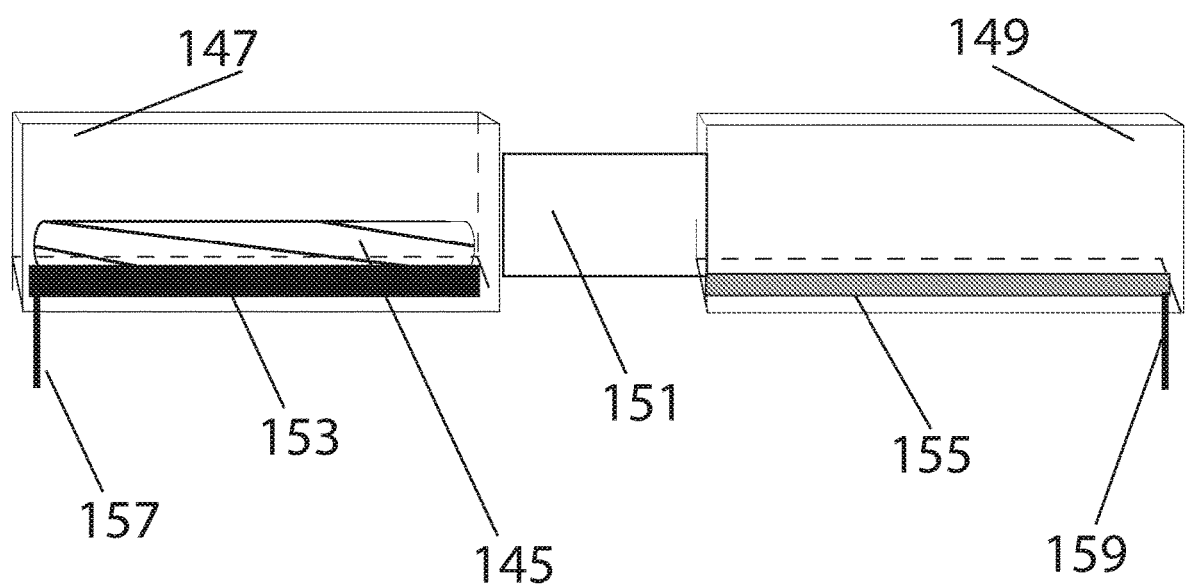

FIG. 1C depicts another variation of a cell 105. Specifically, the figure depicts a first compartment 147 connected to a second compartment 149 by a third compartment 151. Within compartment 147 is a first electrode 153, which is electronically conductive and may be ionically conductive. A layer of organic photosensitive electron generators 145 is disposed on top of electrode 153. The electron generators may include light harvesting antennae and, in some cases, electron siphons as well. Layer 145 may include a population of phototrophic microbes, microbial membrane bound photosystem, vesicles containing a photosystem, and/or other photosensitive organic electron generators. Within compartment 149 is a second electrode 155, which has the opposite polarity of electrode 153 and is electronically conductive and optionally ionically conductive. Compartment 151 may contain a semipermeable material that allows ionic communication between compartments 147 and 149 but does not permit the diffusion of phototrophic microbes, microbial membrane components, etc. present in layer 145 from compartment 147 into compartment 149. Electrons harvested from the microbial population 145 are transferred to electrode 153 in compartment 147, which then pass through a connected conductive element 157 (e.g., a wire). A second conductive element 159 is connected to electrode 155.

Figure 1D:
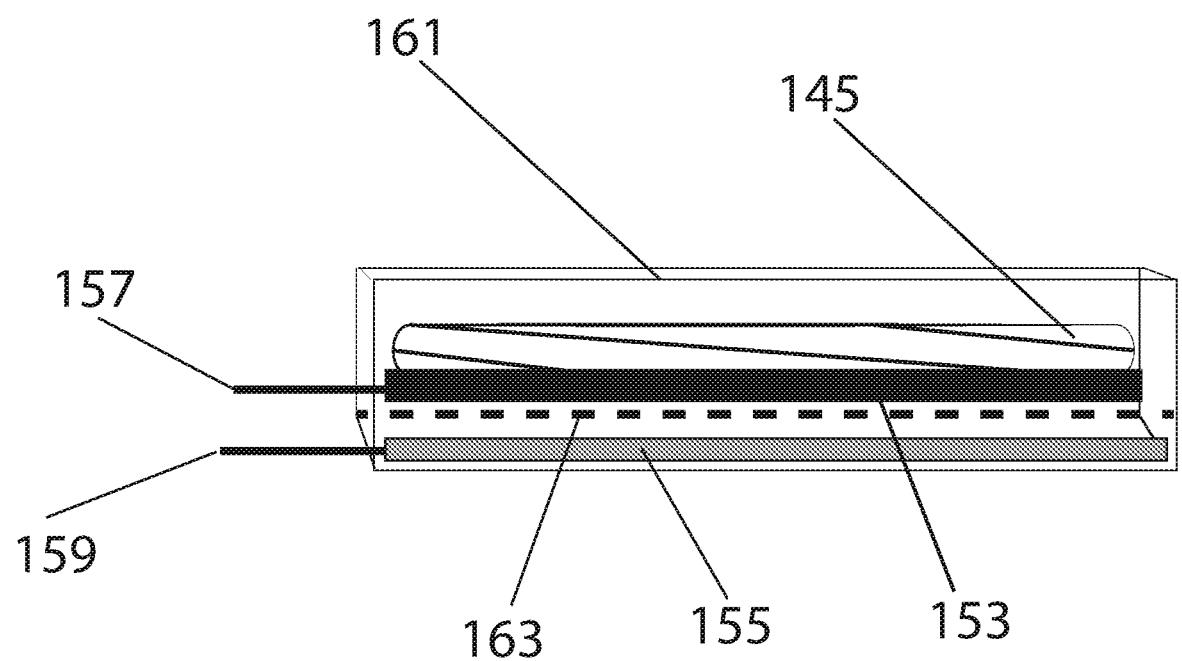

FIG. 1D depicts another variation of a cell 105. Specifically, the figure depicts a split compartment 161 containing a first electrode 153 as described for the embodiment of FIG. 1C having direct contact with a layer 145 containing phototrophic microbial and/or microbial membrane component population containing photon harvesting antennae. Compartment 161 also contains a second electrode 155 as described in the embodiment of FIG. 1C of opposite polarity separated by a semipermeable barrier 163 enabling ion exchange throughout the cell but inhibiting the diffusion of photon harvesting antennae 145 into the space surrounding electrode 155. Electrons flow to first electrode 153 and then through a conductive element 157 to a circuit. Positively charged species such as protons or holes may flow through the second electrode 155 by conductive element 159. Having the same effect, electrons may flow into electrode 155 from a load electrically connected to first electrode 153.

The light-conversion system may include an anode positioned directly adjacent to the electron siphon to collect the electrons from the siphon and produce an electrical current in a circuit containing an anode and a cathode. The circuit may be coupled to a conversion module for an electrical grid or other system.

In one form, a disclosed microbial energy conversion cell includes a vessel containing a buffer system, a light harvesting antennae population, and a conductive electron siphon population. In some aspects of the current disclosure, the cell can include a vessel containing the light harvesting antennae population, buffer, conductive electron siphon population, mirror system and regulator system.

In some embodiments, a light conversion system includes a light-harvesting antennae component population and modified conductive electron siphons for the improved efficiency of light conversion to electricity at reduced complexity and cost.

In certain embodiments, a light-conversion system includes a buffered electrolyte solution surrounding a microbe-derived light-harvesting antennae population, the population having multiple light-harvesting antennae per component and where the component population has an ability to harvest light over a broad range of wavelengths, including ultraviolet and far red light and can harvest light over a range of intensities, including diffuse light. The population can include one or more microbe species including a mixture of photosynthetic and non-photosynthetic microbes, membranes components derived from the microbes or vesicles containing light-harvesting antennae components and electron carrier components.

In some embodiments, a light-harvesting antennae population contains photosystems, which include light-harvesting pigments or electron carrier molecules and reaction centers. These elements are described further regarding FIG. 5 below. In some implementations, a light-harvesting antennae population contains a range of different light-harvesting pigments and photosystems and may have similar electron carrier molecules. Examples of individual components of a light-harvesting antennae population of the disclosed embodiments are presented in Tables 1 and 2.

The light conversion system may contain electron siphons having electron-scavenging and conductive and/or semiconductive properties over a broad temperature range. Electron siphons may be modified conductive and semi-conductive in nature and are modified in a manner to maintain electron conductive properties. As described more fully below, electron siphons can be individual or multimeric nanorods, nanotubes, nanowires, nanoparticles, nanonetworks, nanofibers, quantum dots, dendrimers, nanoclusters, nanocrystals or nanocomposites and can contain carbon, silicon, metal, metal alloys or colloidal. Further, individual electron siphons of the disclosed embodiments can range from 1 to 900 nm in length and multimers that range from 0.9 to 4 um in length. In some embodiments, the microbes themselves produced electron siphons to provide a natural mechanism for expelling excess electrons.

Figure 5:
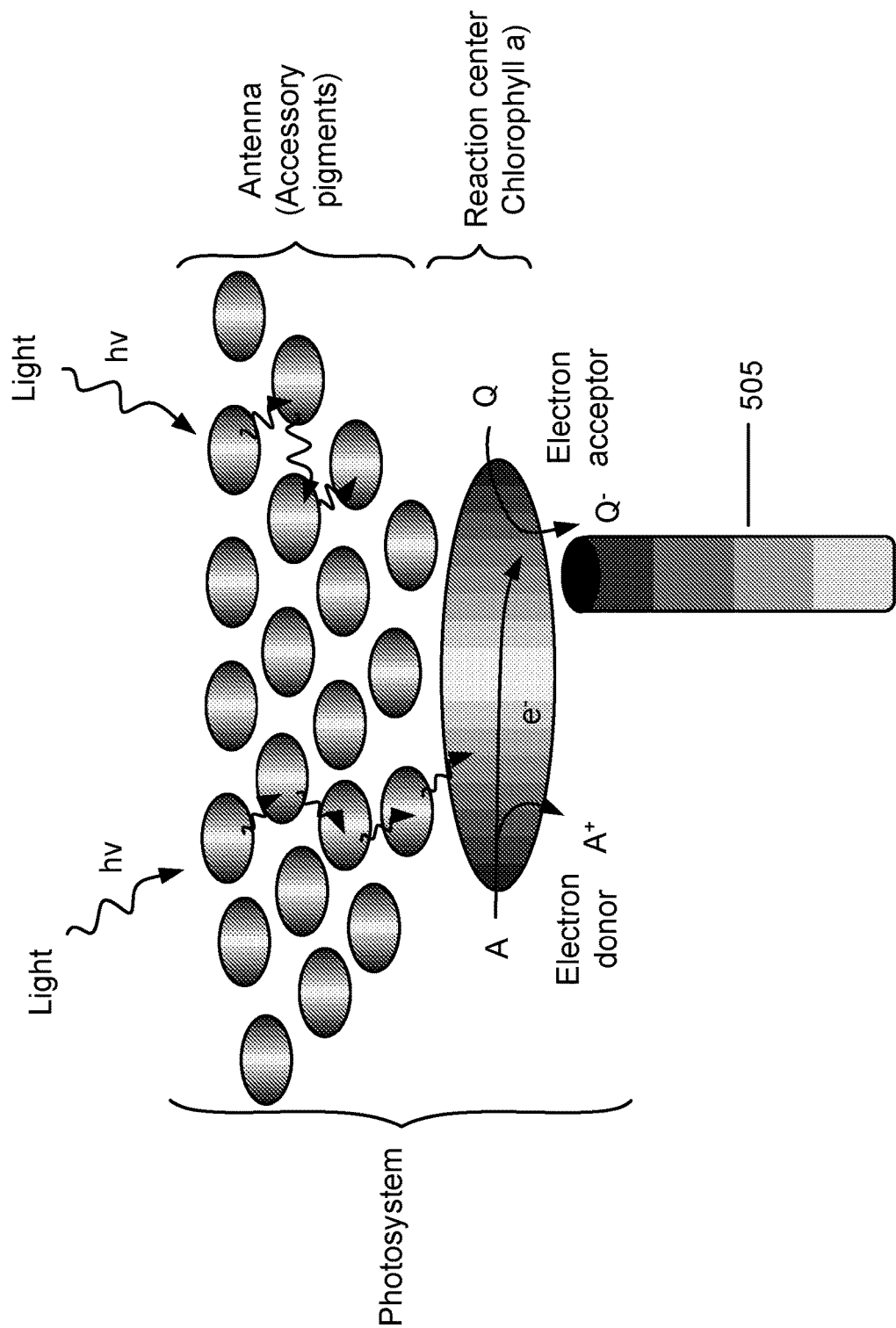
FIG. 5 depicts a photosystem coupled to an electron siphon.

FIG. 5 depicts an example electron siphon in use. In this example, a single walled carbon nanotube 505 was activated by HCl, washed and modified with L-Arginine by chemical crosslinking to generate a biologically compatible electron siphon. The modified carbon nanotube 505 was mixed with a microbial population containing light-harvesting pigments and electron carrier components in their membranes.

A photosystem may operate shown in FIG. 5. In some embodiments, the photosystem exists in the cell membrane of a living organism. In some embodiments, the photosystem exists in a membrane derived from a living organism but is no longer part of that organism. In other embodiments, the photosystem is incorporated in a synthetic micellular structure. Such structures can be created by techniques known in the art such as sonicating oil and lipid in a solvent with detergent. The resulting micellular structures can be spiked with the required components of a photosystem. Such components typically include a reaction center such as a molecule of chlorophyll a, light harvesting pigments, and electron shuttling molecules. Certain pigment molecules may serve as both the light harvesting pigments and electron shuttling molecules.

As light hits the light-harvesting pigments in the microbial membranes, the excited electrons are passed directionally to electron carrier components (antenna accessory pigments in FIG. 5) in the membrane and to an electron shuttling component that passes the electron to a terminal electron acceptor, in this case, the modified carbon nanotube. Electron flow out of a microbial membrane onto an electron siphon results. The electron flow can then be harnessed by a neighboring anode, such as a metal plate or wire to maximize the flow of electrical current out of a population of microbes. When the net flow of electrons on one portion of a cell (at one electrode) differs significantly from another portion of a cell (at a different electrode), an electrical current can be generated.

Electrons may flow from the photosystem to the anode by various means. Sometimes, the microbes are directly attached to the anode as a film or other adherent structure. In such cases, the electrons generated by the photosystem move directly from the photosystem to the anode. In other cases, the photosystems are not attached the anode and electron flow out of electron siphons in solution where the electron may be captured and transported by a mediator in the solution. In a similar embodiment, the electron is delivered to a conductive network linking the anode to the microbes or other photosystem containing elements in solution. Such systems may be a nanostructure network, pathway or other arrangement to maintain linkage from an electron siphon to the anode for example. In certain embodiments, the photosystem corresponds to a light harvesting antenna.

While photosystems are frequently described as a source of electrons for the disclosed embodiments, non-photosynthetic biochemical processes that produce electrons may be used in place of or besides the photosystems. So, when appropriate, reference to photosystems and similar terms may be considered to include metabolic and other biochemical systems that produce electrons available for donation to an anode in an energy conversion cell.

Vessel and Associated Hardware for Voltaic Cell

In its basic embodiment, an important function of a voltaic cell is to harvest photons and harness excited electrons contained within the cell to generate electrical current using photosynthetic microbe and photosynthetic microbial membrane populations. The cell may include a leak proof vessel or housing for the microbial energy conversion cell medium and microbial population. In some embodiments, the microbial energy conversion cell additionally includes electrodes, sensors, semi-permeable barriers, ionic conductive material, wires and the like.

Typically, the cell should be designed to accept external radiation and convert the energy therein to excited electrons of the light harvesting antennae of microbial membranes and to provide conductive material for the harnessing of resultant high energy electrons generated by the electron transport chain within each membrane of a microbe.

Microbial energy conversion cells of the disclosed embodiments can have full access to the environment and can be constructed in a manner to enable photon conversion at temperatures ranging from −20 degrees Celsius to 65 degrees Celsius and weather ranging from complete sun to cloud or fog cover. Microbial energy conversion cells of the disclosed embodiments can also be portable and can have variable access to the environment, as determined by the user.

In certain embodiments, vessels can withstand high temperatures (e.g., about 50 C or greater) and internal pressures (above atmospheric) of about 50 Pa to about 10 kPa; of about 500 Pa to about 3 kPa; of about 800 Pa to about 1.5 kPa. Note that some embodiments employ microbes whose natural habitat is a high pressure environment such as a deep sea vent.

In some embodiments, the cell is a closed system with no flow of fresh buffer or other solution into the system and no exposure to atmospheric gas exchange. In other embodiments, it is a semi-closed system containing, for example, a system of tubing, valves and ports to allow the inflow of fresh buffer, regulating elements, fresh microbial antennae population and/or atmospheric gases into the system. The ports of which contain 0.22 um filters to prevent contamination of the system by atmospheric microbial contaminants. In other aspects, the ports contain 0.45 um filters to prevent contamination of the system by larger atmospheric microbial contaminants.

In yet other embodiments, the cell is an open system with full access to the environment. In some cases, the open system is a body of water, such as a pond, lake, river, reservoir, stream or other open body of water. The open system may also contain a system of tubing, valves and ports to allow the circulation of endogenous fresh microbial antennae population into the open system microbial energy conversion cell.

Figure 2:
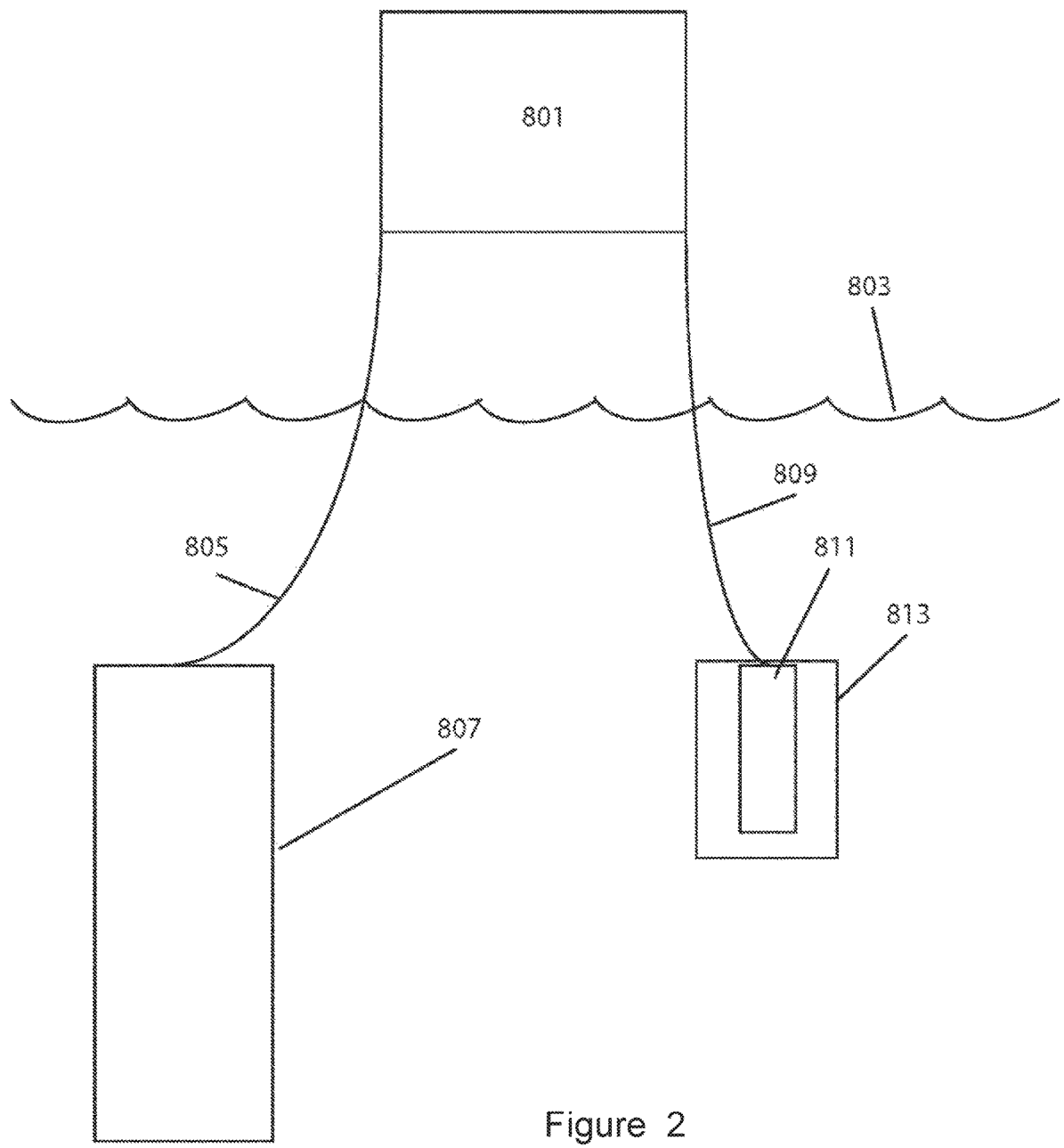
FIG. 2 presents an example of an immersible open system voltaic cell.

FIG. 2 presents an example of an immersible open system. Elements 807 and 811 are an anode and a cathode. Element 813 is a semipermeable barrier that permits ionic conduction but blocks transport of microbes. Element 813 could be an anti-microbial coating (e.g., silver). 805 and 809 are conductive electrical leads from the anode and cathode. Element 801 is part of a circuit, part of a mechanical support structure, or both.

Vessels bounding the voltaic cell and may be made from any of a number of materials including, as examples, a polymer such as polyethylene, polypropylene, or polyurethane, glass, metal, or a combination thereof. In various embodiments, the vessel material is a gas- and liquid-impermeable material.

A vessel may contain a multilayered unit containing an outermost layer and one or more inner layers. The outer layer may contain clear plastic, glass, metal or other material to provide protection against the environment. In some embodiments, vessel has an outermost layer that permits passage of various spectral wavelengths of electromagnetic radiation. In some embodiments, the outermost layer may be permeable to most spectral wavelengths of light energy. In some embodiments, a portion of the vessel may contain an outermost layer that may be impermeable to most spectral wavelengths of light energy and a second portion of the vessel that contains an outermost layer that may be permeable to most spectral wavelengths of light energy.

In some embodiments, the vessel defining the outer boundary of the microbial energy conversion cell is rigid. The rigid enclosures can contain glass or polymer with a stiffness of > about 1.3 GPa. and having a shape resembling a cube, cuboid, sphere, column, cylinder, cone, frustum, pyramid or prism. The wall thickness of the enclosure can span the range of about 1 mm to 20 cm. Preferred is an enclosure with a wall thickness ranging from about 5 mm to 25 mm The vessel volume, shape, and dimensions may be chosen to complement the overall structure of the energy conversion system in which it resides. In some embodiments, the vessel volume may be in the range of about 0.0000001 $m^3$ to about 3 $m^3$; from about 0.000001 $m^3$ to about 2 $m^3$; from about 0.0001 $m^3$ to about 1.5 $m^3$; from about 0.01 $m^3$ to about 1 $m^3$; or from about 0.1 $m^3$ to about 0.5 $m^3$.

The vessel may be manufactured by standard methods including part molding, injection molding, extrusion, laser etching, gluing, soldering caulking, and other suitable techniques.

In some embodiments, the vessel defining the outer boundary of the microbial energy conversion cell is a frame having electrically insulating properties. In some aspects of the disclosure, the framed enclosure has thermal insulating properties and is foam-filled. Frames of the disclosed embodiments include fiberglass, aluminum, stainless steel, graphite, polycarbonate, carbon fiber, polystyrene, polyethylene, polyethylene, polyvinylchloride, polytetrafluoroethylene, polychlorotrifluoroethylene, polyethylene terephthalate, meta-aramid polymer, or copolyamid.

In other embodiments, the enclosure defining the outer boundary of the microbial energy conversion cell is flexible. Examples of flexible enclosures include one or more clear polymer with a stiffness of < about 1.2 GPa and having an amorphous shape or having a shape resembling a cube, cuboid, sphere, column, cylinder, cone, frustum, pyramid or prism. Examples of suitable polymers include polypropylene, polystyrene, polyethylene, polyvinylchloride, polytetrafluoroethylene, polychlorotrifluoroethylene, polyethylene terephthalate, meta-aramid polymer, or copolyamid. The wall thickness of the enclosure can span, for example the range of about 0.5 mm to 25 mm. In some embodiments, the enclosure has a wall thickness ranging from about 1 mm to 10 mm.

In some embodiments, a window is included in the microbial energy conversion cell for photon energy penetration into the energy conversion cell. The window may be transmissive to light at a range between about 100 nm and 1060 nm and can contain glass, crystalline composites and polymers such as poly(3,4-ethylenedioxythiophene, poly(3,4-ethylenedioxythiophene, poly(styrene sulfonate), poly(4,4-dioctylcyclopentadithiophene or other transparent polymers. In certain embodiments, the windows can be about 1 mm to 30 cm thick. In some cases, the windows range from about 5 mm to 25 mm in thickness.

In some embodiments, gaskets or seals are included in the microbial energy conversion cell can be used to provide a leak-proof seal between the frame of the cell and a window and between the enclosure of a cell and a port or tubing. Suitable gaskets or seals may contain UV-resistant silicone, cure-in-place resin, ethylene-propylenediene, closed cell nitrile, or other UV-resistant gasket or sealant.

In one example, a containment chamber includes a glass panel juxtaposed to a UV-resistant gasket fitted onto a contiguous injection-molded polymeric sidewall and backing unit. The contiguous injection-molded polymeric sidewall and backing unit having: an inlet port and/or an outlet port for fluid and/or 0.22 um filter gas-exchange port and fitted electron flow conduit plate connected to electrical wiring for the focused flow of direct current into an alternate current converter of a solar panel.

In another example, a vessel shape is a hollow polymer tube. In some embodiments, the vessel is shaped as a cylinder; a rectangle; a square; a sphere; a columnar object; or a planar object. In some embodiments, the vessel is a designed as fermenter; a growth chamber or other cell culture apparatus.

In certain embodiments, the cell system includes a housing frame, a light-conversion system adapter, AC adapter and electrical cord. In some embodiments, the system can house an array of light-conversion systems. In other embodiments, the solar panel can be fabricated in a manner such that the housing frame can enable the removal and replacement of a light-conversion system. Cells as disclosed herein can serve a functional role and can be used in a solar panel to provide electrical current to a dedicated external electrical load (e.g., a grid) while other aspects of the disclosure use a portable photovoltaic cell to provide electrical current to a device.

In some embodiments, the cell housing is a rigid system and provides a structural role in addition to a radiant energy acceptance role.

In certain embodiments, the voltaic cell can be used in a structural and functional role and can be used in an automobile and airplane as a hood, roof, sunroof, moonroof, trunk, frame, wing, window or other. Additionally, the cell can be used in a building as a wall, wall curtain, roof, window, door, walkway, patio, drive way, deck, fence or other.

In other embodiments, the cell housing is a flexible system that may provide a physical role in addition to an energy conversion role. Examples of use for a flexible microbial energy conversion cell are: retractable elements such as awnings, sails, covers, tarps, cloaks, capes; and foldable elements such as blankets, visors, umbrellas, parasols, fans and clothing.

Semi-Permeable Barrier

In some aspects of the disclosure, some or all of the microbial cell population is blocked by a semi-permeable barrier within the vessel. In some embodiments, some or all of the light harvesting antennae population is contained in a compartment at least partially defined by a semi-permeable barrier. In some embodiments, a mixture of the microbial cell population and a separate light harvesting antennae population may be contained in a compartment defined by a semi-permeable barrier. In some embodiments, a mixture of the electron siphon population and microbial cell population is contained in a compartment defined by a semi-permeable barrier. In some embodiments, a mixture of the electron siphon population, microbial cell population and a separate light harvesting antennae population is contained by a semi-permeable barrier. In some embodiments, the semi-permeable barrier is electronically conductive. In some examples, the semi-permeable barrier contains an electron conductive material contained by a semi-permeable barrier. In some embodiments, a mixture of the electron siphon population, microbial cell population, and a separate light harvesting antennae population is contained by a first semi-permeable barrier, and an electron conductive material is contained by a second semi-permeable barrier.

In certain embodiments where the barrier is electronically conductive, it makes electrical contact with an electrode of the voltaic cell (the anode or cathode). In some implementations, contact is made via a network of electron siphons.

In some embodiments, the semi-permeable barrier may be in a portion of the vessel. In some embodiments, the semi-permeable barrier may be present in more than one portion of the vessel. Semi-permeable barriers may provide containment of voltaic cell components, separation (e.g., anode and cathode compartments in a voltaic cell), polarity within the vessel, etc.

Containment within the vessel may be achieved by bounding a component of the voltaic cell. In some embodiments, containment within the vessel may also be achieved by bounding a mixture of components of a voltaic cell. In some embodiments, a semi-permeable barrier may contain the electron harvesting population; the electron donors of a voltaic cell, etc. In some embodiments, a semi-permeable barrier may contain one or more electron acceptor; electron conductive material; or other component of a voltaic cell. In some embodiments, a semi-permeable barrier is used to contain the electron harvesting population and the electron siphon population. In some embodiments, a semi-permeable barrier is used to contain the electron donor population. In some embodiments, a semi-permeable barrier is used to contain the electron donor population and the electron siphon population. In some embodiments, a semi-permeable barrier is used to contain the electron acceptor population. In some embodiments, a semi-permeable barrier is used to contain the electron donor population and a second semi-permeable barrier is used to contain the electron acceptor population.

Separation of components within a voltaic cell may be achieved by using one or more than one semi-permeable barrier to generate sub-compartments of specialized work. In one compartment—an electron donor compartment—separated components of a voltaic cell may convert light energy or chemical energy into free electrons. In another compartment, separated components of a voltaic cell may conduct the electrons in electrical current from the electron donor compartment to a current collector for the voltaic cell.

Separation within the vessel may be by electrical, chemical, osmotic, chemiosmotic, chemoelectric, or other mechanisms. More than one semi-permeable barrier may be used in each vessel may to generate a vessel with enhanced polarity. An arrangement of more than one semi-permeable barrier within a vessel may be in parallel or in series, where the separation may be set up in a portion of the vessel or over the expanse of the vessel. In some embodiments, a parallel arrangement of semi-permeable barriers containing electron-generating population may be generated. In some embodiments, a parallel arrangement of semi-permeable barriers containing electron recipient population may be generated. In some embodiments, an arrangement of semi-permeable barrier containing electron donor population may be connected in series with a semi-permeable barrier containing an electron recipient population. In some designs, multi-electrode voltaic cells in monopolar or bipolar configuration are used. In bipolar voltaic cells, the cells are stacked in a sandwich construction so the negative plate of one cell becomes the positive plate of the next cell. Electrodes are shared by two series-coupled electrochemical cells in such a way that one side of the electrode acts as an anode in one cell and the other side acts as a cathode in the next cell. The anode and cathode sections of the common electrodes are separated by an electron-conducting plate or membrane which allows no flow of ions between the cells and serves as both a partition and series connection.

Examples of electron recipient microbes include *Rhodopseudomonas* spp., *Geobacter* spp., *Acidithiobacillus* spp., *Shewanella* spp., and other microbes with type IV pili or electron accepting outer membrane components (Reguera et al, 2006; Leang et al., 2010; Richter et al., 2012), which is incorporated herein by reference in its entirety. Examples of electron donating microbes include *Desulfobacterales* spp., *Desulfovibrionales* spp., *Syntrophobacterales* spp., *Desulfotomaculum* spp., *Desulfosporomusa* spp., *Desulfosporosinus* spp., *Thermodesulfovibrio* spp., *Thermodesulfobacteriae* spp., *Thermodesulfobium* spp., *Archaeoglobus*, *Thermocladium*, *Caldivirga*, *Proteus* spp., *Pseudomonas*spp., *Salmonella* spp., *Sulfurospirillum* spp., *Bacillus* spp., *Desulfomicrobium* spp., *Pyrobaculum* spp., *Chrysiogenes* spp., and others.

Semi-permeable barriers may contain a material that may have a single layer or may have more than one layer such as a laminate. In some embodiments, the semi-permeable barrier contains pores. In certain implementations, the pores of the semi-permeable barriers may have pore sizes less than about 0.45 um; less than about 0.22 um; less than about 0.1 um; or less than about 0.5 nm. The semi-permeable barrier may contain a membrane; a filter; a film; a sieve; a size exclusion matrix, or the like. The semi-permeable barrier may be made from a synthetic polymer such as but not limited to polyvinylchloride, polypropylene, polystyrene, nitrocellulose, nylon, or other, a natural polymer such as lignin, cardboard, paper, silica nanoparticles. Semi-permeable barriers containing an electron conductive material may be used in the voltaic cell, in which case the barriers may serve as current collectors or otherwise supplement an anode or cathode. In some embodiments, the semi-permeable barrier is not conductive. In some embodiments, the buffer wets the barrier at which point the barrier allows diffusion and, in some cases, conduction of ions. Semi-permeable barriers may also contain a lignin, polyvinylchloride, PVDF, nitrocellulose or other. The barrier may have a thickness appropriate for the application. It should maintain high ionic conductivity within the voltaic cell and it should not occupy a large fraction of the cell's internal volume. In some examples, the barrier has a thickness of about 2.5 mm or less, about 200 um or less, about 50 um or less, about 750 nm or less, or about 200 nm or less. Sometimes, the barrier thickness may be as thin as about 1 nm to about 0.35 nm.

Electron Conductive Materials for Current Collectors

An electron conductive material may contain a metal, metalloid, colloidal, composite, silicon, or other material types having conductive or semi-conductive properties. Electron conductive material may contain a planar form; a mesh form; a bristled form; a web form; a layered form; a stippled form; a mesh form or other form that has increased surface area for improved electron conduction.

In some embodiments, a voltaic cell may contain more than one type of electron conductive material. In some embodiments, a voltaic cell may contain multiple types of electron conductive material, each material type having a different electron accepting potential. Different electrodes may have intrinsically different electrochemical potentials, which may facilitate biological or biochemical energy conversion. An electrode at an electropositive potential may potentiate the electron donating activity of certain types of microbes.

Electron conductive material may be contained by a semi-permeable barrier. In some embodiments, a voltaic cell may contain electron conductive material contained by a semi-permeable barrier. In some embodiments, a voltaic cell may contain multiple electron conductive materials, each contained by a semi-permeable barrier.

The electron conductive material may serve as a current collector in a voltaic cell. In some embodiments, the current collector is implemented as a wire or an interconnected group of wires extending into a compartment of a voltaic cell. In some embodiments, the current collector is a porous material having a porosity of at least about 0.2, or at least about 0.5, or at least about 0.7, or at least about 0.9. In some embodiments, the current collector occupies a substantial portion of a chamber (e.g., an anode chamber separated from a cathode by a semi-permeable membrane) in a voltaic cell. As examples, the current collector may occupy at least about 20% of the chamber volume, or at least about 50% of the chamber volume, or at least about 70% of the chamber volume, or at least about 90% of the chamber volume.

Example Constructions of Voltaic Cells

Design of a Voltaic Cell.

In this embodiment, a voltaic cell includes a vessel, a current collector or electrical terminal (e.g., in the form wires), a first electrode, a second electrode, microbes, and a buffer system. In one implementation, the vessel is made from glass, the current collector contains copper wires, the first electrode contains a coating such as an oxide (e.g., copper oxide or silicon dioxide), and a modified electrode contains a metal. As examples, the modifications may be the addition of a conductive metal mesh and/or quantum dots. The microbes may be a heterogeneous population of aquatic microbes, the majority of which may be capable of photosynthesis. The buffer system contains salts, minerals, sugars, amino acids, ammonium salts, and water.

Design of a Flexible Voltaic Cell.

A voltaic cell may include a flexible vessel as well as other components such as wires, electrode, modified electrode, microbes and a buffer. The vessel is made of flexible plastic tubing, closed at both ends during normal operation. As an example, the wires may be copper wires. The electrode may contain the metal wire having, in operation, a characteristic electrical potential ranging from about +0.8 to about +1.5 V versus the standard hydrogen electrode. Unless otherwise stated, all electrode voltages listed herein are versus a standard hydrogen electrode. The metal wire has a thin circumferential coating of semi-permeable membrane having a pore size of about 0.2 um in diameter. The modified electrode contains metal wire having a characteristic electrical potential ranging from about −3.3 to about +0.55 V, the modifications being conductive nanowires and/or quantum dots. The microbes are a heterogeneous population of aquatic microbes, the majority of which may be capable of photosynthesis. The buffer includes salts, minerals, sugars, amino acids, ammonium salts, and water.

Design of a High Surface Area Voltaic Cell.

A voltaic cell may include a vessel, wires, electrode, modified electrode, microbes and a buffer system. In one example, the vessel is made of glass and has dimensions of about 1 foot long×about 1 foot wide×about 0.34 foot tall. The wires are copper wires. The electrode includes silicon dioxide. The modified electrode is made of metal mesh, the modifications being conductive nanotubes and/or quantum dots. The microbes are a heterogeneous population of aquatic microbes, the majority of which may be capable of photosynthesis. The buffer system contains salts, minerals, sugars, amino acids, ammonium salts, and water.

Design of a Fixed Voltaic Cell in a Moving Body of Water.

An immersible voltaic cell may include a vessel, wires, electrode, modified electrode, microbes and a buffer system. The vessel is made of a metal box housing a battery, which may provide storage for electrical energy generated by the immersible cell and/or activate microbes or other features of the immersible cell. The wires are copper wires. The electrode is made of metal. The modified electrode contains graphite. The modifications being conductive nanotubes and quantum dots, pre-coated with a mixture of pigments. The microbes including a heterogeneous population of aquatic microbes, the precise composition is dependent on geography and water depth. The buffer system is ocean water. The portion of the voltaic cell immersed in the body of water includes the electrode, modified electrode and wires. The portion of the voltaic cell on land contains the vessel, wires, and optional battery.

Light Harvesting Antennae

In some embodiments, a light-harvesting antennae component population may be characterized as a population of components having: (i) one or more molecules with photon-absorption ability, (ii) that can lead to the excitation of one or more electron of the light-absorbing molecule or of a neighboring molecule in the presence of light, and (iii) where the excited electron can be transferred or (iv) where the energy from the excited electron can be transferred. As explained more fully below, the population of light-harvesting antennae components may include one or more of the following: a photosynthetic microbe, a membrane derived from photosynthetic microbe, a membrane vesicle derived from photosynthetic microbe, a macromolecular complex of lipid and light-harvesting antennae, a recombinant light-harvesting protein complexed with liposome, a micelle, a reverse micelle, a monolayer or other light-harvesting antennae derived from photosynthetic microbe complexed with liposome, micelle, reverse micelle, monolayer or other.

The light harvesting antennae population may serve as electron donors and/or may contain biochemical and chemical species capable of absorbing light energy. The light harvesting antennae population may be or contain synthetic and/or naturally-occurring: pigments; light-harvesting complexes; photosystems; photosynthetic reaction centers; carotenoids; chlorophylls; chlorosomes; porphyrins; chlorins; bacteriochlorins and other. Light harvesting antennae population may contain recombinant proteins; membrane preparations from photosynthetic organisms; exosome preparations from photosynthetic organisms; ground and lyophilized photosynthetic organisms; liposomal complexes containing light-harvesting antennae population; and other.

In some embodiments, the light harvesting antennae population contains a homogenous population. In some embodiments, the light harvesting antennae population contains a heterogeneous population. In some embodiments, a voltaic cell contains a heterogeneous population of light harvesting antennae. In some embodiments, a voltaic cell contains a homogenous population of light harvesting antennae.

The arrangement of light harvesting antennae population in a voltaic cell may vary based on use. As examples, the antennae population may be arranged in solution; in a sediment layer; in more than one layer; in a coating on, for example, a current collector; conjugated to the surface of an electron siphon; conjugated to the surface of an electron conductive material; conjugated to a current collector such as a wire network or other. The antennae population may be arranged between electron conductive siphon and electron conductive material (e.g., as a link in a conductive pathway); may be arranged in alternating layers with electron conductive siphon; may be arranged in alternating layers with electron conductive material; may be arranged in alternating layers with electron conductive siphon and electron conductive material. In some embodiments, the light harvesting antennae population may be arranged near the outermost surface of the vessel. In other embodiments, the light harvesting antennae population may be contained within a portion of the vessel. In some aspects of the disclosure, the light harvesting antennae population may be contained by a semi-permeable barrier with a pore size less than about 0.45 um; less than about 0.22 um; less than about 0.1 um; or less than about 0.5 nm. In some embodiments, the semi-permeable membrane may contain an electron conductive material. In some embodiments, the semi-permeable membrane is wholly or partially immersed in the buffer.

As examples, a light harvesting antennae population may be mixed with a microbial cell population at a mg:mg wet weight ratio (light harvesting antennae population mg: microbial cell population mg) of: about 0.0000001:1; about 0.000001:1; about 0.000001:1; about 0.00001:1; about 0.0001:1, and all ranges between any two of these examples.

Light harvesting antennae accept photons and in doing so excite electrons to a state or states where they are available for transfer or for transferring their energy. Sometimes, transfer occurs via donation to a redox mediator or other electron transporter. Light harvesting antennae are characterized by their efficiency in converting radiant energy to electrical energy. Efficiency is a function of wavelength, temperature, etc.

The light-harvesting antennae can be selected to have optimal light harvesting efficiencies at temperatures representative of the environmental conditions under which the light conversion system will be used. Organisms of the preferred invention have light-harvesting abilities at temperatures ranging from −20 to 100 degrees Celsius (Table 2).

The antennae populations can have a plurality of light harvesting efficiencies at different wavelengths of light. In certain embodiments, a light-harvesting antennae component population that can harvest ultraviolet, visible and far-red lights simultaneously. In some embodiments, the different populations have different bands of excitation wavelengths. In certain designs, a voltaic cell contains two different populations, each with a distinct excitation band, which bands do not substantially overlap. In other words, the majority of the wavelengths in each band does not overlap.

Light harvesting antennae contain chemical compounds having the above function. They may additionally contain vehicles holding such compounds. Examples of such vehicles include complexes, supermolecular assemblies, vesicles, organelles, microbes, etc.

Typically, light harvesting antennae compounds are or contain organic materials. In many embodiments, their molecular structure is cyclic organic with one or more metal ions incorporated therein. The metal ions include, zinc, cadmium, zinc, zirconium, molybdenum, manganese, magnesium, iron, platinum, copper, rhodium, osmium, iridium, and the like.

The light-harvesting antennae component population may contain light-harvesting membranes prepared from photosynthetic microbes mixed with light-harvesting liposomes.

The light harvesting antennae may be included in a photosynthetic microbe, membrane derived from photosynthetic microbe, membrane vesicle derived from photosynthetic microbe, macromolecular complex of lipid and light-harvesting antennae, recombinant light-harvesting protein complexed with liposome, micelle, reverse micelle, monolayer or other, light-harvesting antennae derived from photosynthetic microbe complexed with liposome, micelle, reverse micelle, monolayer, etc.

Tailored compositions of light harvesting antennae can be generated by mixing ratios of different light harvesting antennae having distinct wavelength excitation spectra and growth requirements to generate a photovoltaic cell that is compatible to a climate. Selection criteria for generating the population of light harvesting antennae include: wavelength excitation spectra, thermophilicity, halophilicity, anaerobic profile, nutritional requirements, and compatibility with different light harvesting antennae. Examples of compatible classes of light harvesting antennae include phosynthetic microbes with compatible nutrient and growth requirements such as *Geobacter* spp., *Chlorobium* spp., *Shewanella* spp., etc.; divergent wavelength excitation spectra of monomeric and polymeric metal-based pigments such as titanium white, titanium oxide (nanotubes, nanoribbons, and others), manganese violet, chrome green and others; inorganic pigments such as yellow ochre, raw sienna, ultramarine and others; and biopigments such as chlorophylls, carotinoids, anthocyanins, betalains, and others.

The choice of microbes for use in a voltaic cell is predicated on the power, durability and vessel requirements for the cell. In some examples, microbes may be selected for their ability to provide a bolus of electrical current from a unit periodically. As such, these microbes will optimally have the ability to store electrons in their cellular components and thus have electron sink properties. These microbes usually have appendages such as pili, fibrils, flagella or may also be filamentous in shape. Examples of suitable microbes with appendages such as pili, fibrils, flagella and similar structures include *Neisseria* spp., *Escherichia* spp., *Eikenella* spp., *Corynebacterium* spp., *Rhodospirillum* spp., *Rhodobacter* spp., *Aquaspirillum* spp., *Pseudomonas* spp., *Pirellula* spp., *Nostoc* spp., *Helicobacter* spp., *Geobacter* spp., *Enterobacter* spp., *Photobacterium* spp., *Brucella* spp., *Borrelia* spp., *Azoarcus* spp., *Dinoflagellata* spp., *Zooxanthellae* spp., *Azotobacter* spp., *Parabasalia* spp., *Aeromonas* spp., *Thermococcus* spp., *Methanopyrus* spp., *Thermoplasma* spp., *Pyrococcus* spp., *Methanococcus* spp., *Desulfurococcus* spp., *Methanoculleus* spp., *Archeoglobus* spp., *Thiobacillus* spp., *Synechococcus* spp., *Spirillum* spp., *Sphaerotilus* spp., *Ruminobacter* spp., *Roseobacter* spp., and other. Examples of filamentous microbes are: *Desulfurococcus* spp., *Streptomyces* spp., *Spirulina* spp., *Vorticella* spp., *Sphaerotilus* spp., *Xanthophyceae* spp., *Propionibacterium* spp., *Nostoc* spp., *Leptothrix* spp., *Frankia* spp., *Pleurocapsa* spp., *Chloroflexus* spp., *Beggiatoa* spp., *Anabaena* spp., *Ustilago* spp., *Magnetospirillum* spp., and other.

The microbes are selected such that said microbes are viable following voltaic cell-mediated withdrawal of stored electrons. The freed up electron storage components in a microbial cell can then be repopulated over time until the next bolus of electrical current is required by the voltaic cell. Examples of microbes having suitably robust electron storage capacities include *Rhodopseudomonas palustris*, *Moorella thermoacetica*, and the like. Timeframe of periodicity may be once every day, once every 3 days, once every 7 days, once every two weeks, once a month or other. The metabolic rates of the selected microbes will determine the frequency at which electrical current can be withdrawn by a voltaic cell.

In other examples, microbes may be selected for the ability of providing a fairly constant level of electrical current from a voltaic cell. Examples of such microbes include *Neisseria spp.*, *Escherichia* spp., *Rhodospirillum* spp., *Rhodobacter* spp., *Aquaspirillum* spp., *Rhodopseudomonas* spp., *Pirellula* spp., *Nostoc* spp., *Geobacter* spp., *Enterobacter* spp., *Photobacterium* spp., *Azoarcus* spp., *Dinoflagellata* spp., *Zooxanthellae* spp., *Azotobacter* spp., *Aeromonas* spp., *Thermococcus* spp., *Methanopyrus* spp., *Thermoplasma* spp., *Pyrococcus* spp., *Methanococcus* spp., *Desulfurococcus* spp., *Methanoculleus* spp., *Archeoglobus* spp., *Thiobacillus* spp., *Synechococcus* spp., *Spirillum* spp., *Sphaerotilus* spp., *Ruminobacter* spp., *Roseobacter* spp., *Desulfurococcus* spp., *Spirulina* spp., *Vorticella* spp., *Sphaerotilus* spp., *Xanthophyceae* spp., *Propionibacterium* spp., *Nostoc* spp., *Leptothrix* spp., *Frankia* spp., *Pleurocapsa* spp., *Chloroflexus* spp., *Anabaena* spp., *Ustilago* spp., *Magnetospirillum* spp., and the like. As such, these microbes will optimally have diverse metabolic pathway repertoires to enable them to generate free electrons from a diverse set of chemical and/or light sources. Additionally, the microbes will have a relatively constant rate at which free electrons are generated (compared with most other microbes). The microbes are selected such that they are viable following continual electrical current withdrawal by the voltaic cell. Examples of such microbes include some photoheterotrophs and some chemoheterotrophs.

In other examples, microbes may be selected for their durability. Examples of such microbes include *Rhodospirillum* spp., *Rhodobacter* spp., *Aquaspirillum* spp., *Rhodopseudomonas* spp., *Nostoc* spp., *Geobacter* spp., *Enterobacter* spp., *Methanococcus* spp., *Desulfurococcus* spp., *Thiobacillus* spp., *Synechococcus* spp., *Spirillum* spp., *Roseobacter* spp., *Desulfurococcus* spp., *Spirulina* spp., *Anabaena* spp., and the like. Durable microbes are defined as having the ability to withstand conditions in the voltaic cell in a sustained manner. Variables that factor into the selection of durable microbes include: metabolic robustness (e.g., having two or more metabolic pathways); genetic robustness (ability to mutate during environmental stress, i.e., non-proofreading/non-editing capabilities in DNA polymerase or RNA polymerase); environmental robustness (ability to be metabolically active over time under fluctuating environmental conditions, i.e., temperature, light, pressure and other); and population robustness (ability to co-exist with other microbial species in a community without being outcompeted for nutrients, etc.).

In some examples, a nutrient spike may be necessary to maintain levels of one or more subset of the microbial population. Examples of nutrients required periodically include: phosphate, sulfur, hydrogen sulfide, sulfate, nitrate, acetic acid, CO2, O2, ammonia, H2, Fe2+, Mg2+, Mn2+, Co2+ and their salts, or other. In other examples, a waste-neutralization spike may be necessary to maintain levels of one or more subset of the microbial population. Examples of waste-neutralization components required periodically include: HCl, NaOH, sodium bicarbonate, calcium bicarbonate, chelators, CO2, O2 or other.

For self-sustaining microbial populations in a voltaic cell, microbes may be selected based on their preferred metabolic substrate use or their preferred metabolic waste product. Pairing of selected microbes may be based on complementary metabolisms. In some examples, microbes having one type of predominant metabolism may produce metabolic waste products that serve as substrates (or otherwise meet some nutritional requirements) for other microbes having a second type of predominant metabolism, thus it can be said that one microbial subset is symbiotic with a second microbial subset. Such pairs of microbe species are sometimes said to be complementary. In other examples, a voltaic cell can contain a diverse population of microbes wherein two or more subsets' metabolisms are interacting with others in a symbiotic fashion. The metabolic balance of the microbial population can be designed or tuned to provide a self-sustained voltaic cell.

Often, the two more microorganisms in a buffer can be characterized by their primary metabolic pathways, which accounts for the fact that microorganisms may have multiple metabolic pathways, but at any instant in time one of the pathways accounts for more metabolism than the others. Focusing on the primary metabolic pathways, in certain embodiments, complementary microbes have primary metabolic pathways that, to a degree, are inverses one another. For example, one organism may primarily oxidize a certain N, C, S, or P-containing compound and a complementary organism primarily reduces the oxidized N, C, S, or P-containing compound produced by the first organism. Of course, no organism exclusively oxidizes or reduces; rather it oxidizes some compounds and reduces others. The pairing of complementary microorganisms focuses on substrates and waste products of primary metabolic pathways. Ideally, the waste product of one organism is an oxidized N, C, S, or P-containing compound, which is the substrate of a different organism. In turn, the second organism reduces the oxidized compound to produce the substrate of the first organism. In certain embodiments, the complementary microorganisms in a buffer together make up at least about 50% of the buffer's microbial content, or at least about 70% of the buffer's microbial content, or at least about 90% of the buffer's microbial content. In certain embodiments, the primary metabolic pathways of the complementary microorganisms are respiratory pathways. While the above discussion focuses on two complementary microorganisms, the concept naturally extends to three or more complementary microorganisms. In some cases, two or more microorganisms share the same primary metabolic pathway or have similar primary metabolic pathways. In other cases, each of three or more complementary microorganisms in a buffer have different primary metabolic pathways, but collectively have little or no net consumption of substrates or generation of waste products. For example, a first microorganism may consume compound A and produce compound B; while a second microorganism consumes compound B and produces compound C; and a third microorganism consumes compound C and produces compound A.

Once self-sustained populations have been established in a voltaic cell, the environmental conditions (daylight, temperature, etc.), timing and rate of electron current withdrawal by the voltaic cell and microbial cell density input can be controlled for maintaining symbiosis. Microbial selection will help to generate a sustained "homeostatic" population with little turnover, but control of various inputs and outputs may also require regulation. Such regulation may be employed by the use of sensors and feedback loops in the voltaic cell to help maintain balance.

Microbes can also be selected based on their indigenous environment. Marine waters and their underlying sediments constitute the largest portion of the biosphere. They are key for biogeochemical cycling in our planet; the composition of marine microbial communities, their metabolic potential and activities and their interactions with the environment remain poorly understood. A considerable effort has been devoted to study planktonic communities inhabiting euphotic layers by molecular and genomics-based methods that complement classical cultivation-based approaches. In fact, surface seawaters have been an environment of choice for pioneer studies of microbial diversity based on the amplification, cloning and sequencing of small subunit ribosomal RNA (SSU rRNA) genes to chronicle species diversity and genomic diversity. However, different water masses are endowed with different physico-chemical characteristics. Such differences are particularly important in close seas, much more influenced by coastal input and local features. For example, Mediterranean waters are very different from open oceanic waters, and this seems to be reflected at the metagenome level. Geographic location can thus be used as selective criteria for selection of microbes for a voltaic cell for use in a particular geographic environment. For example, geothermal vents, fissures, brackish watersheds, brackish sediments, ponds, salt ponds, glacial ice, oceanic sediments, Yellowstone acid pools, etc.

In experimental microbial fuel cells presented in the literature, carbon sources present a costly hurdle in generating a sustained system. For example, the use of sugar fermentative organisms to fuel microbial fuel cells and/or fermentation systems winds up being cost-prohibitive and not practical for scale-up. Therefore, in certain embodiments, voltaic cells and associated buffers are substantially free of fermentative organisms such as yeast. In some embodiments, the voltaic cells are substantially free of sugar fermenting organisms such as glucose fermenting organisms.

Selection and use of light-harvesting phototrophic microbes in combination with chemotrophic microbes provides a more sustained population for lasting electric current generation in a voltaic cell. In many phototrophs, a photon of light can generate 1-3 free electrons (dependent on the microbial species), with the waste products being $CO_2$, $O_2$, other gases, inorganic molecules, organic carbon sources and other molecules as waste products. These waste products can be used by chemotrophic microbes as energy sources.

There is significant diversity amongst chemotrophs, with documented energy sources in the hundreds of chemical compounds ranging from gases, to metals, to inorganic compounds, to organic compounds. The breakdown of bond energy from these chemistries and the generation of free electrons during the catabolic processes vary. Examples of ranges include 1 to more than 6 free electrons per starting molecule, with the metabolic waste products being $CO_2$, $O_2$, other gases, organic carbon compounds, inorganic molecules, and other molecules as waste products. These waste products can be used by other chemotrophs in a population or can be used by some photoheterotrophs in a population.

The potential for ferric iron reduction with fermentable substrates, fermentation products, and complex organic matter as electron donors has been investigated. For example, even in aquatic sediments from freshwater and brackish water sites, microbes have demonstrated electron flow capabilities, particularly following enrichment with glucose and hematite. In these examples, iron reduction was a minor pathway for electron flow and fermentation products accumulated, which may be used by chemotrophs in a voltaic cell. The substitution of amorphous ferric oxyhydroxide for hematite in glucose enrichments was further shown to increase iron reduction 50-fold because the fermentation products could also be metabolized with concomitant iron reduction by the chemotrophs. Acetate, hydrogen, propionate, butyrate, ethanol, methanol, and trimethylamine have also been shown to stimulate the reduction of amorphous ferric oxyhydroxide in enrichments inoculated with sediments but not in uninoculated or heat-killed controls under lab conditions. The addition of ferric iron can inhibit methane production in sediments. The degree of inhibition of methane production by various forms of ferric iron has been shown to relate to the effectiveness of these ferric compounds as electron acceptors for chemotrophic metabolism of acetate. The addition of acetate or hydrogen to the population can relieve the inhibition of methane production by ferric iron. The decrease of electron equivalents proceeding to methane in sediments supplemented with amorphous ferric oxyhydroxides can be compensated for by a corresponding increase of electron equivalents in ferrous iron. Therefore, iron reduction can out compete methanogenic food chains for sediment organic matter. Thus, when amorphous ferric oxyhydroxides are available in anaerobic sediments and/or when selected for use in voltaic cells, the transfer of electrons from organic matter to ferric iron can be a major pathway for organic matter decomposition and can be interrupted by electron siphons or other terminal electron acceptor and thus a source of electron current generation for the voltaic cell.

In another example, gas or cold seeps are enriched in methane and can be seen directly as bubbles coming out from the sediment, or can be detected indirectly by the presence of dark patches revealing areas of strong redox activity in which sulfate reduction by microbes occurs just beneath the surface. These patches are often colonized by sibloglinid polychaetes and bivalves likely associated with symbiotic bacteria and mats of sulfide-oxidizing bacteria. A voltaic cell can comprise a population of symbiotic microbes balancing sulfate reduction and methane production a freshwater sediment buffer system. Examples of sulfate reducing bacteria include *Desulfobacter* spp., *Desulfococcus* spp., *Desulfovibrio* spp., *Erythrobacter* spp., *Thermotoga* spp., *Pyrobaculum* spp., *Roseobacter* spp., *Rhodoferax* spp., *Pelobacter* spp., *Carboxydothermus* spp., *Lawsonia* spp., *Methanococcus* spp., *Thermodesulfobacterium* spp., *Desulfuromonas* spp. and other. Examples of methanogens are: *Methanococcus* spp., *Methanoculleus* spp., *Methanofollis* spp., *Methanopyrus* spp., *Methanosarcina* spp., *Methanosphaera* spp., *Methanothermobacter* spp., and the like.

In yet another example, gamma-proteobacteria, which are the most abundant groups in high bacterial-diversity sediment, can be mixed with an archael plankton fraction containing Group I Crenarchaeota/Thaumarchaeota, and can be mixed with Euryarchaeota from group I (e.g., Duboscquellida) and group II (e.g., Syndiniales) alveolates and Radiozoa dominating plankton, and Opisthokonta and Alveolates, sediment buffer system.

Many other examples can exist, whereby desirable metabolism, cell physiology, genes, growth conditions, metabolic rates and compatibility can be selected for.

While many studies of lab-based microbial fuel cells employ pure microbial cultures comprising domesticated strains from glycerol freezer stocks, such strains may not be appropriate for some voltaic cells as disclosed herein. In certain embodiments, voltaic cells employ environmental microbes present in their natural state. Microbes isolated and cultured using standard microbiological techniques have been shown to have lost "fitness", i.e., they lose genes they no longer need under laboratory conditions. As used herein, the term "natural state" refers to microbes having genotypes as found in their natural environment, prior to becoming laboratory or industrial microbes. As such, natural state microbes tend to be more fit than their laboratory or industrial counterparts. In an example, an environmental sediment is placed in a voltaic cell. In some examples, the environmental sediment is mixed with a second environmental sample prior to placement in a voltaic cell. A goal of this method is to maintain as many of the naturally-observed genes as possible to maximize natural state microbial fitness in a voltaic cell for optimal electrical current production. A second advantage of using natural state microbes over lab-cultured microbes is their ability to withstand external stressors and higher stress tolerance compared to lab-cultured microbes. The advantage of having a starting population with a higher gene abundance and increased gene repertoire enables many more chances for a successful self-sustained population being generated in a voltaic cell, as it is much more difficult for an lab-cultured microbe to spontaneously generate new genes from a smaller genome than it is to select for modest beneficial mutations in pre-existing genes.

For environmental isolates and environmental populations for use in voltaic cells, environmental sample testing can be performed using conventional methods such as spectroscopy, mass spectrometry, gene sequencing and other methods to identify the presence of desirable chemistries and/or the presence of desirable genes known to participate in a biochemical and/or metabolic pathway.

For example, one can look for particular genes and their respective protein products that are considered to be diagnostic for particular enzymatic pathways and, hence, for particular metabolic capabilities. These included ammonia monooxygenase AmoA, AmoB and AmoC subunits (nitrification), 4-hydroxybutyryl dehydratase ($CO_2$ fixation by the 3-hydroxypropionate/4-hydroxybutyrate pathway), dissimilatory sulfite reductase DsrA and DsrB subunits (sulfate respiration), dissimilatory nitrite reductase subunits NirK and NirS (nitrate respiration), nitrogenase subunits NifH and NifD (nitrogen fixation), carbon-monoxide dehydrogenase CoxLMS subunits (CO oxidation), RuBisCO ($CO_2$ fixation), sulphatase (degradation of sulfonated heteropolysaccharides), hydroxylamine oxidoreductase HAO (anammox), methyl coenzyme A reductase (anaerobic oxidation of methane) and C-P lyase (phosphonate utilization). Selective analysis of environmental samples for desired genes is one method for determining the desirable composition of microbes in a population for use in a voltaic cell.

Archaeal amo genes were abundant in plankton, suggesting that Marmara planktonic Thaumarchaeota are ammonia oxidizers. Genes involved in sulfate reduction, carbon monoxide oxidation, anammox and sulfatases were over-represented in sediment. Genome recruitment analyses showed that Alteromonas macleodii 'surface ecotype', Pelagibacter ubique and Nitrosopumilus maritimus were highly represented in 1000 m-deep plankton.

In anoxic sediments, sulfate reduction is generally accompanied by the activity of methanogenic archaea in deeper sediment layers. In cold seep environments, such as those existing in localized areas of the Marmara Sea, some sulfate-reducing bacteria are symbiotically associated to archaea carrying out anaerobic methane oxidation. One can look for the presence of methyl coenzyme M reductase, which catalyses the terminal step in methanogenesis and seems to have a role also in reverse methanogenesis, being characteristic of methane-metabolizing archaea. The genes encoding the subunits of methyl coenzyme M from Methanosarcina barkeri (McrABCDG) and those of the nickel protein involved in the anaerobic oxidation of methane (McrABG) from an uncultured archaeon have been used as seeds against the chosen metagenomes. However, no hits were detected. This is in agreement with both, the fact that Ma29 corresponded to 'normal', bottom sediment not strongly influenced by cold seep activity and with the fact that it was collected from the surface of the sediment core and hence above the methanogenesis layer.

As Planctomycetes are relatively abundant in sediment, one can determine the presence of genes that could indicate the occurrence of anammox activity the Kuenenia stuttgartensis gene encoding the hydroxylamine oxidoreductase, one of the key enzymes of the anammox reaction. This marker and other similar markers can be used to identify samples containing a large number of oxidoreductases as a source of electron carriers that may be able to be accessed by electron siphons in a voltaic cell.

Sulfatases are abundant in the genome of R. baltica and, in general, marine planctomycetes possess a large number of these enzymes, which they might use for the initial breakdown of sulfated heteropolysaccharides, thus having an important role in recycling these abundant oceanic compounds. These markers can be used to determine sulfate-recyclers, which could provide a means of generating bio-useful sulfur sources to other subsets in a voltaic cell.

The use of phosphonate compounds has been recently proposed as an important source of phosphorous in P-depleted surface marine waters, as well as in more P-rich deep waters. Known genes but also novel pathways for phosphonate utilization are abundant in metagenomic picoplankton libraries as deduced from functional screenings. These markers can be used to determine phosphonate use by microbes in a sample, which could provide a means of generating bio-useful phosphate sources to other subsets in a voltaic cell.

The oxidation of CO to $CO_2$ as an alternative or supplementary energy source is widespread in many marine bacteria including, notably, members of the highly versatile and abundant Roseobacter clade. Carbon monoxide dehydrogenase genes were detected at relative high abundance in deep Mediterranean waters, which suggested that deep-sea microbes might perform a similar form of lithoheterotrophy to that showed by surface bacterioplankton by oxidizing CO. The possible role of CO oxidation in deep waters has been criticized because the source of CO would be unclear at that depth and because carbon monoxide dehydrogenase is also involved in some pathways of central C metabolism, for instance in acetogenic methanogens. However, hydrothermal activity associated with oceanic ridges and to submarine volcanic areas, which are indeed rather extensive in the Mediterranean, constitutes a very likely source of CO in the deep sea. Furthermore, sequencing of metagenomic fosmids containing carbon monoxide dehydrogenase genes has shown that they are organized in clusters having the typical structure of CO oxidizing bacteria. Hence, lithoheterotrophy based on CO oxidation may actually be a useful strategy to gain free energy also in the deep sea. This can be leveraged in a voltaic cell, as selected microbes employing CO oxidation can reduce electron siphons.

The ammonium monooxygenase is the key enzyme in the first step of nitrification. Thaumarchaeota are major factors in the oxidation of ammonia to nitrite in soil and oceans as suggested by the dominance of archaeal over bacterial amoA genes. However, not all deep-sea Thaumarchaeota possess amoA, suggesting that many deep-sea archaea are not chemolithoautotrophic ammonia oxidizers. Amo genes can thus be used as a marker for oxidizing microbes, which may be used in a sub-compartment of a voltaic cell to drive potentiation of the voltaic cell.

In addition, Ma101 Thaumarchaeota seem to be chemolithoautotrophic, as they can possess the gene for 4-hydroxybutyryl dehydratase, a key enzyme in the 3-hydroxypropionate/4-hydroxybutyrate pathway for autotrophic $CO_2$ fixation in group I archaea. In addition to this C fixation pathway, a number of microbes in a sample may contain the RuBisCO large subunit (rbcL), indicating the presence of the more conventional Calvin cycle for $CO_2$ fixation. These microbes can be used in a voltaic cell for nutrient generation for additional microbial subsets in the voltaic cell.

In another example, genomics and gene sequencing can identify compatible microbes for use in a voltaic cell. From numerous studies utilizing phylogenetic analyses of ribosomal DNA (rDNA) sequences from gene libraries made from environmental isolates, many of Delta-proteobacteria affiliate with the sulfate-reducing Desulfobacteraceae, but also with several lineages without cultivated microbes, which suggest that some of them may be sulfate reducers as well. Among the planktonic Delta-proteobacterial rDNA sequences, several have been identified from the uncultivated group SAR324. The co-occurrence of genes for sulfate reduction in the same sample suggests that the SAR324 are capable of reducing sulfate. Indeed, the presence of certain metabolic genes in metagenomic clones and the relative abundance of this group in oxygen-depleted waters suggested that SAR324 may correspond to anaerobic or microaerophilic organisms. Advantages to using information and methods detailed here encompass the selection and use of Desulfobacteraceae and SAR324 microbes in a voltaic cell for electrical current generation.

Microbe Examples

In certain embodiments, the light-harvesting antennae component population is a population of photosynthetic microbes, where the photosynthetic microbes can execute non-oxygenic photosynthesis. In certain embodiments, the light-harvesting antennae component population is a population of are oxygenic photosynthetic microbes. Yet in other embodiments, the light-harvesting antennae component population is a mixture of oxygenic and non-oxygenic photosynthetic microbes. The photosynthetic microbes may be one species but may also be poly-species. Examples of such microbes and light-harvesting antennae for use with the disclosed embodiments are listed in Table 1.

The microbial cell population may serve as an electron donor. The microbial cell population may contain viable or non-viable photosynthetic microbes, non-photosynthetic microbes, or a combination of photosynthetic microbes and non-photosynthetic microbes. The microbial cell population may contain 0-100% photosynthetic microbes. In some embodiments, the microbial cell population contains about 35-80% photosynthetic microbes. In some embodiments, the microbial cell population contains nearly about 100% non-photosynthetic microbes. Photosynthetic microbes, if used, may be a population of heterogeneous species and/or strains. In other embodiments, the photosynthetic microbial population may contain a homogenous species or a homogenous strain. Non-photosynthetic microbes, if present, may contain a population of heterogeneous species and/or strains. In other embodiments, the non-photosynthetic microbes may contain a homogenous species or a homogenous strain.

In some embodiments, a composition of microbial cell population may be generated by mixing ratios of different microbial species; different environmental isolates; different environmental samples; or other where each species; isolate; environmental sample has a distinct spectral wavelength absorbance(s) and growth requirement that may be optimally compatible with a desired climate. Selection criteria for generating the population of microbes may include: wavelength excitation spectra, thermophilicity, halophilicity, anaerobic profile, nutritional requirements, compatibility and other. In some embodiments, a voltaic cell contains different microbial species or strains that complement one another in terms of any one or more of these criteria. For example, two species may have similar thermophilicities and halophilicities but different nutritional requirements.

A voltaic cell, used for the converting light energy to electrical energy, may contain a microbial cell population including a combination of photosynthetic microbes and non-photosynthetic microbes, where the photosynthetic microbes outnumber the non-photosynthetic microbes at about a 1.5:1 ratio; where the photosynthetic microbes outnumber the non-photosynthetic microbes at about a 3:1 ratio; where the photosynthetic microbes outnumber the non-photosynthetic microbes at about a 5:1 ratio; where the photosynthetic microbes outnumber the non-photosynthetic microbes at about a 500:1 ratio; where the photosynthetic microbes outnumber the non-photosynthetic microbes at about a 5,000,000:1 ratio; or ranges between any two of the above values. In some implementations, the photosynthetic microbes outnumber the non-photosynthetic microbes at a ratio of about 1.5:1 to about 100:1. A voltaic cell may be used for converting cellular energy to electrical energy and contain a microbial cell population containing a combination of non-photosynthetic microbes. A voltaic cell may be used in a flexible manner to convert light energy to electrical energy from time-to-time and to convert cellular energy to electrical energy from time-to-time contains a microbial cell population containing a combination of non-photosynthetic microbes and photosynthetic microbes.

The arrangement of the microbial cell population in a voltaic cell may vary based on use. Microbial cells may be arranged in solution; in a sediment layer; in more than one layer; in a coating; conjugated to the surface of an electron siphon; conjugated to the surface of an electron conductive material; conjugated to a wire or other current collector; or other. Microbial cells may be arranged between electron conductive siphons and other electron conductive material (which may be part of a siphon); may be arranged in alternating layers with electron conductive siphon; may be arranged in alternating layers with electron conductive material; may be arranged in alternating layers with electron conductive siphon and electron conductive material. In some embodiments, the microbial cell population may be arranged near the outermost surface of the vessel. In other embodiments, the microbial cell population may be contained within a portion of the vessel.

In some aspects of the disclosure, the microbial cell population may be arranged in layers in a voltaic cell; the layers of which may contain microbes having similar light absorbing wavelength range specificities. In some examples, the order of layers regarding the outermost vessel layer may be: infra-red absorbing microbes then red light absorbing microbes then orange light absorbing microbes then yellow light absorbing microbes then green light absorbing microbes then blue light absorbing microbes then indigo light absorbing microbes then violet light absorbing microbes then ultra-violet light absorbing microbes, or other frequency progression along the electromagnetic spectrum. More generally, other cascading wavelength arrangements may be employed for the light harvesting antennae, microbes, and radiation absorbing characteristics of the buffer.

A diversity of microbes can donate electrons to an electrode or accept electrons from an electrode, which is incorporated herein by reference in its entirety. In some cases, artificial electron transfer facilitation is not necessary. *Shewanella oneidensis* interacts with electrodes primarily via flavins that function as soluble electron shuttles. *Geobacter sulfurreducens* electrically contacts electrodes via outer-surface, c-type cytochromes. *G. sulfurreducens* is also capable of long-range electron transport along pili, known as microbial nanowires that have metallic-like conductivity similar to that previously described in synthetic conducting polymers. Pili networks confer conductivity to *G. sulfurreducens* biofilms, which function as a conducting polymer, with supercapacitor and transistor functionalities. The mechanisms by which *Geobacter sulfurreducens* transfers electrons through relatively thick (>50 micron) biofilms to electrodes acting as a sole electron acceptor have recently been investigated. Biofilms of *Geobacter sulfurreducens* grown either in flow-through systems with graphite electrodes as the electron acceptor or on the same graphite surface, but with fumarate as the sole electron acceptor have been demonstrated to generate electrical current. Conductive microorganisms and/or their nanowires have several potential practical applications, but additional basic research will be necessary for rational optimization. Described are electron siphon devices for more efficient electron transfer between a microbe and an electrode. Also described are electron siphon devices for a voltaic cell. Last, described are voltaic cells for water.

Liposome Examples

A population of light-harvesting liposomes having light-harvesting antennae molecules (such as those in Table 2).

Examples liposomes components include steroyl and distearoyl types of phosphatidyl choline, palmitoyl and dipalmitoyl types of phosphatidyl choline, phosphatidyl glycerol and cholesterol. The phosphatidyl glycerol and/or cholesterol can be added to the liposome to impart enhanced temperature stability.

A population including a mixture of light-harvesting antennae liposomes, the liposomes containing a molar ratio of 10:8:2 of distearoyl phosphatidyl choline:distearoyl phosphatidyl glycerol:cholesterol; the light-harvesting antennae containing a mixture of bacteriochlorophyll a, bacteriochlorophyll b, bacteriochlorophyll c, bacteriochlorophyll d, spirilloxanthin, proteorhodopsin, chlorophyll a and chlorophyll b.

A population can contain a 1:1 ratio of prepared membranes and liposomes. Most optimally, the population contains a 1:10 ratio of prepared membrane to liposome.

A population of photosynthetic microbes mixed with light-harvesting liposomes, where the photosynthetic microbes can execute oxygenic and/or non-oxygenic photosynthesis.

Light Harvesting Antennae—Various Examples

Exemplary organisms and their respective light-harvesting antennae are listed in Table 1.

TABLE 1

Examples of microbe-derived light-harvesting antennae components.

| GROUP | EXEMPLARY MICROBIAL SPECIES | LIGHT HARVESTING ANTENNAE | ABSORPTION MAXIMA (nm) | ELECTRON DONOR(S) | HABITAT |
|---|---|---|---|---|---|
| Green sulfur bacteria | *Chlorobium*; *Chloroherpeton*; GSB1; others | Bacteriochlorophyll a; c; d; or e; chlorophyll a | | Sulfide; Hydrogen; Ferrous iron | Volcanic hot springs; salt marsh sediments; deep freshwater lakes; high temperature and salinity |
| Green non-sulfur bacteria | *Chloroflexus* spp.; others | Bacteriochlorophyll 663; chlorophyll a | 865 | P865 (dimer of bacteriochlorophyll a) | Biological waste (sludge) |
| Purple sulfur bacteria | | Bacteriochlorophyll a; b; carotenoids | 800; 820; 850; 870-890; 1,020 | | |
| Purple non-sulfur bacteria | | | | | |
| Prochlorophytes | | | | | |
| Cyanobacteria | *Prochlorococcus*; *Synechococcus* | | | | Hot springs |
| Other | *Porphyrobacter* | OH-beta-carotene sulfate derivatives; nostoxanthin; bacteriorubixanthinal | 460; 494; 596; 800; 870 | | |
| Brown algae | | | | | |
| Green algae | | | | | |
| Red algae | *Cyanidium* | | | | Hot springs |
| Diatoms | *Phaeodactylum*; | Chlorophyll a; c1; c2; fucoxanthin | 425; 440; 450; 490; 670; 680 | | |

TABLE 2

Antennae and light-harvesting abilities

| LIGHT-HARVESTING ANTENNAE TYPE | WAVELENGTH RANGES (nm) |
|---|---|
| Allophycocyanin | 651 nm |
| Bacteriochlorophyll a | 805 nm, 830-890 nm |
| Bacteriochlorophyll b | 835-850 nm, 1020-1040 nm |
| Bacteriochlorophyll c | 745-755 nm |
| Bacteriochlorophyll d | 705-740 nm |
| Bacteriochlorophyll e | 719-726 nm |
| Bacteriochlorophyll f (currently found only through mutation; natural may exist) | 700-710 nm |
| Bacteriochlorophyll g | 670 nm, 788 nm |
| Bacteriochlorophyll 663 | 663 nm |
| Rhodovibrin | 510 nm |
| Spirilloxanthin | absorption peaks in acetone at 470, 497, and 530 nm. Assuming a shift toward longer wavelengths in vivo, the three absorption peaks seen in the range of 480 to 550 nm are apparently a signature of the optical activity of spirilloxanthin |
| Gamma-carotene | Absorption max: 437, 462, 494 nm (E1% 1 cm 2055, 3100, 2720). Natural form: minute, deep-red prisms with bluish luster from benzene + methanol. mp 177.5°. Absorption max (chloroform): 508.5, 475, 446 nm. Somewhat less so than □-carotene. |

TABLE 2-continued

Antennae and light-harvesting abilities

| LIGHT-HARVESTING ANTENNAE TYPE | WAVELENGTH RANGES (nm) |
|---|---|
| Proteorhodopsin | Blue: 490 nm; Green: 525 nm |
| R-Phycoerythrin | 498, 546, 566 nm |
| B-Phycoerythrin | 546, 566 nm |
| C-Phycocyanin | 620 nm |
| Flavocytochrome c552 | absorption maxima at 419, 523 and 552 nm in the reduced form. Reduced-minus-oxidized difference millimolar absorption coefficient was 10.6 for the wavelength pair, 552 minus 540 nm |
| Carotenoids | 460 and 550 nm (maxima) |
| Chlorophyll a | Range: 400-500 and 650-700 nm; 430 and 662 nm (maxima) |
| Chlorophyll b | Range: 450-500 and 600-650 nm; 453 and 642 nm (maxima) |
| Chlorophyll c1 | Peaks 642 nm and 630 nm |
| Chlorophyll c2 | Peaks 444 nm and 630 nm |
| Chlorophyll d | Peaks 401 nm, 455 nm and 696 nm |
| Xanthophyll | Range: 400-530 nm |
| Anthocyanins | maxima in vivo 537 nm-542 nm |

Sources of Light Harvesting Antennae

Naturally Occurring Sources

Light-harvesting antennae component populations can be cultivated and harvested from natural or synthetic ponds, large-scale growth columns with culture medias under conventional laboratory conditions, scaled-up manufacturing conditions, and photovoltaic solar panel beds.

Microbes and microbe derivatives of the disclosed embodiments can be isolated from one or more geographic location and from one or more climate by standard microbiological methods including culturing with a defined media, cultivation in the natural environment and cultivation in a solar panel farm.

Preparation for an Energy Conversion Cell

The light-harvesting antennae component population may include membranes with light harvesting antennae derived from photosynthetic microbes. The membranes can be prepared from microbes by sonication, hydraulic press, pressure press, enzymatic, hypotonic bath or other conventional mechanical or chemico-mechanical method. The membranes can be mixed with a buffered solvent and antioxidant mixture, such as a nonionic surfactant prior to addition to the electrolyte-buffered solution of the disclosed embodiments. The membranes can be prepared from one or more photosynthetic microbial species capable of oxygenic and/or non-oxygenic photosynthesis. The membranes can be prepared from specific photosynthetic microbes separately and can be mixed at a desired ratio to enable light-harvesting capabilities over ranges wavelengths of light.

Variants of Naturally Occurring Sources

Microbes and microbe derivatives for use with the disclosed embodiments can also be generated by genetic engineering to produce one or more microbial variants with increased light harvesting antennae levels and increased light harvesting capabilities for the enhanced harvest of light.

The light-harvesting antennae component may additionally include one or more genetically-modulated photosynthetic microbial species with increased numbers of light-harvesting antennae components per unit area membrane. The genetically-modulated microbes can be induced to enhance gene expression to increase the production of light-harvesting antennae in a population of microbes. Methods to induce the increased gene expression include but are not limited to: gene knock-ins by transposons, DNA recombination of transgenes by plasmid DNA, micro-RNAs, gene-activating RNAs, co-incubation with donor cells to promote conjugation and phage transduction.

Media for Light Harvesting Antennae—Buffers

The buffer system may be in liquid, gel or paste form, and may, in certain embodiments, contain salts, buffering agents, nutrients, thickening agents and one or more other components. In some embodiments, a buffer system may also contain pigments or similarly simple light harvesting antennae. In certain embodiments, a buffer includes an electron donor, a reductant, a salt, an amino acid, a pH buffering agent, a carbon source, a nitrogen source, a sulfur source, an oxygen source, trace minerals, a vitamin co-factor, or a combination of any two or more of the foregoing. In general, the buffer composition supports the maintenance of the light harvesting antennae population over time. Further, the buffer may support the maintenance of the light harvesting antennae population in a closed system in one or more climate.

Salts may be present in concentrations ranging from about 10 picgrams/L to about 30 grams/L; from about 10 micrograms/L to about 500 milligrams/L; from about 50 micrograms/L to about 50 milligrams/L; and from about 15 micrograms/L to about 5 milligrams/L. In some embodiments, the salts are present at concentrations that promote desired electrolyte properties such as ionic conductivity level, nutrient level, etc. In some embodiments, the salts are chosen for their high ionic conductivity.

Examples of salts that may be used include aluminum chloride, aluminum fluoride, ammonia, ammonium bicarbonate, ammonium chromate, ammonium chloride, ammonium dichromate, ammonium hydroxide, ammonium nitrate, ammonium sulfide, ammonium sulfite, ammonium sulfate, ammonium persulfate, ammonium perchlorate, boric acid, bromine pentafluoride, cadmium chloride, cadmium nitrate, cadmium selenide, cadmium sulfate, cadmium sulfide, calcium chloride, calcium chromate, calcium cyanamide, calcium fluoride, carbonic acid, chromium chloride, chromium sulfate, chromium chloride, chromium oxide, chromium sulfate, cobalt carbonate, cobalt chloride, cobalt sulfate, copper chloride, copper oxide, copper sulfide, copper carbonate, copper nitrate, hydrogen chloride, hydrogen fluoride, hydrogen sulfide, iodic acid, iron chloride, iron oxide, iron nitrate, iron thiocyanate, magnesium carbonate, magnesium chloride, magnesium oxide, magnesium phosphate, magnesium sulfate, magnesium phosphate, manganese oxide, manganese sulfate, manganese chloride, manganese fluoride, manganese phosphate, nickel carbonate, nickel chloride, nickel nitrate, nickel hydroxide, nickel oxide, nitric acid, perchloric acid, phosphorus pentabromide, phosphorus pentafluoride, phosphorus pentasulfide, phosphorus tribromide, phosphorus trifluoride, phosphorus triiodide, platinum chloride, potassium aluminum fluoride, potassium borate, potassium bromide, potassium calcium chloride, potassium nitrate, potassium perchlorate, potassium permanganate, potassium sulfate, potassium sulfide, silver chromate, silver nitrate, silver oxide, silver sulfate, silver sulfide, sodium aluminate, sodium borate, sodium bromate, sodium carbonate, sodium chloride, sodium bicarbonate, sodium hydrosulfide, sodium hydroxide, sodium hypochlorite, sodium manganite, sodium nitrate, sodium nitrite, sodium periodate, sodium persulfate, sodium phosphate, sodium sulfate, sodium sulfide, sodium thiocyanate, sulfur dioxide, sulfuric acid, tin chloride, titanium chloride, uranyl carbonate, zinc bromide, zinc carbonate, zinc chloride, zinc fluoride, zinc iodide, zinc oxide, zinc sulfate, zinc sulfide and others.

Nutrients in the buffer are chosen to maintain a microbial population in a productive state. As examples, the nutrient component may contain all or some of: nitrates, nitrites, ammonia, sulfate, sulfite, phosphate, carbonate, amino acids, sugars, peptone, casitone, vitamins, minerals, metals and other components that support microbial growth and metabolism. Nutrient concentrations may range from about 30 picgrams/L to about 300 grams/L; from about 1 micrograms/L to about 500 milligrams/L; from about 50 micrograms/L to about 30 milligrams/L and from 15 micrograms/L to about 5 milligrams/L.

The pigments, if used, may be electron donors and/or provide other roles. They absorb wavelength-specific light and reflect or transmit light at non-absorbed wavelengths. Pigments may enhance light energy capture; may reflect light to the surrounding environment within the vessel; may reflect light to a neighboring light harvesting antennae; may reflect light to a neighboring microbe; may transmit light to the surrounding environment within the vessel; may transmit light to a neighboring light harvesting antennae; may transmit light to a neighboring microbe; may subtract out (filter) one or more wavelength ranges of light; and/or serve other roles. As examples, pigments may be: metal pigments such as cadmium-, chromium-, cobalt-, nickel-, manganese-, iron-, titanium-, zinc-, copper-containing pigments and others; carbon-based pigments such as carbon black, ivory black, and others; clay earth pigments; ultramarine pigments; biological organic pigments such as indigo, Indian red, Tyrian purple, and others; and other biologic and synthetic pigments. In some embodiments, pigments may be absent from the buffer system. In some embodiments, pigments may be present in concentrations ranging from about 5% to about 90% weight/volume (w/v); from about 15% to about 70% (w/v); from about 25% to about 60% (w/v); from about 35% to about 50% (w/v) of the buffer system.

The buffer may include nutrients otherwise treated as waste. One such example is wastewater. Carbon-containing compounds in the wastewater may be used by microbes to produce electrons.

Electron Siphons

Electron siphons may contain electron-accepting moieties that accept electrons from other entities and transport such electrons by a conducting and/or semi-conducting structure. The electron siphons may possess one or more such electron-accepting moiety and may be capable of accepting one or more electrons concurrently. In certain embodiments, electron siphons contain membrane docking sites for the efficient siphoning of electrons from membrane-containing electron donors, which may be free entities or part of another structure such as light harvesting antennae; microbes; electron carrier proteins; and other moieties in or juxtaposed to membrane of a microbe; a membrane component; a vesicle; a chloroplast; a mitochondria or other. More generally, electron siphons may contain moieties to facilitate docking or simple contact with electron donors of any form.

The components of electron siphons may be made of material containing one or more electron carrier proteins, polymers, composites, alloys and mixtures of carbon, carbon, silicon, metals, colloidals, ceramic, copper, zinc, graphite, stainless steel, titanium oxide, pigments, light harvesting antennae, chloroplasts, mitochondria, electron carrier molecules, other electron recipient molecules, and combinations of any of these. In some contexts, the electron siphons may be viewed as both electron acceptors and as electron donors; they direct electron from donors in a buffer toward a current collector in a voltaic cell. In some embodiments, the electron siphons serve as an electron relay system between the initial electron donor and the current collector. Examples of electron siphon structural materials include carbon, electron carrier proteins, polymers, composites, alloys and mixtures of carbon, silica, metals, pigments, copper, zinc, stainless steel, titanium oxide and the like.

Electron siphons may contain amorphous, crystalline, or partially crystalline structures. The structures may have a thickness that is a single atom thick or multiple atoms thick. In some embodiments, electron siphons have a unitary form, while in other embodiments they are assembled, and sometimes assembled into a complex. Electron siphons may be shaped as tubes, wires, spirals, bristles, plates, shavings, dots, particles, spheres, sheets, membranes, mesh, webs, networks, and the like. The electron siphon formats may include a mixed population of two or more of these. Furthermore, each electron siphon may include one or more wire, thread, fiber, tube, dot, plate, particle or other element containing one or more carbon polymer, metal, metalloid, colloidal or other structure capable of electron transport. A population of electron siphons may include a population of: tube, wire, particle, dot, fiber, plate, network or other.

Multiple electron siphons may be grouped in a superstructure such as an array, a matrix, a suspension, one or more layer, a polymer, etc. With other elements of the voltaic cell such as the buffer, the siphons may assume many types structure such as a gel, a co-polymer, a paste, a semi-solid, and any other ordered or random arrangement.

Electron siphons have a size appropriate for their role (e.g., conducting electrons in the cell and/or accepting electrons from donors). Sometimes, they are sized to interface with electron donors. In some embodiments, the siphons are on the order of the cell size, or smaller, e.g., tens of microns down to nanometer scale. In some implementations, the siphons have an average diameter of about 1-20 nm (e.g., about 4-5 nm) and an average length of about 10-50 um (e.g., about 30 um). Siphons of this size can be arranged on the external surface of a microbe. In certain implementations employing synthetic siphons, the siphons may have diameters of about 2-10 nm. Assemblies of such siphons may have dimensions of about 50-100 nm. Examples of synthetic siphons include recombinant pilA polymers having 4-5 nm diameter and 30-80 um lengths. Other examples of synthetic siphons include quantum dots, quantum wires, quantum wells, nanotubes, nanowires, and the like. Electron siphons typically have dimensions on the order of nanometers, but other size scales such as micrometers and millimeters may be employed.

Examples structures that can be used for electron conducting nanostructures include nanoparticles, nanopowders, nanotubes, nanowires, nanorods, nanofibers, quantum dots, dendrimers, nanoclusters, nanocrystals, and nanocomposites. The structures can be made from any of various materials, including electron carrier proteins, polymers, composites, carbon (e.g., fullerenes), silicon, metal (e.g., copper), metal alloys (e.g., stainless steel), ceramic, titanium oxide, etc.

The electron siphons may have a uniform or non-uniform composition. In a purely uniform embodiment, the electron carrying component and electron accepting element are intimately mixed through the siphon. As an example of a non-uniform electron siphon, the structure contains a conductive rod as a support substrate and be uniformly coated with an electron accepting moiety and docking moiety. In another example, the docking and/or electron accepting moieties may be localized on one side or region of the conductive substrate. Such siphon structures may be produced by an orientation specific processing mechanism such as a process that aligns ferromagnetic rods (a collection of siphon support structures) in a common orientation during application of an electron accepting moiety and/or docking moiety.

Electron siphons may contain one or more component subunit whereby the component subunit is assembled with an electron donor. In some embodiments, an electron siphon subunit is connected to an electron donor. In some embodiments, electron siphon subunits are connected into a matrix or other assembly and connected to electron donors. In some embodiments, electron siphon subunits are individually connected to electron donors, the combination of which may then be connected to other electron siphons. As explained, electron siphons may contain a conductive or semi-conductive material to transport electrons accepted or coordinated with another structure of the siphon. An electron siphon may accept and coordinate one or more electron simultaneously in the presence of an electron donor. An electron siphon may donate one or more electron in the presence of an electron acceptor.

The propensity of an electron siphon to accept and coordinate one or more electron may, in part, determined by the potential energy required for the electron accepting or coordination moieties to receive an electron from a donor. The electron coordination moieties of the electron siphon may have overall negativity less than the electron donors. Electron siphons may contain overall negativity less than the electron donors and contain overall more negativity than the electron acceptors. Examples of electron coordination moieties include: arginine, lysine, poly-arginine, poly-lysine, ammonium, tetrabutylammonium, quinones, ubiquinones, biphenyls, 2,2'-bipyridines, azo groups, amine groups, $NO_2$ groups, CN groups, naphthalimide, [60] fullerenes, polythiophenes, terpyridine, imide groups, polyimide groups, derivative thereof, or other.

Electron coordination moieties may be conjugated to other components of an electron siphon by various coupling chemistries to yield a covalent bond between the electron siphon and the electron coordination moiety.

Electron siphons may be designed to dock with but not pierce (or otherwise lyse) microbes or membranes they interface with. The siphons may act as benign appendages that siphon electrons generated metabolically or photosynthetically. Electron siphons may contain a coupling moiety. Coupling moieties may have an affinity for an electron donor or a species containing an electron donor. Examples of coupling moieties include antibodies and components thereof (e.g., F(ab) and F(ab')2 fragments), protein domains, cholesterol, phosphoinositide, phospholipids, lipid A, lipopolysaccharide, mannan, lipoarabinomannan, lipoteichoic acid, pilin, PilA, and the like. In certain embodiments, the coupling moieties are conjugated to the electron siphon at one or more surface residues to enable formation of a covalent bond.

In certain embodiments, to dock with a membrane, the siphon may have a hydrophobic portion. However, the entire siphon structure should not be hydrophobic as this may cause the structure to pierce the membrane. Therefore, in certain embodiments, one portion of the siphon structure is hydrophobic and another portion is not hydrophobic. In some implementations, the non-hydrophobic portion of the siphon structure is charged, either positively charged or negatively charged. A positive charge may be employed to attract electrons from the electron transport components in the membrane to the siphon.

If the base siphon structure is hydrophilic (e.g., metal siphon structures), it need not be made positively charged. Instead, a portion is made hydrophobic to promote membrane docking. If the base siphon structure is hydrophobic (e.g., a carbon siphon structures), it needs no treatment to make it hydrophobic. Instead, it may be treated to make a portion of positively charged.

In certain embodiments, the electron siphon base structure is treated to give it an overall positive charge in a neutral buffer. This may be appropriate when the siphon is hydrophobic. Examples of hydrophobic siphon materials include carbon (e.g., carbon nanostructures), hydrophobic acrylics, amides, imides, carbonates, dienes, esters, ethers, fluorocarbons, olefins, styrenes, vinyl acetals, vinyl chlorides, vinylidene chlorides, vinyl esters, vinyl ethers, ketones, vinylpyridine polymers and vinylpyrrolidone polymers. Electron siphon materials may be covalently conjugated to ac-type cytochrome, arginine, polyarginine, lysine, polylysine, protamines, histones, iron (III), iron-sulfur clusters, and the like Electron siphon materials may have their surfaces with metal moieties such as cadmium, zinc, zirconium, molybdenum, manganese, magnesium, iron, platinum, copper, rhodium, osmium, iridium, and the like. Further, electron siphon materials may have their surfaces modified with other electron binding components having (i) an overall positive charge, (ii) electron-binding capabilities, and (iii) capability of neutralizing the toxic effects of conventional synthetic conductive materials (e.g., carbon nanotubes). Modification of synthetic electron conductive materials can be performed by conventional chemical conjugation techniques including click chemistry and chemical crosslinking involving nucleophilic attack and covalent bond formation between the conductive material and the positively-charged electron binding moiety. Other methods can include the use of UV irradiation to induce activation of a nucleophile to generate a covalent bond to form between the conductive material and the positively-charged electron binding moiety, also known as photo-crosslinking Generally, the modification covers only a portion of the siphon structure (e.g., just an end portion of it).

As mentioned, electron siphons can have a hydrophobic portion to facilitate interaction with a microbe, microbial membrane, vesicle, or other membrane derivative containing electron carrier components. If the base material is not hydrophobic, modification must produce a hydrophobic portion. Such hydrophobic portions can be generated by the covalent conjugation of sterols such as cholesterol, glycerol-ether lipids containing isoprenoid chains, cyclopropanes and cyclohexanes or glycerol-ester lipids such as lipid A, phosphatindylcholine, phosphatidylethanolamine, phosphatidylserine, phosphatidylinositol, sphingomyelin and phosphatidylglycerol. Examples of materials that may require hydrophobic treatment include metal nanostructures, metalloids, colloidals, composite nanostructures, hydrophilic polymers such as polysaccharides, polyamines, proteoglycans, antibodies and the like.

In one example, coupling of biologic and biochemical moieties to enable electron siphon activity and/or connectivity to one or more electron donor is achieved through acid-activation followed by adding carbodiimide, amidation, 1-ethyl-3-(3-dimethylaminopropyl) carbodiimide hydrochloride, N-hydroxysuccinimide, or other.

In some aspects, a microbial cell population is mixed with the electron siphon population. In some embodiments, the microbial cell population may be mixed with the electron siphon population at about a 1:1 ratio; at about a 1:2 ratio; at about a 1:3 ratio; at about a 1:4 ratio; at about a 1:5 ratio; at about a 1:6 ratio; at about a 1:7 ratio; at a 1:10 ratio and at about a 1:30 ratio.

In some embodiments, a light harvesting antennae population may be mixed with the electron siphon population. In some embodiments, the light harvesting antennae population may be mixed with the electron siphon population at about a 1:0.5 ratio; at about a 1:1 ratio; at about a 1:2 ratio; at about a 1:3 ratio; and at about a 1:4 ratio.

In some embodiments, the electron siphon population may be mixed with the microbial cell population and may be mixed with the light harvesting antennae population. The light harvesting antennae population may contain artificial and/or naturally occurring antennae that absorb light in wavelength ranges that complement the absorption pattern of the microbial cell population. In some embodiments, the electron siphon population may be mixed with the microbial cell population and may be mixed with light harvesting antennae population at about a 0.5:1:1 ratio; at about a 1:1:1 ratio; at about a 2:1:1 ratio; at about a 3:1:1 ratio; at about a 4:1:1 ratio; at about a 5:1:1 ratio; at about a 6:1:1 ratio; at about a 10:1:1 ratio; at about a 15:1:1 ratio; at about a 30:1:1 ratio; at about a 40:1:1 ratio; at about a 0.5:1:2 ratio; at about a 1:1:2 ratio; at about a 2:1:2 ratio; at about a 3:1:2 ratio; at about a 4:1:2 ratio; at about a 5:1:2 ratio; at about a 6:1:2 ratio; at about a 10:1:2 ratio; at about a 15:1:2 ratio; at about a 30:1:2 ratio; at about a 40:1:2 ratio; at about a 0.5:1:3 ratio; at about a 1:1:3 ratio; at about a 2:1:3 ratio; at about a 3:1:3 ratio; at about a 4:1:3 ratio; at about a 5:1:3 ratio; at about a 6:1:3 ratio; at about a 10:1:3 ratio; at about a 15:1:3 ratio; at about a 30:1:3 ratio; at about a 40:1:3 ratio; at about a 0.5:1:4 ratio; at about a 1:1:4 ratio; at about a 2:1:4 ratio; at about a 3:1:4 ratio; at about a 4:1:4 ratio; at about a 5:1:4 ratio; at about a 6:1:4 ratio; at about a 10:1:4 ratio; at about a 15:1:4 ratio; at about a 30:1:4 ratio; at about a 40:1:4 ratio; at about a 0.5:1:4 ratio; at about a 1:1:4 ratio; at about a 2:1:4 ratio; at about a 3:1:4 ratio; at about a 4:1:4 ratio; at about a 5:1:4 ratio; at about a 6:1:4 ratio; at about a 10:1:4 ratio; at about a 15:1:4 ratio; at about a 30:1:4 ratio; at about a 40:1:4 ratio; at about a 0.5:1:5 ratio; at about a 1:1:5 ratio; at about a 2:1:5 ratio; at about a 3:1:5 ratio; at about a 4:1:5 ratio; at about a 5:1:5 ratio; at about a 6:1:5 ratio; at about a 10:1:5 ratio; at about a 15:1:5 ratio; at about a 30:1:5 ratio; at about a 40:1:5 ratio; at about a 1:1:5 ratio; at about a 2:1:5 ratio; at about a 3:1:5 ratio; at about a 4:1:5 ratio; at about a 5:1:5 ratio; at about a 6:1:5 ratio; at about a 10:1:5 ratio; at about a 15:1:5 ratio; at about a 30:1:5 ratio; at about a 40:1:5 ratio; at about a 1:1:6 ratio; at about a 2:1:6 ratio; at about a 3:1:6 ratio; at about a 4:1:6 ratio; at about a 5:1:6 ratio; at about a 6:1:6 ratio; at about a 10:1:6 ratio; at about a 15:1:6 ratio; at about a 30:1:6 ratio; at about a 40:1:6 ratio; at about a 2:1:7 ratio; at about a 3:1:7 ratio; at about a 4:1:7 ratio; at about a 5:1:7 ratio; at about a 6:1:7 ratio; at about a 10:1:7 ratio; at about a 15:1:7 ratio; at about a 30:1:7 ratio; at about a 40:1:7 ratio; at about a 2:1:8 ratio; at about a 3:1:8 ratio; at about a 4:1:8 ratio; at about a 5:1:8 ratio; at about a 6:1:8 ratio; at about a 10:1:8 ratio; at about a 15:1:8 ratio; at about a 30:1:8 ratio; at about a 40:1:8 ratio; at about a 2:1:9 ratio; at about a 3:1:9 ratio; at about a 4:1:9 ratio; at about a 5:1:9 ratio; at about a 6:1:9 ratio; at about a 10:1:9 ratio; at about a 15:1:9 ratio; at about a 30:1:9 ratio; at about a 40:1:9 ratio; at about a 2:1:10 ratio; at about a 3:1:10 ratio; at about a 4:1:10 ratio; at about a 5:1:10 ratio; at about a 6:1:10 ratio; at about a 10:1:10 ratio; at about a 15:1:10 ratio; at about a 30:1:10 ratio; at about a 40:1:10 ratio; and up to about a 40:1:20 ratio.

The electron siphons may be positioned directly adjacent to the light-harvesting antennae component of the disclosed embodiments. Further, the electron siphons of the disclosed embodiments can be positioned directly adjacent to an electron carrier component for the scavenging of free electrons generated by photon-mediated excitement of the light-harvesting antennae component population. Electron siphons can be positioned along the surface of a microbe, a microbe-derived membrane component or a vesicle with embedded light-harvesting antennae components.

The above treatments modify the electron siphons in a manner to maintain the photo-activity of a microbe or microbe-derived membrane component when positioned directly adjacently (i.e., docked, buried or bound (e.g., in an antibody-antigen immune complex) or other). Further, the metabolic activity of a microbe and the electron transport capabilities of electron carrier components in a microbial membrane may be preserved when such electron siphons are docked.

Further, disclosed is a bio-safe modified nanostructure unit for electron scavenging directly from a light-harvesting antennae component to enable directional electron flow across a nano-scale unit. Further disclosed is a population of the bio-safe modified nano-scale units for electron scavenging directly from a light-harvesting antennae component population to enable directional electron flow across the population of modified nano-scale components.

In some embodiments, electron siphons may include an electrically conducting or semi-conducting material linked (e.g., covalently) to positively-charged electron acceptor molecules capable of contacting a microbial membrane having one or more light harvesting antennae. The positively-charged electron acceptor molecules of the disclosed embodiments may include: arginine, lysine, poly-arginine, poly-lysine, thermo-stable electron carrier protein or derivative thereof, or other.

The vessel can be fabricated in a manner to generate a layer of light-harvesting antennae component population juxtaposed to the glass panel, which is juxtaposed to a layer of modified conductive nano-scale components, which is juxtaposed to the electron flow conduit plate, which is juxtaposed to the insulating injection-molded polymeric side-wall and backing unit. The modified conductive nano-scale components can apply to the electron flow conduit plate by spraying, rolling, and printing. In some embodiments, applying a pre-mixed solution includes: a light-harvesting antennae component population and a modified conductive nano-scale components, where the solution is the pH-buffered electrolyte solution of the disclosed embodiments directly to the electron flow conduit plate of a light conversion system.

Figure 3:
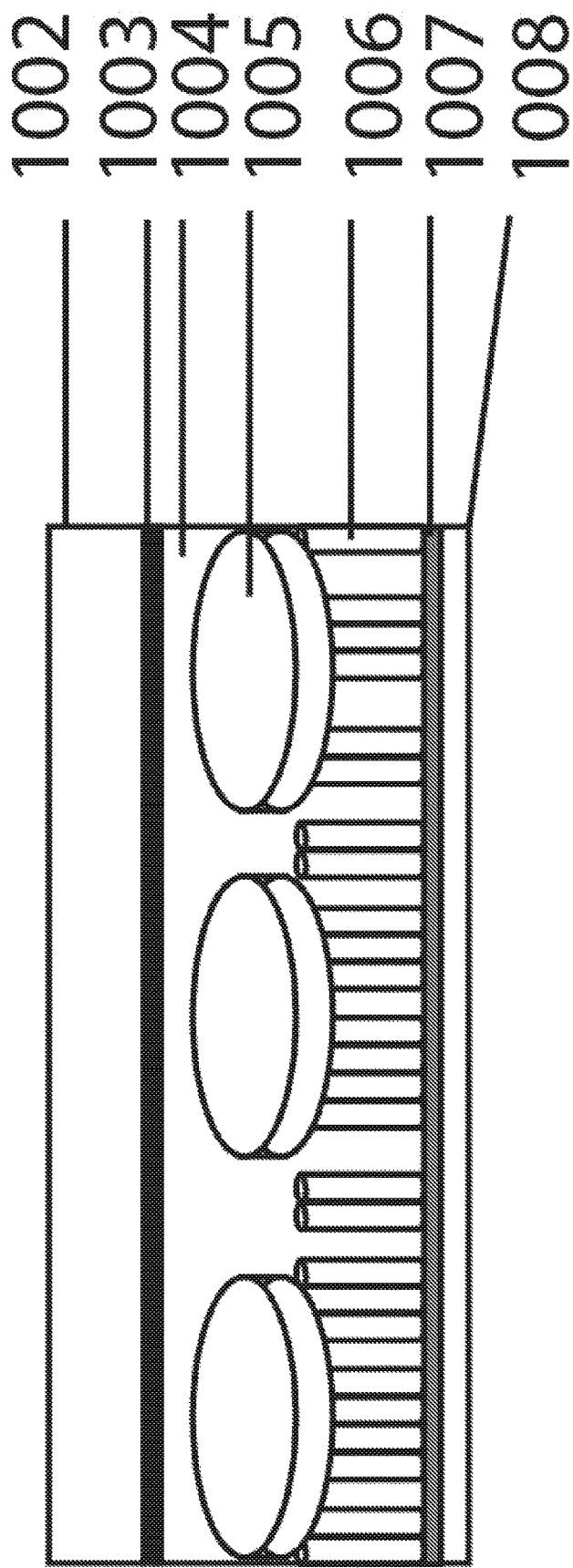
FIGS. 3 and 4 depict light-conversion systems employing electron siphons.

A light-conversion system of an embodiment includes: tempered glass top plate (FIG. 3, 1002) built to withstand large temperature ranges and optimized for light penetration with minimal refractive properties; one or more UV-resistant gasket (1003) to generate a leak-proof sealant around the glass top to prevent loss of the electrolyte-buffered solution (1004); a light-harvesting antennae component population in an orientation to maximize light-absorptive efficiency (1005); that are juxtaposed to a layer of conductive nanomaterial (1006) to maximize photon-excited electron scavenging and funneling away from the light-harvesting antennae population towards a conductive back-plate (e.g., a current collector), which then directs current to an external circuit (1007). In the depicted embodiment, a major portion of the light conversion system has an enclosure of injection-molded polymeric insulating side walls and backing frame (1008) containing one or more access port to enable access to the electrolyte buffer solution, light-harvesting antennae component population and conductive nano-scale components contained within the insulating walls.

Figure 4:
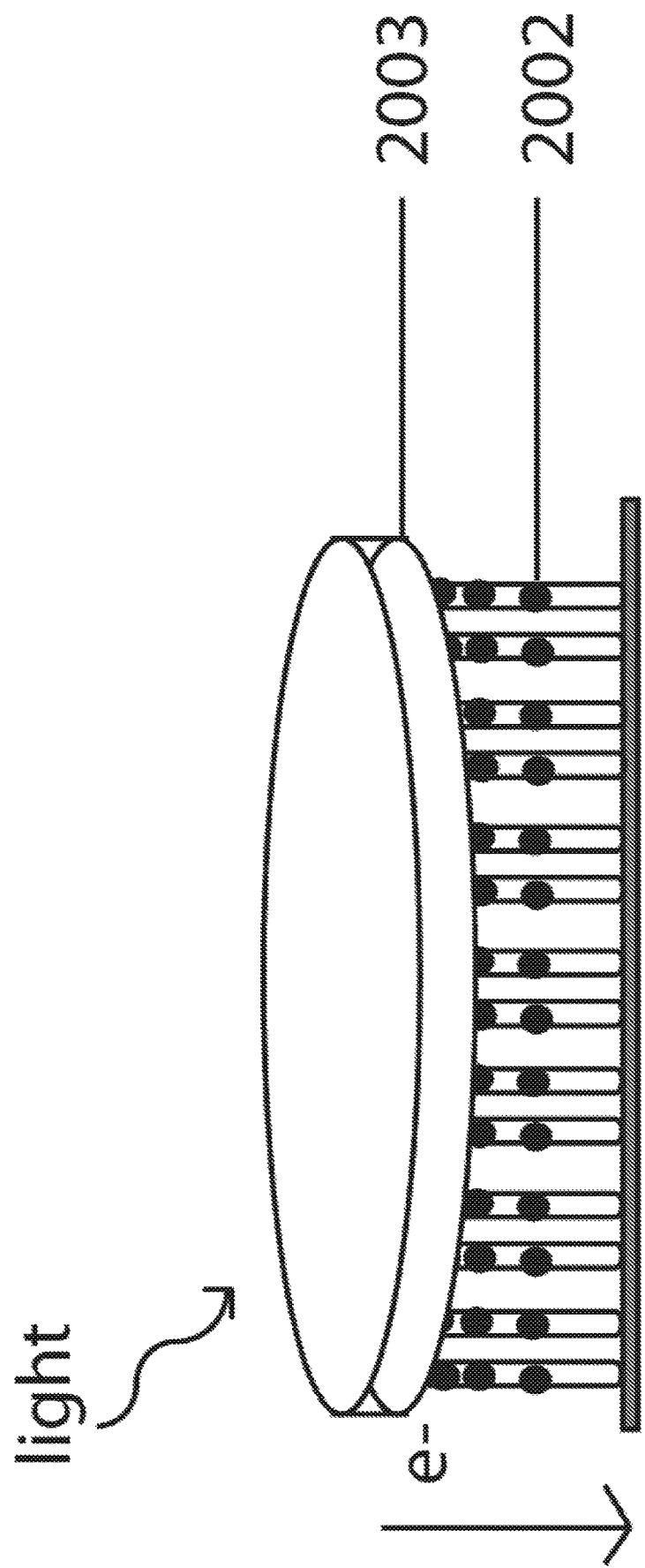

Additionally, presented herein is the use of bio-safe modified nano-scale components (FIG. 4, 2002) to scavenge the excited electrons generated from light-mediated electron excitation on a light-harvesting antennae molecule through the direct contact of the nano-scale components to the light-harvesting antennae component population (2003).

In some embodiments, microbes may be selected to possess or induced to create electron conducting nanostructures to remove excess electrons (produced photosynthetically or metabolically). Such structures are anatomical extensions of microbes. Such structures can be: fibrils, pili, secretion systems (types I, II, III, and IV) and exosomes. Compositions of such structures can include protein, proteoglycan, liposomal, lipopolysaccharide. In certain embodiments, such microbial nanostructures couple directly to an electronically conductive anode or conductive network attached to the anode. The structures can be induced by adding: exposure to light (increased intensity, through lenses), exposure to nutrients or upregulation of the genes encoding the gene products involved in generating the anatomical extensions through genetic engineering approaches.

Electron Siphon Matrix

In some embodiments, a voltaic cell may contain one or more electron siphon matrixes. A matrix may contain an array of electron siphon subunits arranged into a network or polymer. The network or polymeric matrix may be fabricated through the covalent coupling of subunits and through the electrostatic interaction of subunits.

In some embodiments, a microbial cell population is directly conjugated to the electron siphon matrix. In some embodiments, a microbial cell population is directly absorbed onto the electron siphon matrix. In some embodiments, a light harvesting antennae population is directly conjugated to the electron siphon matrix. In some embodiments, a light harvesting antennae population is directly absorbed onto the electron siphon matrix. In some embodiments, a microbial cell population and a light harvesting antennae population are directly conjugated to the electron siphon matrix. In some embodiments, a microbial cell population and a light harvesting antennae population are absorbed to the electron siphon matrix.

In some embodiments, an additional electron conductive material is directly conjugated to the electron siphon matrix.

In some embodiments, electron conductive material is directly absorbed to the electron siphon matrix. In some embodiments, electron conductive material is separated from the electron siphon matrix by a semi-permeable barrier.

Electron Siphon and Voltaic Cell Arrangements

Arrangement 1. Electron Siphons and Electron Donor Population Arrangement.

Figure 6:
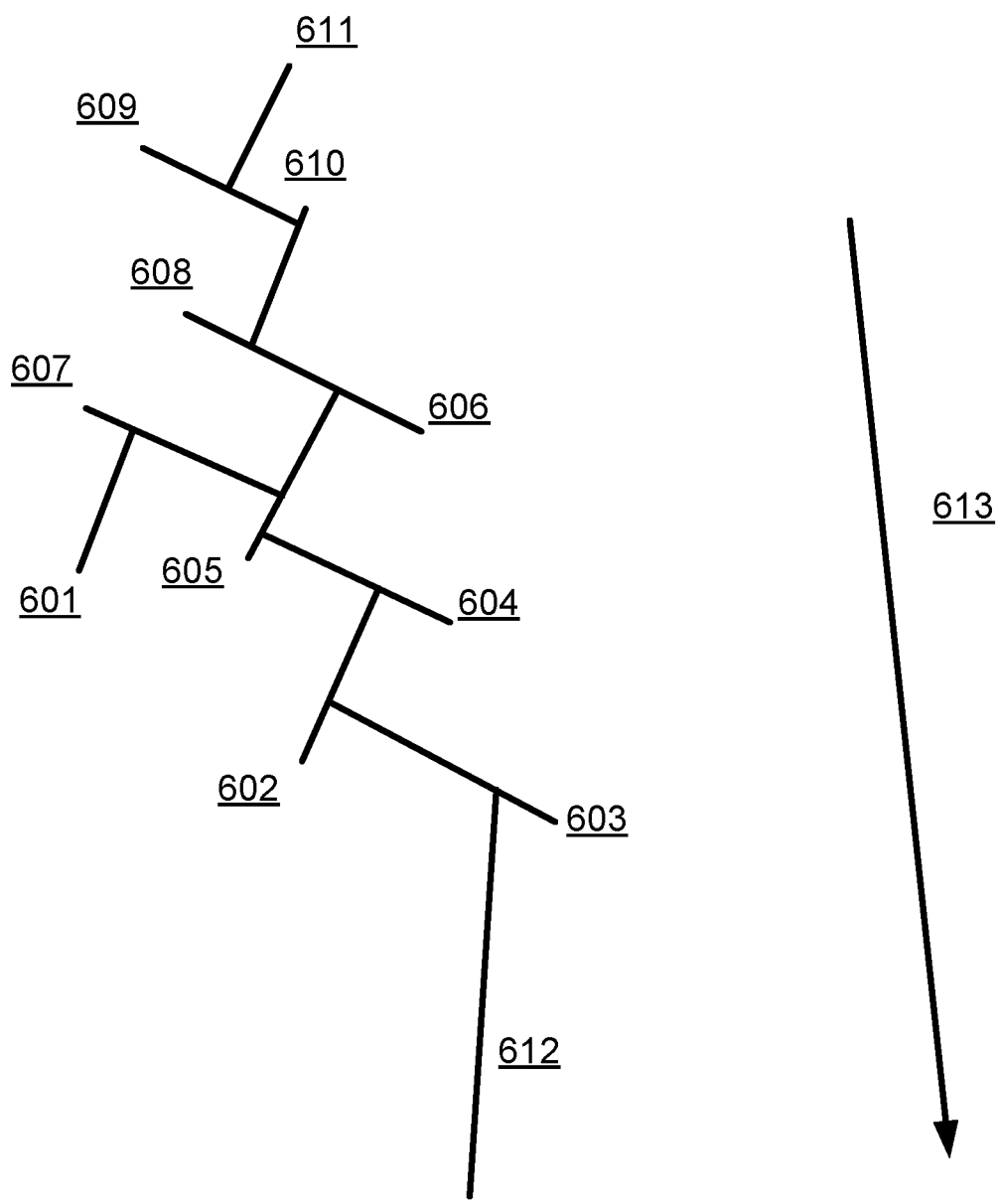
FIG. 6 presents a schematic of electron siphons and electron donor population arrangement.

In some examples, electrons originating from members of the electron donor population in a voltaic cell may be excited into a higher energy state by photon energy passage into the voltaic cell. In some examples, electrons originating from members of the electron donor population in a voltaic cell may be generated by the hydrolysis of covalent bond energy in a biochemical reaction. In some examples, the electron donor population may contain light harvesting antennae. In some examples, the electron donor population may contain pigments. In some examples, the electron donor population may contain microbial cells. Electron(s) originating from members of the electron donor population (FIGS. 6, 601 to 611) may be captured by members of the electron siphon population (FIG. 6, 612). The electron siphon population channels electrons toward a current collector or electronically conductive portion of the voltaic cell, which provides the electrons to an external load. Electrons captured from the electron donor population flow in a direction (FIG. 6, 613). The direction of electron flow, also referred to as a current, may be established within a voltaic cell by an electrical potential difference generated spontaneously within the voltaic cell and may be optionally facilitated by an external device establishing polarity within the voltaic cell. The direction of current may be generated, in part, by the arrangement of electron siphon population in the voltaic cell. Direction of the current may further be influenced by an applied electrical potential across a voltaic cell. Electron siphons may be arranged in a manner whereby various electron siphons may directly connect a second electron siphon and whereby a first electron siphon may accept an electron from an electron donor and whereby a second electron siphon may be connected to a second electron siphon.

Arrangement 2. A Second Arrangement of Electron Siphons and Microbial Cell Population.

Figure 7:
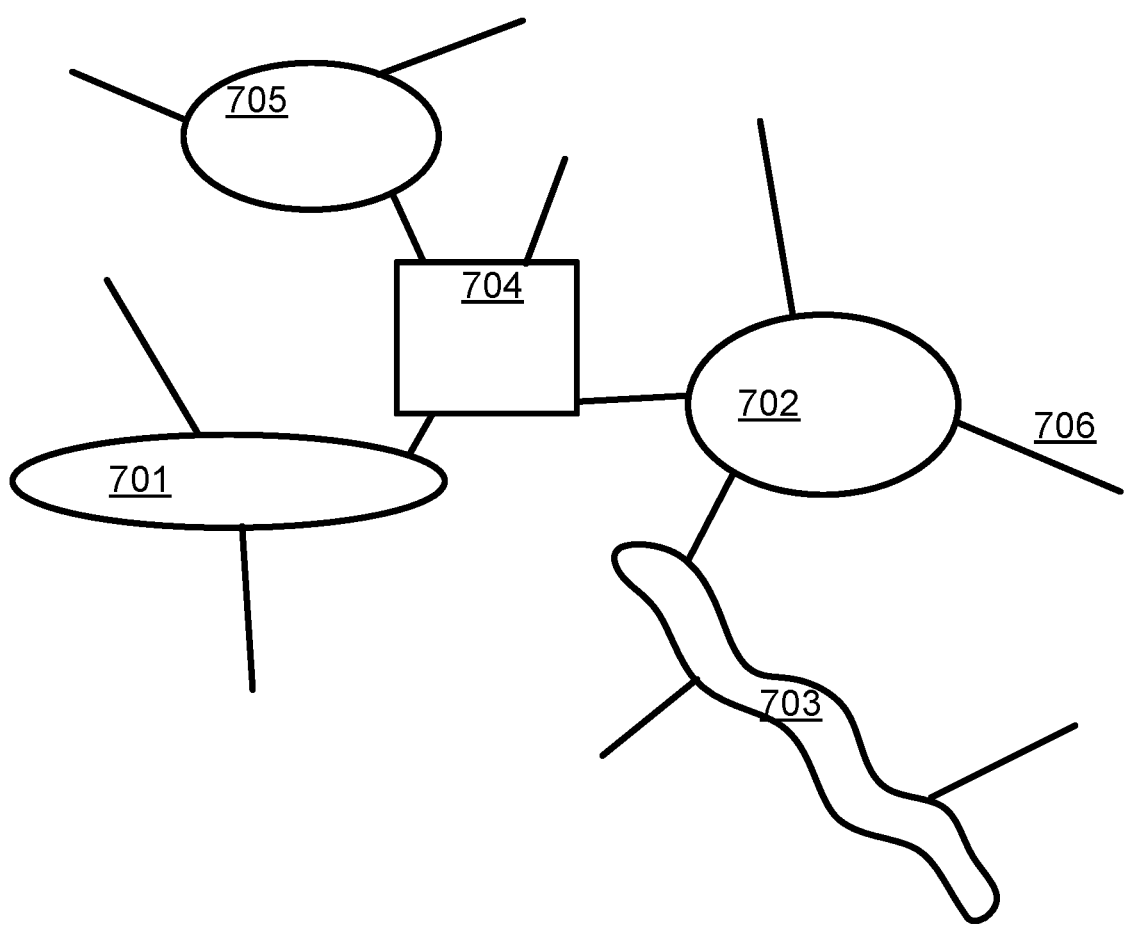
FIG. 7 presents a schematic of a second arrangement of electron siphons and microbial cell population.

In some examples, a simple arrangement of a mixture of electron siphons (FIG. 7, 706) and a mixture of members of the electron donor population (FIGS. 7, 701 to 705) may be placed in a voltaic cell. Electron donors of the electron donor population may contain microbes, pigments, light harvesting antennae or other. Electron siphons of the electron siphon population may contain conductive nanoparticles, conductive nanowires, conductive nanotubes, conductive mesh, conductive plate, and/or other elements. Electrons generated by the electron donor may be siphoned by the electron siphon through a transfer event of the electron from the donor to the siphon (may also be an intermediate electron recipient). Electron siphons may be arranged in a manner whereby various electron siphons may be arranged juxtaposed to one or more electron donor. Electron siphons may be arranged in a manner whereby one or more electron siphon may directly connect one or more electron donor and accept an electron from the electron donor. One or more electron donors serve as nodes or path elements in an electron conductive pathway from donors to a current collector of a voltaic cell.

Arrangement 3. Arrangements of Several Electron Siphons.

Figure 8:
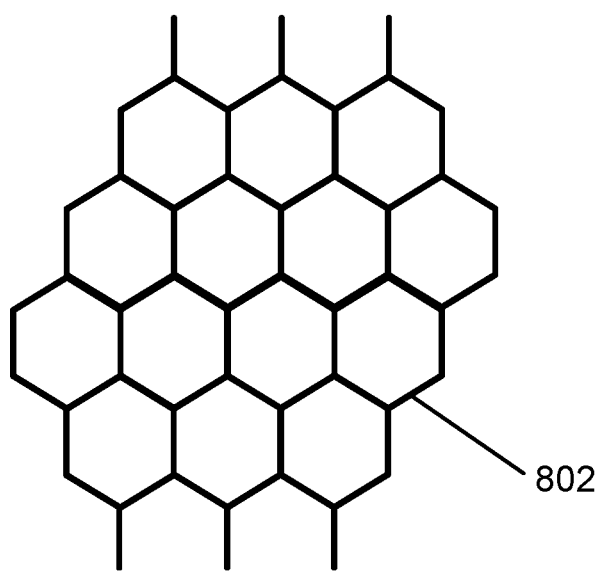
FIG. 8 presents examples of several electron siphons.
Figure 8:
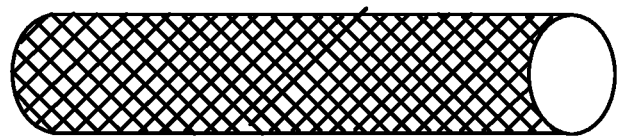
Figure 8:
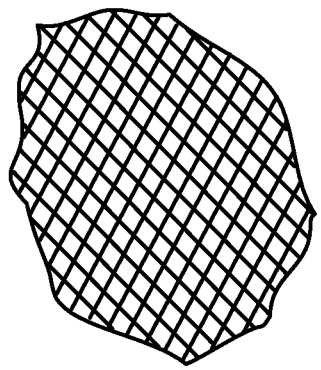

In some examples, a polymer of carbon (FIG. 8 (A-C)) may be the conductive material in an electron siphon. This form of carbon polymer may contain a sheet, membrane, mesh, plate, fiber, tube, wire, dot, particle or other. In some examples, an electron siphon may contain a nanotube, a nanowire, a nanofiber, a nanoparticle or other (FIG. 8A, 802). In some examples, an electron siphon may contain a hollow tube, a wire, a fibril, a fiber, a braid or other (FIG. 8B). In some examples, an electron siphon may contain a dot, nanoparticle, microparticle, sphere, spheroid, polyhedron, a hollow polyhedron or other (FIG. 8C). Modification of the electron siphons may be made using conventional activation techniques such as acid activation, which may generate reactive chemical moieties on one or more residue of the electron siphon. Additional modifications may be generated in the presence of NHS, sulfo-NHS, EDC, BMPH or other linkers.

Arrangement 4. Varied Array of Electron Siphons.

Figure 9:
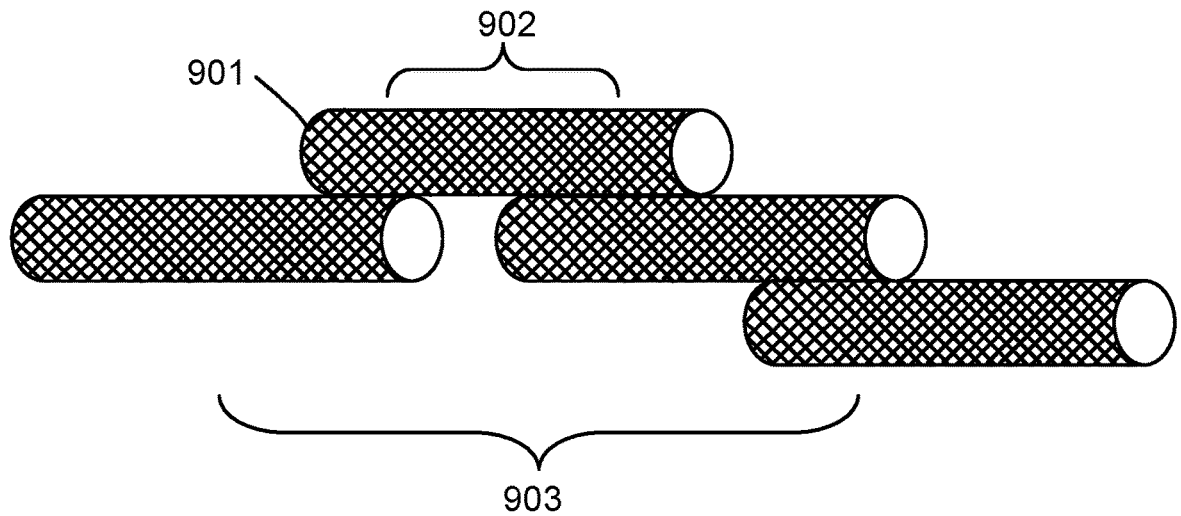
FIG. 9 presents a schematic of a varied array of electron siphons.
Figure 9:
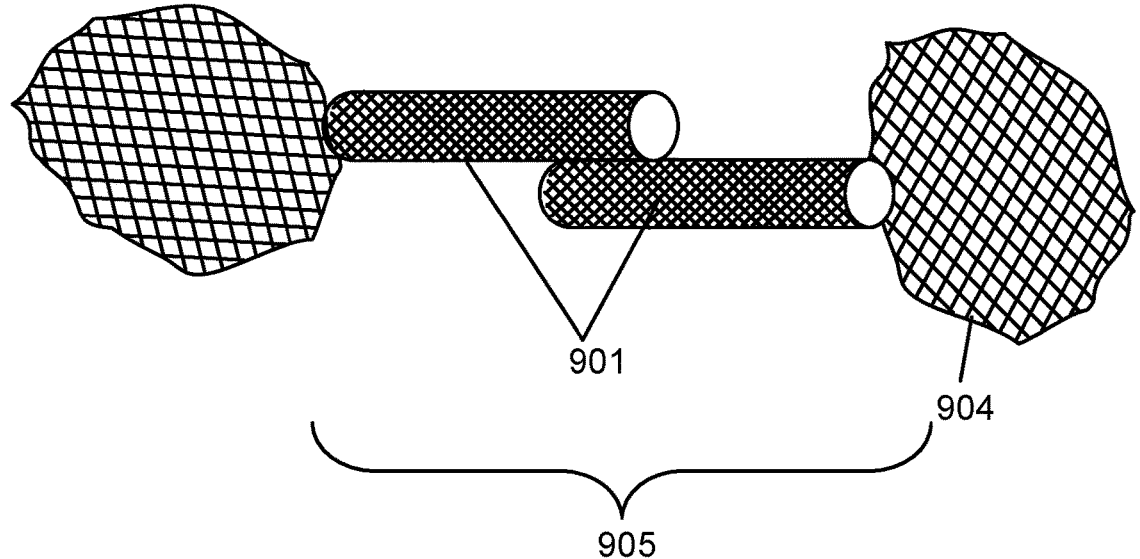

Electron siphons may be conductive or semi-conductive in nature and may be arranged in a manner to promote the travel of electron from one end of the array to the other. Arrangement of electron siphons may be manipulated by natural properties such as Van der Waals forces or may be manipulated by synthetic means such as covalent coupling of electron siphons into an array. In one example, a homogeneous collection of electron siphons (FIG. 9A, 903) may be arrayed, whereby an electron siphon (901) may be in contact with a second electron siphon in the array (903). In certain embodiments, the electron siphons contain modifications (902) to promote a linkage between adjacent electron siphons in the array, to promote the transport of electrons, to promote docking to an electron donor, to serve as a docking site for electron conductive material or other. Sometimes, the linkage is on the order of about 0 to 2 Angstroms. In another example, a heterogeneous array of electron siphons (FIG. 9B, 905) is arrayed in a manner whereby an electron siphon type (901) having distinct electron siphon properties may be combined with a second electron siphon type (904) having different electron siphon properties to generate an array of electron siphons which promote the effective acceptance and transfer of electrons from a heterogeneous electron donor population. These types of arrays may serve various functions and depend on the presence of various modifications. In some examples, modifications may contain direct conjugation: of a positively charged moiety such as but not limited to a positively charged amino acid, cationic lipid, cation, or other; of a neutrally charged moiety such as but not limited to hydrophobic agents, Zwitterions or other; of dipolar molecules such as nitrones, 1,2-dipole, 1,3-dipole, amine oxides or others; of binding molecules such as antibodies, receptors, ligands, NAD+, NADP+, FAD, FMN, FeS clusters, heme, coenzyme Q or others; and of enzymes such as the oxygen-evolving complex, oxidoreductase, or other.

Arrangements 5. Use of Electron Siphon to Capture Electrons Generated From Metabolic Processes.

The movement of ions across a membrane depends on two factors: (i) the diffusion force caused by an established concentration gradient of chemical species, including ions, and (ii) the electrostatic force, caused by the electrical potential gradient, whereby cations (for example, protons ($H^+$)) diffuse down the electrical potential and anions (for example, OH) tend to diffuse in the opposite direction. These two gradients taken together may be expressed as an electrochemical gradient. In biological cells and liposomes the lipid layer may act as a barrier for ion passage. Potential energy may result from the buildup of an electrochemical differential across a lipid layer and this energy may be stored for use. In biological cellular membranes, protons flow in an active transport manner to set up a pH and electric charge differential across a membrane. It may be described as the measure of the potential energy stored as a combination of proton and voltage gradients across a membrane (differences in proton concentration and electrical potential). The electrical gradient is a consequence of the charge separation across the membrane (when the protons $H^+$ move without a counterion, such as chloride $Cl^-$). In biological systems, the electrochemical gradient often serves as the proton motive force (PMF).

In some examples, an electron donor is a microbial cell. Usually of a microbial cell, a PMF is generated by an electron transport chain in the microbial cell membrane (FIG. 5), which acts as a proton pump, using the energy of electrons from an oxidation event of a reduced electron carrier (FIG. 5) generating an oxidized electron carrier (FIG. 10A, 1004) to pump protons (hydrogen ions, FIG. 10A, 1006) out across the membrane into the environment (FIG. 10A, environmental electron, 1009; environment, 1007), separating the charges across the membrane to generate a distinct electron (1005), which may re-enter the microbial cell (1008) into the cell for energetic reactions (1002).

In some examples, an electron donor is a mitochondria, and energy released by the electron transport chain is used to move protons from the mitochondrial matrix to the inter-membrane space of the mitochondrion. Moving the protons out of the mitochondrion creates a lower concentration of positively charged protons inside it, resulting in a slight negative charge on the inside of the membrane. The electrical potential gradient is about −170 mV. In mitochondria, the PMF is almost entirely made up of the electrical component, but in chloroplasts, the PMF is made up mostly of the pH gradient because the charge of protons $H^+$ is neutralized by the movement of $Cl^-$ and other anions. In either case, the PMF must be about 50 kJ/mol for the ATP synthase to make ATP.

Figure 10:
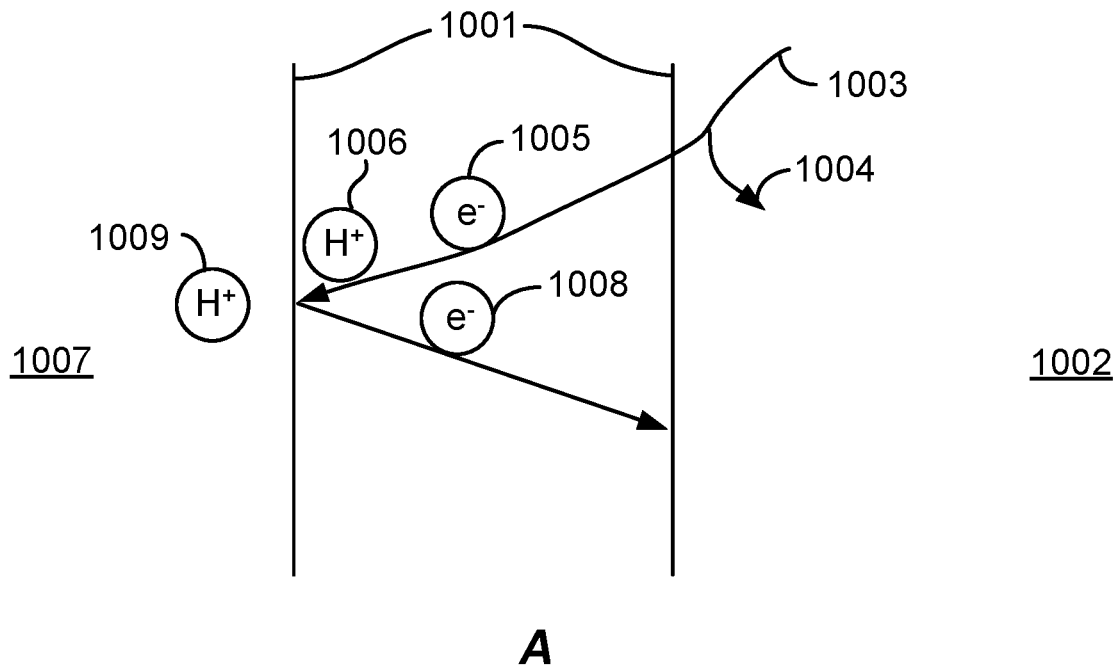
FIG. 10 shows the use of electron siphon to capture electrons generated from metabolic processes.
Figure 10:
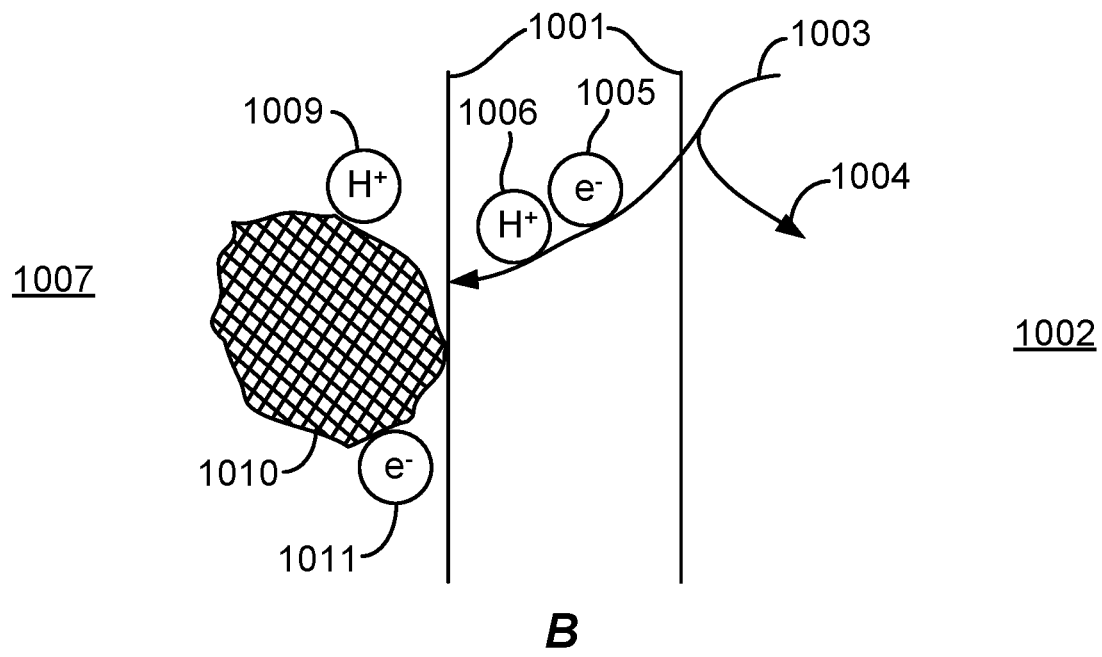

In one example, an electron siphon (FIG. 10B, 1010) may contact the exterior surface of a membrane hosting an electron transport chain (FIG. 10B, 1001). The electron transport chain is fed electrons and protons from biochemical and/or photochemical reactions by reduced electron carriers (FIG. 10B, 1003), which may be oxidized (1004) by members of the electron transport chain in the membrane. The separation of the electron (1005) from the proton (1006) may occur in an intra-membrane manner The proton may be expelled (1009) in a conventional manner into the environment (1007). The electron (1011) may be captured by an electron siphon (1010) when the electron siphon may be next to, in contact with, may be covalently linked to or may be embedded within the membrane (1001).

Arrangement 6. Use of Electron Siphon to Capture Electrons Generated From Liposomes.

Figure 11:
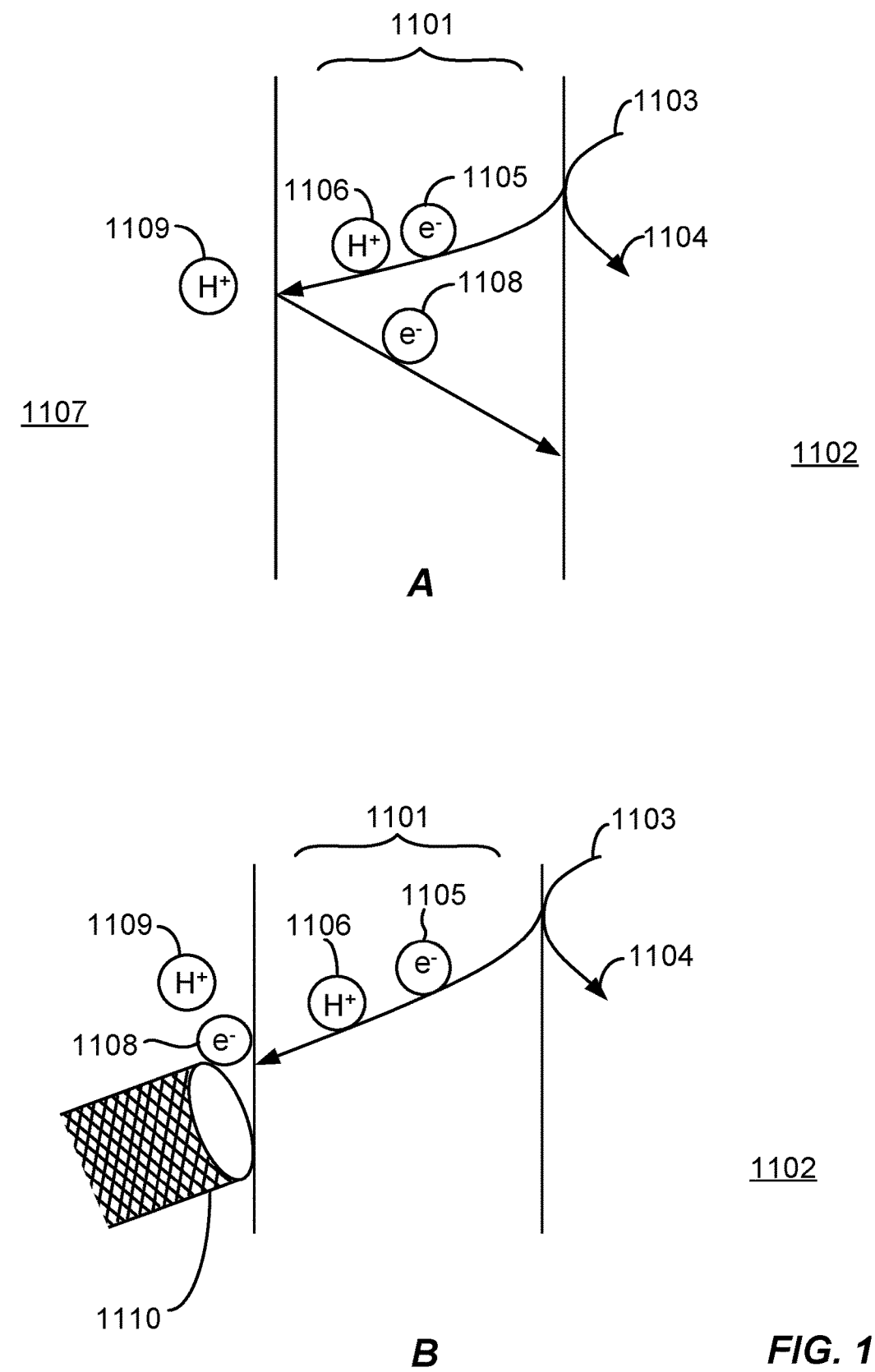
FIG. 11 shows the use of electron siphon to capture electrons generated from liposomes.

A light-harvesting liposome containing light harvesting agents such as pigments, light harvesting antennae, and reduced and oxidized electron carriers, respectively (FIG. 11A, 1103 and 1104) on the inside of the liposome and components of an electron transport chain in the liposome membrane (FIG. 11A, 1101) may serve as an electron donor. Capture of light energy and subsequent translation of the energy into the form of a high energy electron may enable the electron to be captured by an electron carrier (FIG. 11A, 1103), which may then transfer the electron to the electron transport chain (FIG. 11A, 1101) to regenerate an oxidized electron carrier (FIG. 11A, 1104). The agents of the electron transport chain may be capable of separating a proton (FIG. 11A, 1106) and an electron (FIG. 11A, 1105). Under these conditions, the liposome may not transmit an electron to the environment (FIG. 11A, 1108) and the electron will be directed intravesicularly. In the presence of an electron siphon (FIG. 11B, 1110) may contact the exterior surface of a liposomal membrane containing an electron transport chain (FIG. 11B, 1101). The electron siphon may be used to re-direct the path of the electron in an electron transport chain and may promote capture of the electron (FIG. 11B, 1111).

Arrangement 7. Side View of a Voltaic Cell.

Figure 12:
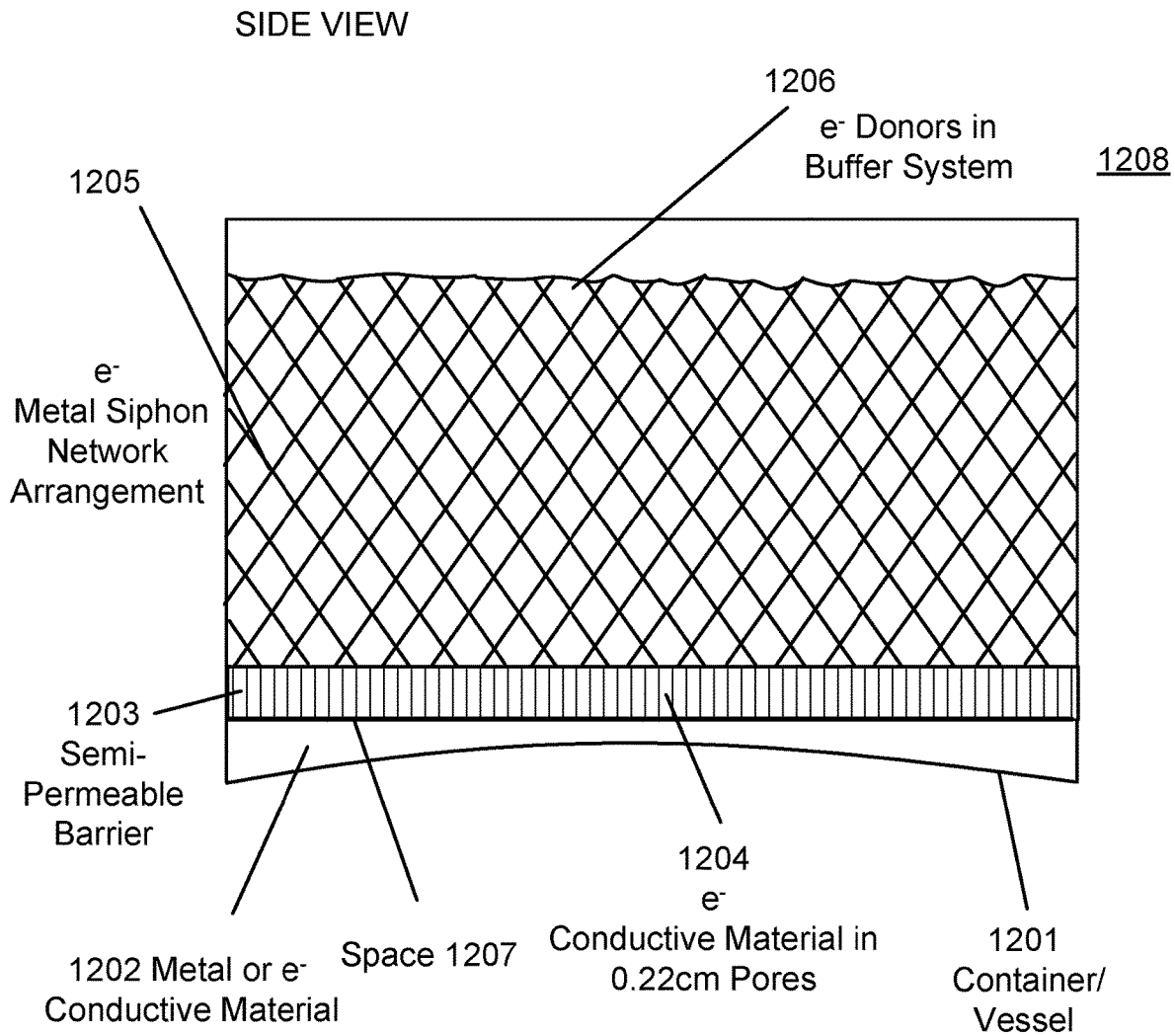
FIG. 12 presents a side view of a voltaic cell.

In this example, a voltaic cell includes a vessel (FIG. 12, 1201) containing an electron conductive material (1202) on one or more surfaces of the vessel. The vessel may further contain a semi-permeable membrane (1203) to serve as a discriminative barrier between the electron conductive material (1202) and a different electron conductive material capable of contacting one or more electron donor (1206). A space (1207) ranging from 2 Angstroms to 50 cm may exist between the semi-permeable membrane (1202) and a current collector (1204). Electronically conductive features penetrate space (1207) to permit conduction of electrons from membrane (1202) to current collector (1204). A buffer or other ionically conductive medium may be present in the space. The vessel may further include an arrangement of electron siphons (1205) which may contact electron donors and may contact a buffer system (1208).

Arrangement 8. Voltaic Cell Tube.

Figure 13:
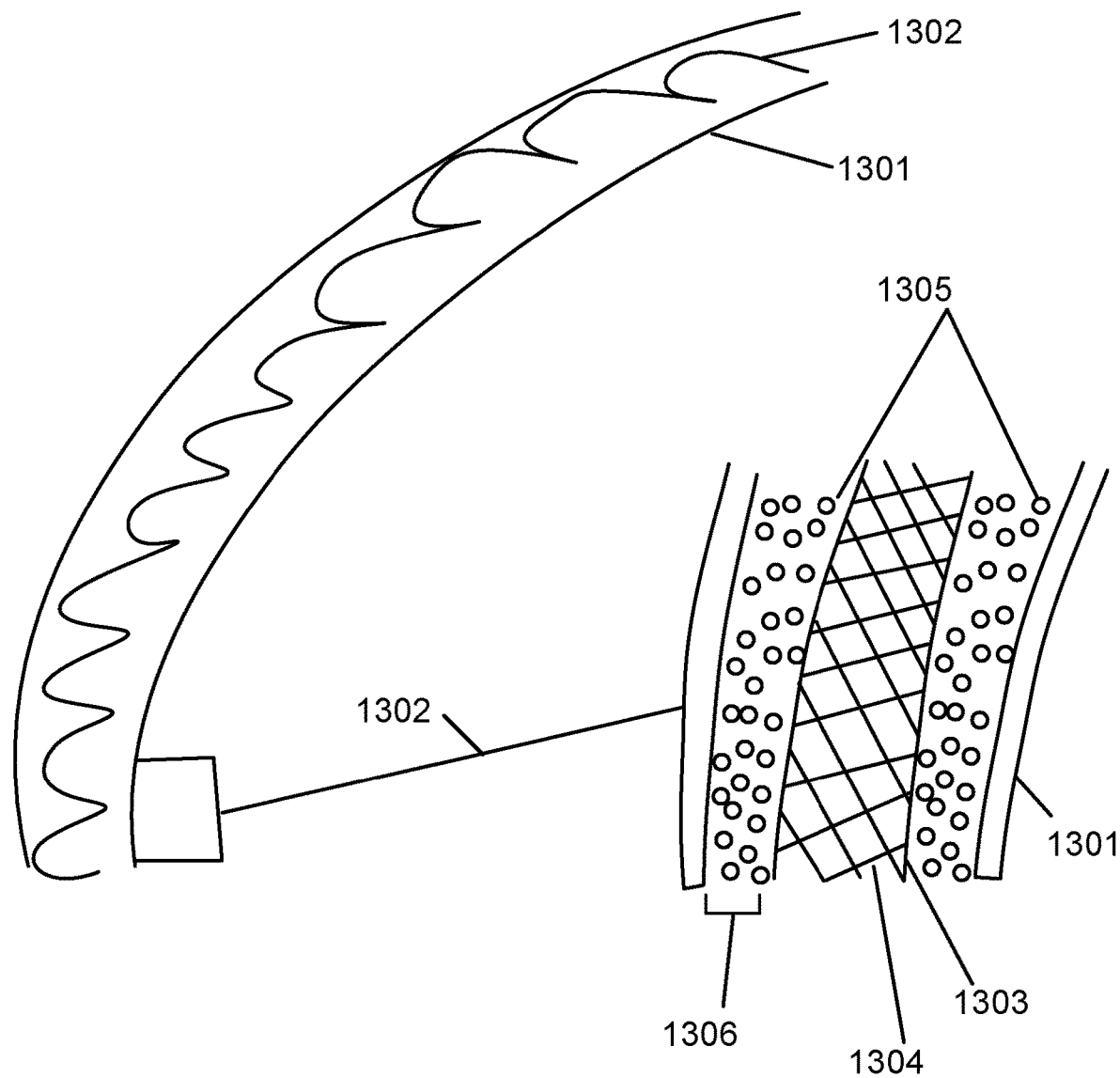
FIG. 13 presents a schematic of a voltaic tube.

In one example, a flexible transparent tube (FIG. 13, 1301) may contain a voltaic cell (1302) containing electron conductive material (1304) that may be separated by a semi-permeable membrane (1303) from the electron donor population (1305) to generate an chemoelectric potential across a membrane. In this embodiment, the tube serves as the voltaic cell vessel and serves as a conduit for flowing buffer solution. The tubular vessel may be wrapped or otherwise conformed to the shape of a pole or other structure associated with the voltaic cell.

Arrangement 9. Voltaic Cell Pillars.

Figure 14:
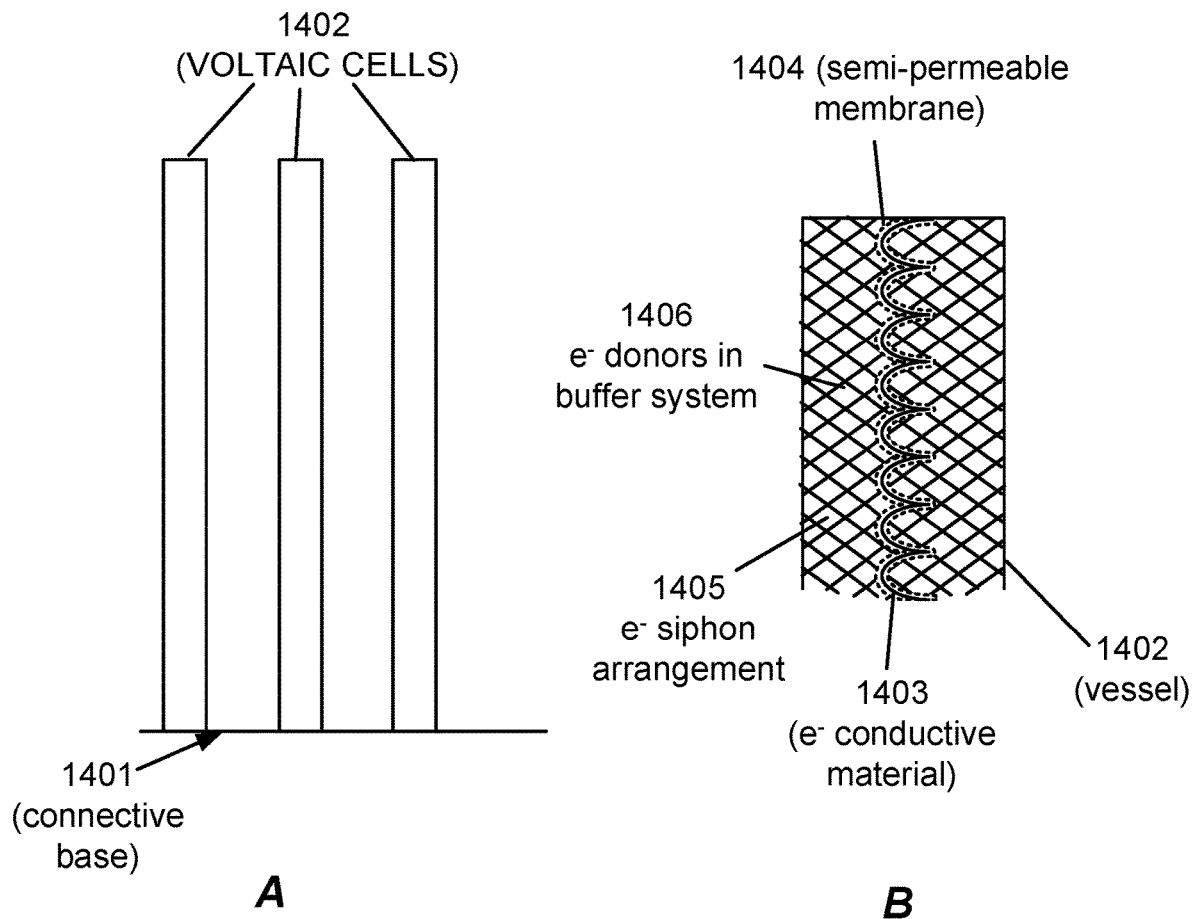
FIG. 14 presents a schematic of voltaic cell pillars.

In this example, voltaic cells (FIG. 14, 1402) are arranged on an electron conductive base (1401). The voltaic cells may each include a transparent vessel, each vessel in a pillar or other vertical structure. Each vessel may contain electron donor population (1406) mixed with an electron siphon arrangement (1405) surrounding the electron conductive material (1403). There may be a semi-permeable membrane (1404) surrounding the electron conductive material (1403) to promote an chemoelectric potential across a membrane.

Arrangement 10. Arrangement of Circuit Connectivity in a Voltaic Cell.

Figure 15:
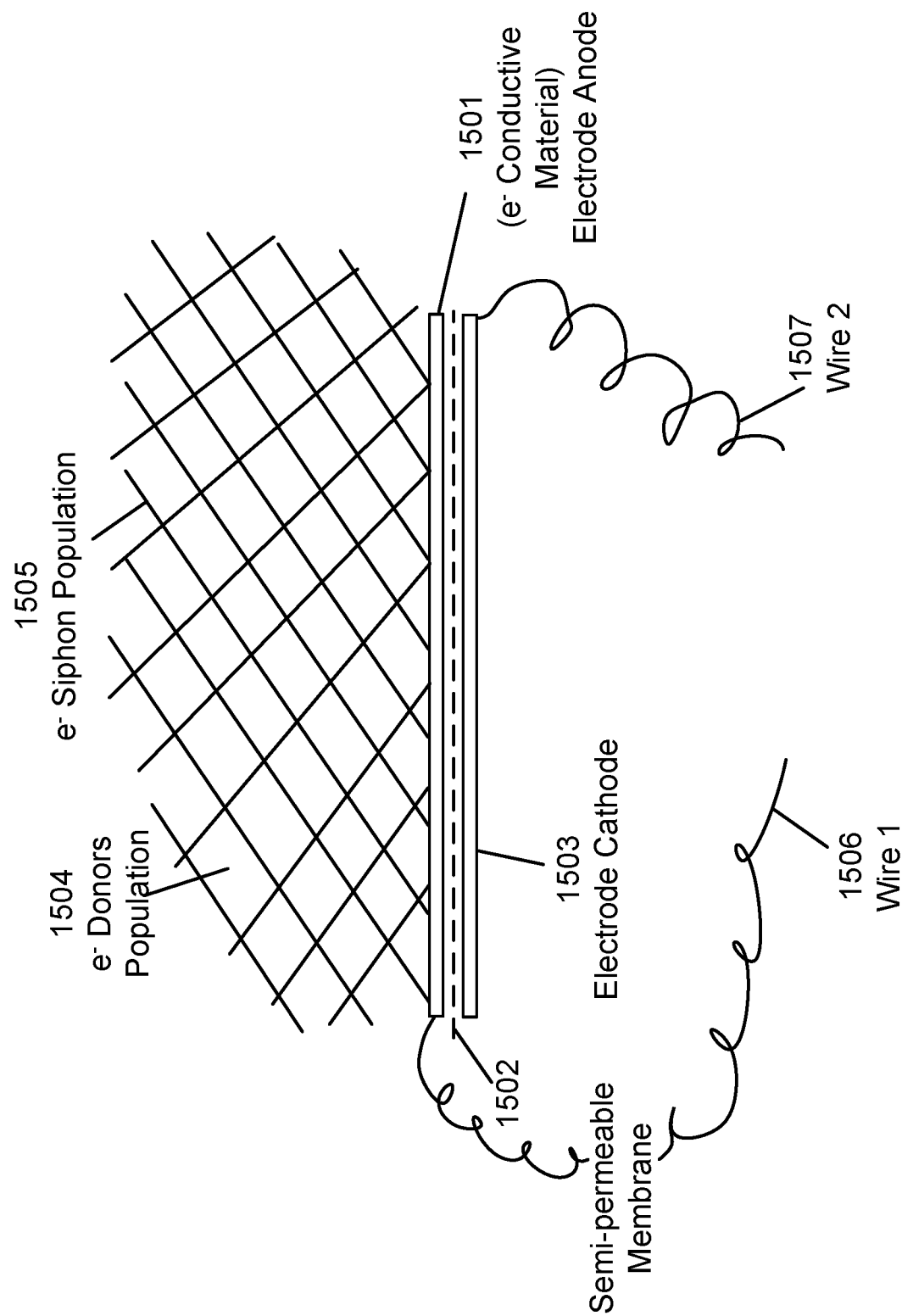
FIG. 15 presents an arrangement of circuit connectivity in a voltaic cell.

In one example, a voltaic cell may contain an electron conductive material (also referred as a cathode) (FIG. 15, 1503). The cathode may be connected to an electron conductive wire lead (1507). The cathode may be coated by a semi-permeable membrane (1502) to generate charge separation between a second electron conductive material (referred as an anode) (1501). In this example, the electron siphon population (1505) may be arranged to contact the anode (1501) and may serve as an interface with the electron donor population (1504) to harvest electrons from the donor population and transmit the electrons to the anode. The electrons may then travel into a second conductive wire (1506) and eventually into the grid.

Arrangement 11. Arrangement of Electron Donors on Electron Siphons in a Parallel Manner.

Figure 16:
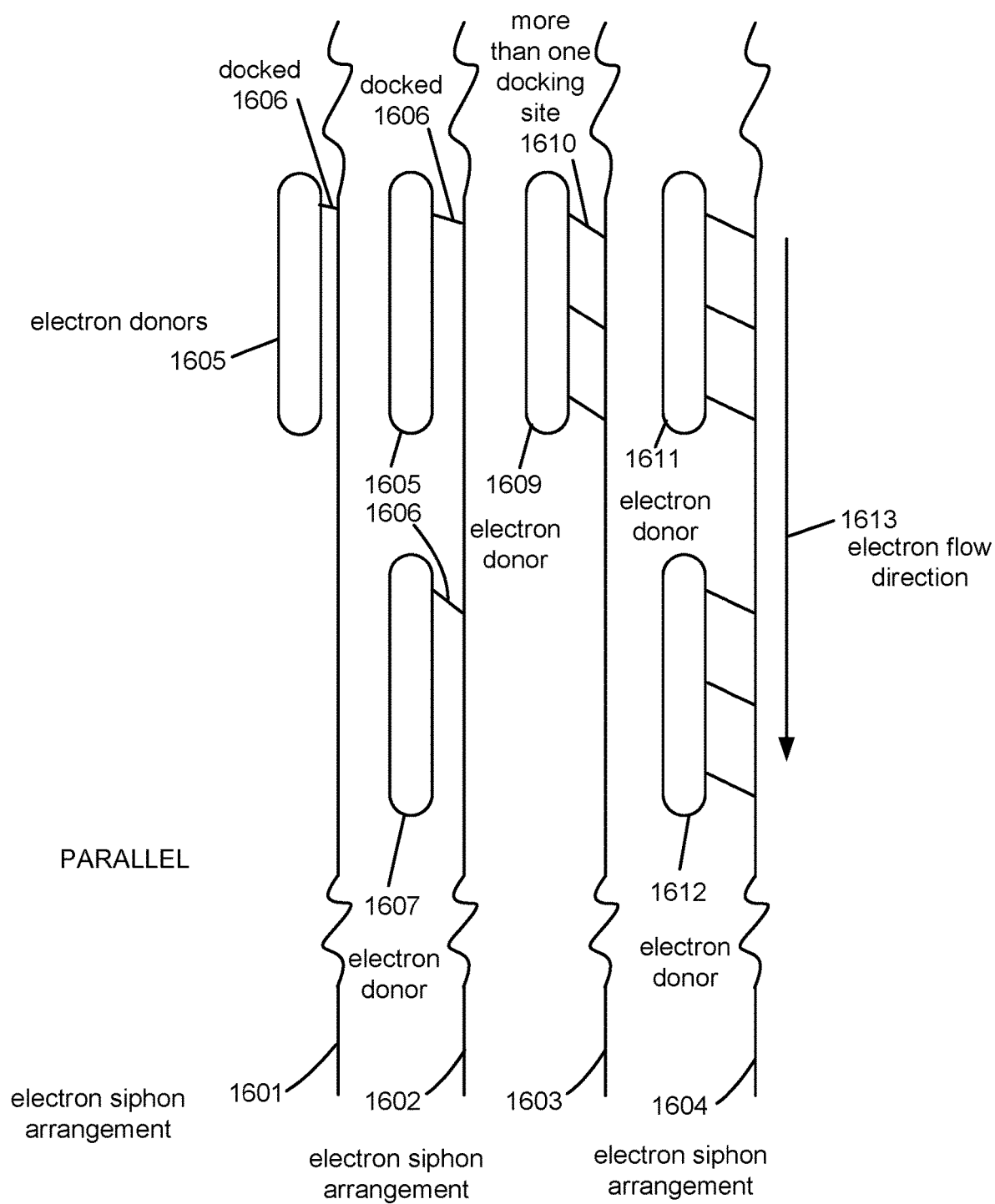
FIG. 16 presents an arrangement of electron donors on electron siphons in a parallel manner

In one example, electron donors (FIG. 16, 1605) may be docked (1606) at an electron siphon arrangement (1601). Docking may contain a covalent bond formation, affinity mediated interaction (for example, antibody-ligand driven affinity, hydrophobic-hydrophobic interaction, or other), or other. Electron flow from an electron donor (1605) may travel from the donor to the electron siphon (1601) and towards conductive electron material in a voltaic cell.

In one example, more than one electron donor (1605 and 1607) may be docked at an electron siphon arrangement (1602). Docking may be mediated by one or more manner (1606 and 1605). Electron flow may occur from each electron donor onto the electron siphon arrangement (1602) and towards conductive electron material in a voltaic cell.

In one example, more than one docking site (1610) may exist between an electron donor (1609) and an electron siphon arrangement (1603). Electron flow may occur from the electron donor through more than one docking site to the electron siphon arrangement.

In one example, more than one electron donor may be docked at an electron siphon arrangement (1604). In this example, electron donors (1611 and 1612) may be docked by more than one method and may transfer electrons to the same electron siphon arrangement in a manner parallel in nature, with electron flow in one direction (1613) on the electron siphon arrangement.

A docked arrangement of the electron donors at more than one point along the surface of an electron siphon arrangement enables increased electron harvest and may cause increased electron flow (also known as current). This example describes the design of a parallel element to be used in a circuit to generate increased current.

Arrangement 12. Arrangement of Voltaic Cells in Series.

Figure 17:
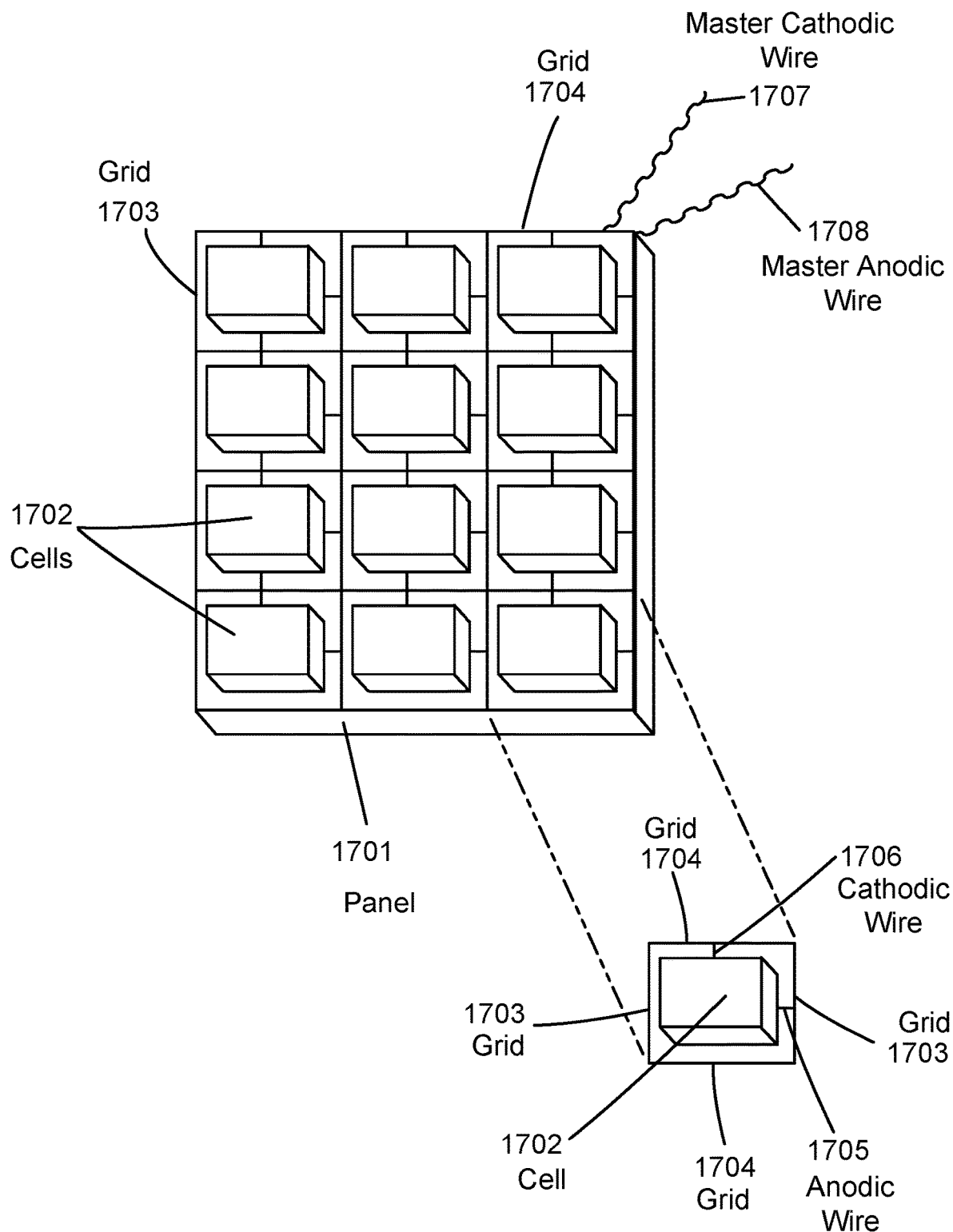
FIG. 17 presents a schematic of an arrangement of voltaic cells in series.

The arrangement of voltaic cells in a series may increase the voltage and the current disproportionately. In this arrangement, a panel (FIG. 17, 1701) may contain various voltaic cells (1702), each having a cathodic wire (1706) and an anodic wire (1705) to connect it to a grid of cathode (1704) and anode (1703), respectively. The panel may contain an array of cathodes and anodes and may be connected to a master cathodic wire (1707) and master anodic wire (1708), respectively.

Arrangement 13. Voltaic Panel and a Battery.

Figure 18:
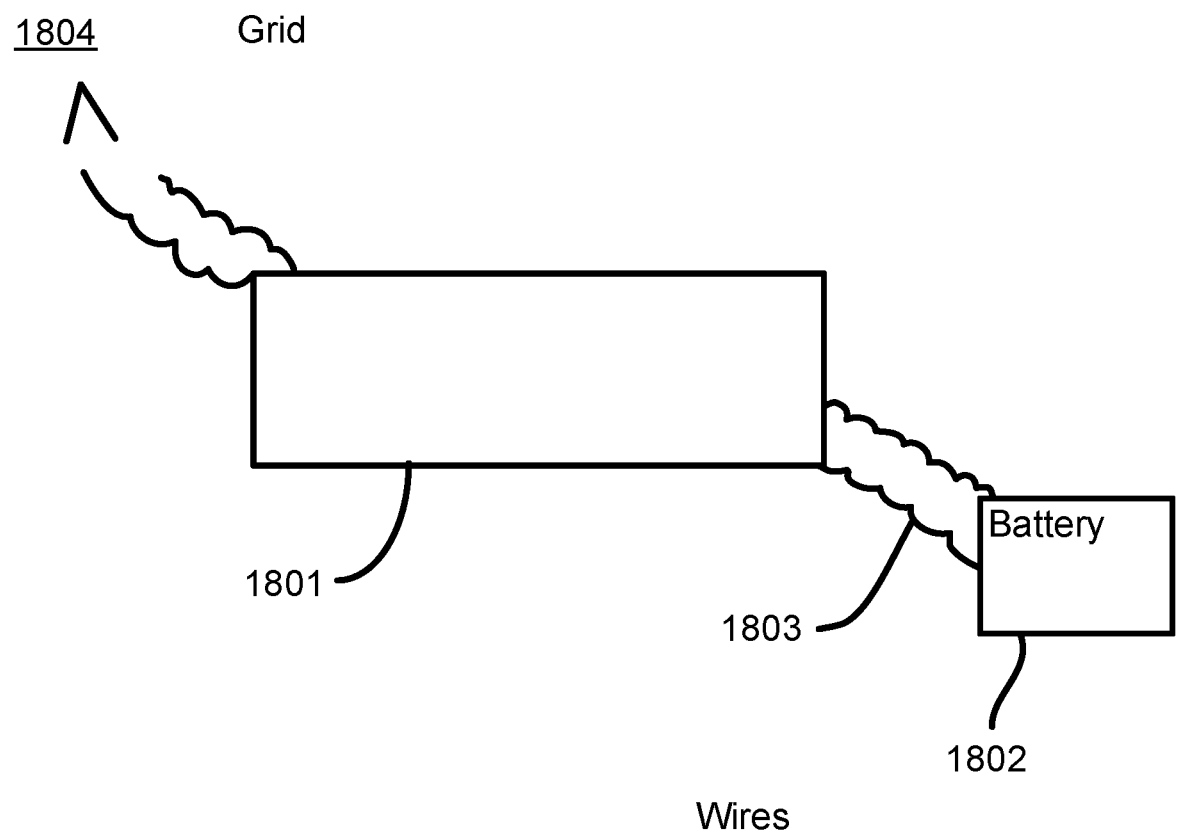
FIG. 18 presents a schematic of a voltaic panel and a battery.

In this arrangement, a voltaic panel (FIG. 18, 1801) may be connected to the grid (1804) and may also be connected through wires (1803) to a battery (1802). In some examples, the battery is serving as an external polarity-generating agent whereby the polarity of the voltaic panel may be determined by from the positive and negative electrodes of the battery leading to the voltaic panel. The applied potential may activate or enhance the activity certain microbes, light harvesting antennae, or other component of the voltaic cell. In some examples, excess power generated from the voltaic panel may be stored in the battery.

Arrangement 14—Immersible Voltaic Cell.

An immersible voltaic device for water-derived electricity may include two electrodes connected through a load and having different electrochemical potentials when immersed. In some examples, the device may be fully immersed in a body of water. In other examples, a portion of the device may be immersed in a body of water. Examples of bodies of water may include pools, ponds, lakes, streams, rivers, bays, oceans or manmade waterways.

In some embodiments, a voltaic cell for electricity generation in a body of water includes two electrodes, one electrode having a semi-permeable membrane surrounding the electrode to prevent microbes from contacting the electrode but allow ions to pass. The membrane may have an overall neutral or slight charge and may repel electrons and/or anions of the surrounding medium from one electrode. The membrane may also have a pore diameter of less than or equal to about 0.22 um. Examples of membrane materials include polypropylene, nylon, silica, or other. Membranes may be directly attached to the surface of the electrode or may be in a cage surrounding the electrode.

Electrodes may include solid or semi-solid forms and may be structured as plates, mesh, lattices, bristles, foams, clusters, emulsions or other. Electrode surfaces may be flat, stippled, rounded, circumferential, asymmetrical or other.

In some embodiments, electrodes may be arranged in a spatially separated manner having about 10 Angstroms to about 10 mm of separation between the electrodes. In other embodiments, electrodes may be arranged in a spatially separated manner having about 10 mm to about 0.5 m of space between the electrodes. In yet other embodiments, the electrodes may be spatially separated from about 0.5 m to about 2 m. In some embodiments, the electrodes may be fixed to a stationary surface. In other embodiments, the electrodes may be tethered by wire or other conductive material and may be moveable in an aqueous environment.

In another form, one electrode contacts a population of electron siphons. Sometimes, the electron siphons are attached to the electrode by covalent, electrostatic or other force. The electron siphons may be arranged in a collection prior to attachment to an electrode surface or arranged directly onto a surface. In some embodiments, electron siphons may be coated onto an electrode surface. Coatings may be regularly or irregularly deposited. Electron siphon coatings may be sequentially applied, whereby, a first layer of electron siphons may be applied and a second layer of different electron siphons may be applied. In some embodiments, an electrode surface is modified. In some embodiments, an electrode surface is modified. Electrodes may first be treated prior to electron siphon attachment. Treatments may include acid treatment, thermal treatment, oxidizing chemical treatment or other. In some embodiments, an electrode surface may be treated with about 1-500 mM HCl, perchloric acid, formic acid, acetic acid or other. In some embodiments, an electrode surface may be treated with heat. In other embodiments, an electrode surface may be treated with hydrogen peroxide, superoxide, hydroxide bases, and other chemical capable of oxidizing an electrode surface. Desired treatments do not interrupt the electrical conduction abilities of the electrode.

One purpose of electrode surface treatment is to generate reactive groups for attachment of electron siphons. Examples of reactive groups on an electrode surface that may be compatible for attachment of electron siphons include —OH, —SH, —S=O, epoxides, —COOH, C=O, —H, —NH, —NHS, —NH2, —NH3, azides, fluorobenzenes, imides, and others. In some embodiments, attachment of electron siphons to a treated electrode surface may occur through van der Waals forces, electrostatic forces or covalent bonds. In some other embodiments, attachment may be facilitated by a combination of bonding and forces. Following treatment of an electrode surface, a second treatment of the electrode surface may be performed to generate covalent attachment moieties as needed to further facilitate electron siphon attachment by covalent bonding.

Electron siphons may include aromatic amino acids, benzenes, positively charged amino acids, phenolic compounds, aromatic compounds, iron-sulfur clusters, carotinoids, pigments, proteins, protein filaments and others. Electron siphons may also include a structured arrangement including grapheme, carbon, metal, metalloid, composite, colloids, or other. In some examples, electron siphons may be modified. Modification of electron siphons may include the attachment of one or more additional electron siphon. In some examples, modification to electron siphons may occur prior to their arrangement in a voltaic cell. In other examples, electron siphon modification may occur following their arrangement in a voltaic cell.

In one example, a portion of a pre-arrangement of electron siphons may be activated and modified with aromatic amino acids, phenylalanine, tryptophan, tyrosine or other. In another example, a portion of a pre-arrangement of electron siphons may be activated and modified with pigments. In another example, a portion of a pre-arrangement of electron siphons may be activated and modified with PilA, c-type cytochromes, OmcZ and others.

Electrodes modified with electron siphons may harvest electrons from bodies of water containing microbes. Emersion of the electrodes into the water can generate measurable current. Increased current may be generated with an electrode modified with electron siphons. Using electron siphons serve multiple purposes: (i) they may increase the surface area of the electrode, (ii) they may provide a site of contact with a microbe in the body of water, (iii) they may provide a site of electron harvesting, (iv) they may provide a three dimensional surface to interface with a dynamic fluid, (v) they may serve as a solid surface of impact when a mechanical force is applied, or other.

A moving body of water containing microbes may increase the collision frequency between a microbial surface and an electrode. An electrode containing electron siphons may further increase the surface area and thus increase the number of collisions that can occur between microbes and an electrode. Optimal number, arrangement and composition of electron siphons on an electrode may further increase the electron transfer from the membrane of an aquatic microbe to the surface of the electrode. Examples of moving bodies of water include oceans, lakes, ponds, streams, and rivers, and man-made waterways such as dams, viaducts, aquaducts, canals, or other.

In one example, a voltaic cell includes 2 electrodes, one of which is coated with a semi-permeable membrane, the membrane of which has an exclusion limit of about 0.2 um (to keep microbes from contacting the electrode). The other electrode may be coated with electron siphons. A portion of the voltaic cell including the electrodes is immersed in an aqueous environment. Interaction of the aquatic microbes with an electrode may be passive or facilitated. Electron transfer from the microbial membrane to the electrode may occur at a rate that may be increased when an external physical force is applied, such as wave action. Force applied to the microbial surface may dislodge additional electrons, which may be captured by the electron siphons on an electrode. In one example, a voltaic cell includes multiple electrodes, a subset of which is coated with semi-permeable membranes. The other subset of which, may be modified by electron siphons.

Optical Components for Directing External Radiation

Mirrors, lens, filters, refraction elements, or other geometric optic components may be positioned in a vessel of a voltaic cell or may be positioned external to the vessel to reflect or concentrate light energy into the vessel. In some embodiments, mirrors may be used in a voltaic cell containing photosynthetic microbial cell population. Mirrors may contain a reflective surface capable of reflecting or concentrating light. Voltaic cells with photovoltaic properties may contain more than one mirror and more than one lens for directing light and focusing light for maximal light capture ability.

Regulators

A voltaic cell may include a regulator subsystem containing a regulating component to affect one or more features of a voltaic cell. In some embodiments, a regulator subsystem is used to affect one or more of the following features: electron conduction rate, ion conduction rate, light polarization, reductant concentration, oxidant concentration, carbon source concentration, nitrogen concentration, phosphorus concentration, sulfur concentration, trace mineral concentration, co-factor concentration, chelator concentration, pH, electron siphon, light harvesting antennae concentration and/or other voltaic cell parameter. Regulator subsystems may also release or bind one or more of the features to/from the voltaic cell on a regular or periodic basis. Regulators may release or bind one or more feature to/from the voltaic cell in response to a sensed condition to serve as one or more feedback response to one or more condition within the voltaic cell. Examples of features to bind or release include acids or hydrogen ions, bases or hydroxyl ions, or other species that inhibit or potentiate microbe metabolism. In some embodiments, a regulator releases or scavenges one or more species on a periodic basis, e.g., on the order of minutes, hours, days, or weeks.

In some embodiments, a regulator subsystem may contain one or more regulator components. Regulator components may contain one or more of the following: sensors, detectors, pumps, injectors, containers, or other components in a feedback system. The regulators may monitor one or more feature of the voltaic cell including but not limited to: power, current, voltage, resistance, pH, reduction potential, oxidation potential, nutrient concentration, waste concentration, optical density, refractive index, absorbance, luminosity, temperature, viscosity, ionic strength, and the like.

In some embodiments, a regulator subsystem may contain one or more sensors. The sensor may monitor conditions of the buffer; products of the microbial population; products of the light harvesting antennae population; and/or products of the conductive terminal electron acceptor population of a voltaic cell. Examples of sensing that a sensor may perform include but are not limited to: pH, reductant concentration, oxidant concentration, redox potential, voltage, current, resistance, electrical power output, current, viscosity, turbidity, gas concentration, pressure, temperature, amino acid concentration, mineral concentration, carbon concentration, gas concentration or other. In some implementations, the regulator subsystem will be implemented as a feedback system that automatically adjusts parameters in the voltaic cell. In some implementations, the regulator system provides notifications or alarms when a sensed cell parameter. Such notifications or alarms may be presented in a computational system for observation by a process manager or other person responsible for monitoring and/or correcting the voltaic cell's operation.

EXAMPLES

Example 1

A light-conversion system containing a thermophilic photosynthetic mixed-microbial population as the light-harvesting antennae component population Presented herein is a mixed-microbial population as the light-harvesting antennae component population for use in a light-conversion system. The mixed-microbial population contains part *Chromatium* spp., part *Chloroflexus* spp., part *Roseiflexus* spp. and part *Porphyrobacter* spp. having optimal synergy in a light-conversion system. Microbes are cultivated separately using standard techniques and then mixed into stock concentrations prior to dilution in buffered electrolyte solution, which is ready for administration to a prepared light-conversion system through a sample inlet port.

*Chromatium* spp. belong to the photosynthetic bacterial genus *Chromatium*, which can inhabit a plurality of environments. The species *Chromatium tepidum* is a high G-C gram-negative rod-shaped photosynthetic thermophilic bacterium. This organism grows photoautotrophically at an optimum temperature of 48-50 degrees Celsius and uses sulfide as the electron donor. The bacterium synthesizes bacteriochlorophyll $a_p$ and carotinoids rhodovibrin and spirilloxanthin, which are located in the membrane portion of the organism.

*Chloroflexus* spp. are members of the green non-sulfur bacteria. *Chloroflexus aurantiacus* is a filamentous thermophilic anoxygenic photoheterotrophic bacterium with optimal growth temperatures of 54-57 degrees Celsius but can grow at temperatures above 70 degrees Celsius. Additionally, *C. aurantiacus* can survive in the presence of oxygen and can fix inorganic carbon if necessary. *C. aurantiacus* synthesizes bacteriochlorophyll a and bacteriochlorophyll c, which are located in the membrane portion of the organism.

*Roseiflexus* spp. are members of the photosynthetic green non-sulfur bacteria. *Roseiflexus* spp. are unbranched multicellular filamentous thermophiles with optimal growth temperature ranges spanning 45-55 degrees Celsius. Many *Roseiflexus* spp. synthesize bacteriorhodopsins and bacteriochlorophyll a, gamma carotene derivatives as light pigments in their membrane portion.

*Porphyrobacter tepidarius* is a moderately thermophilic aerobic heterotrophic and photosynthetic bacterium having an optimal growth temperature of 40 to 48 degrees Celsius and uses organic carbon sources for growth. The bacterium synthesizes OH-beta-carotene sulfate derivatives, nostoxanthin and bacteriorubixanthinal as light-absorbing pigments.

Example 2

A light-conversion system containing membranes containing Fenna-Matthews-Olson pigment-protein complexes isolated from green sulfur bacteria as the light-harvesting antennae component population Photosynthetic microbes use a network of pigments juxtaposed to structural proteins in their membranes to use light energy to generate and harvest electrons from a donor molecule. In most microbes, energy is lost as the electrons move through the pigment-protein complexes. In green sulfur bacteria, the efficiency of electron passage through the system (called the Fenna-Matthews-Olson complex) is highly efficient and very little energy is lost in the electron transfer process.

Presented herein is a light-conversion system containing membranes prepared from green sulfur bacteria that are cultivated under anaerobic conditions by standard methods (Wahlund, 1991; Buttner, 1992). The membranes are then prepared by French press under anoxic conditions to preserve the light-harvesting nature of the pigments and structural protein complexes associated with the membrane. Recovered membrane content is then mixed with buffered electrolyte solution and then administered to a prepared light-conversion system through a sample inlet port.

Example 3

A light-conversion system containing modified single-walled carbon nanotubes as the conductive nano-scale components Cytochrome complex (Cyt c) is a small heme protein (100-104 amino acids) belonging to the cytochrome c protein family. Cyt c is a very soluble protein that has been successfully over-expressed in *E. coli* and purified by conventional purification methods (Jeng, 2002). Cyt c is normally a significant component of mammalian mitochondrial membranes, plants and many microbes. Cyt c has significant redox potential (0.246 Volts) and electron transfer abilities, as it is an essential component of the electron transport chain.

Presented herein is a light-conversion system containing single-walled carbon nanotubes (SWNTs) functionalized asymmetrically with recombinant Cyt c to generate a biosafe interface for electron scavenging from a light-harvesting antennae component population. The SWNTs are prepared for functionalization by spraying diazonium salts on one portion of the SWNTs to generate carboxylic acid moieties. EDC is then applied to the SWNTs to activate the —COOH moieties and are stabilized in the presence of sulfo-NHS. The sulfo-NHS is then displaced by primary amines on surface lysine residues of Cyt c prior to quenching (based on methods from Lerner, 2013). Conditions for maximal electron scavenging activity for Cyt c functionalization of SWNTs lies in generating covalent bonds between SWNT-specific active sites and 1-2 lysine residues of Cyt c to preserve the remaining lysine residues to coordinate electron binding properties.

The naked end of the Cyt c functionalized SWNTs are applied directly to the back plate in a manner to enable the Cyt c enriched end of the SWNTs to have an outward facing orientation to enable the Cyt c enriched end to interact directly with the light-harvesting antennae component population.

Example 4

Figure 19:
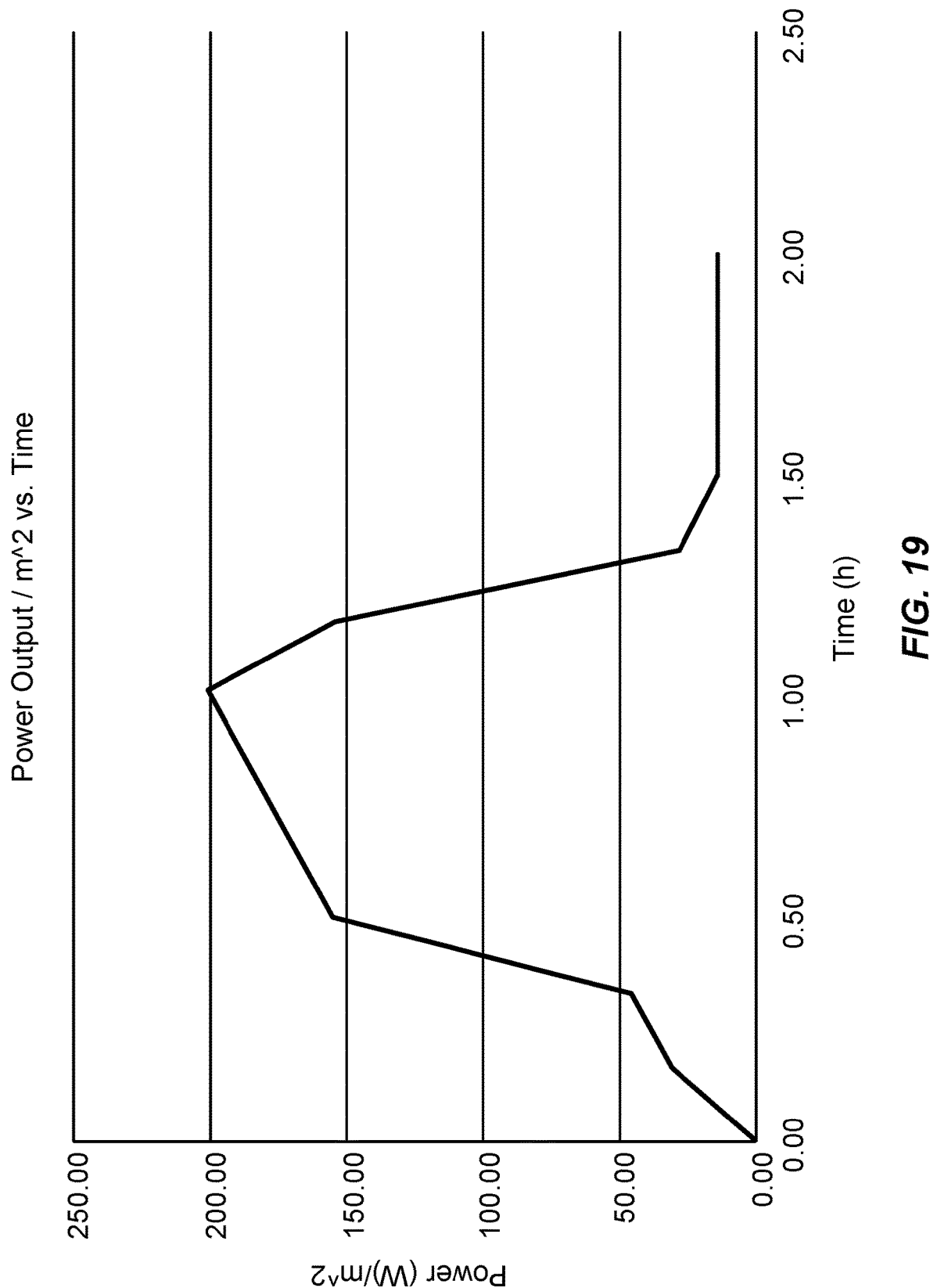
FIGS. 19 and 20 are plots of power output over time for voltaic cells constructed in accordance with certain embodiments.

Synthetic conductive and/or semi-conductive materials used to conduct a current may be hostile to a biological cell. In the example of FIG. 19, a population of photosynthetic and non-photosynthetic microbes isolated from a brackish water source was mixed with an ionic buffer system and was then introduced into a clear polyethylene vessel with a removable lid. Placed inside the vessel were a conductive copper plate and a heat-treated conductive copper oxide plate with the face of each plate positioned parallel to one another and perpendicular with respect to the microbial population/buffer system. Both conductive metal plates had portions that were immersed in the microbial population/buffer system (0.25 inches) with the remaining portion exposed to the air. Measurement of voltage and current produced by the cell immediately upon introduction of the microbial population into the vessel at time 0 was 0. The cell was then exposed to constant incandescent light and the amount of voltage and current was measured at regular intervals up to 1 hour as measured by voltmeter and ammeter every 15 minutes. At hour 1, unmodified synthetic carbon nanotubes were added to the conversion cell and a drop in current and voltage was measured concomitant with the appearance of lysed microbial debris on the surface of the buffer in the conversion cell. This example suggests that modified nanotubes are needed to provide biologically safe electron siphons.

Example 5

Figure 20:
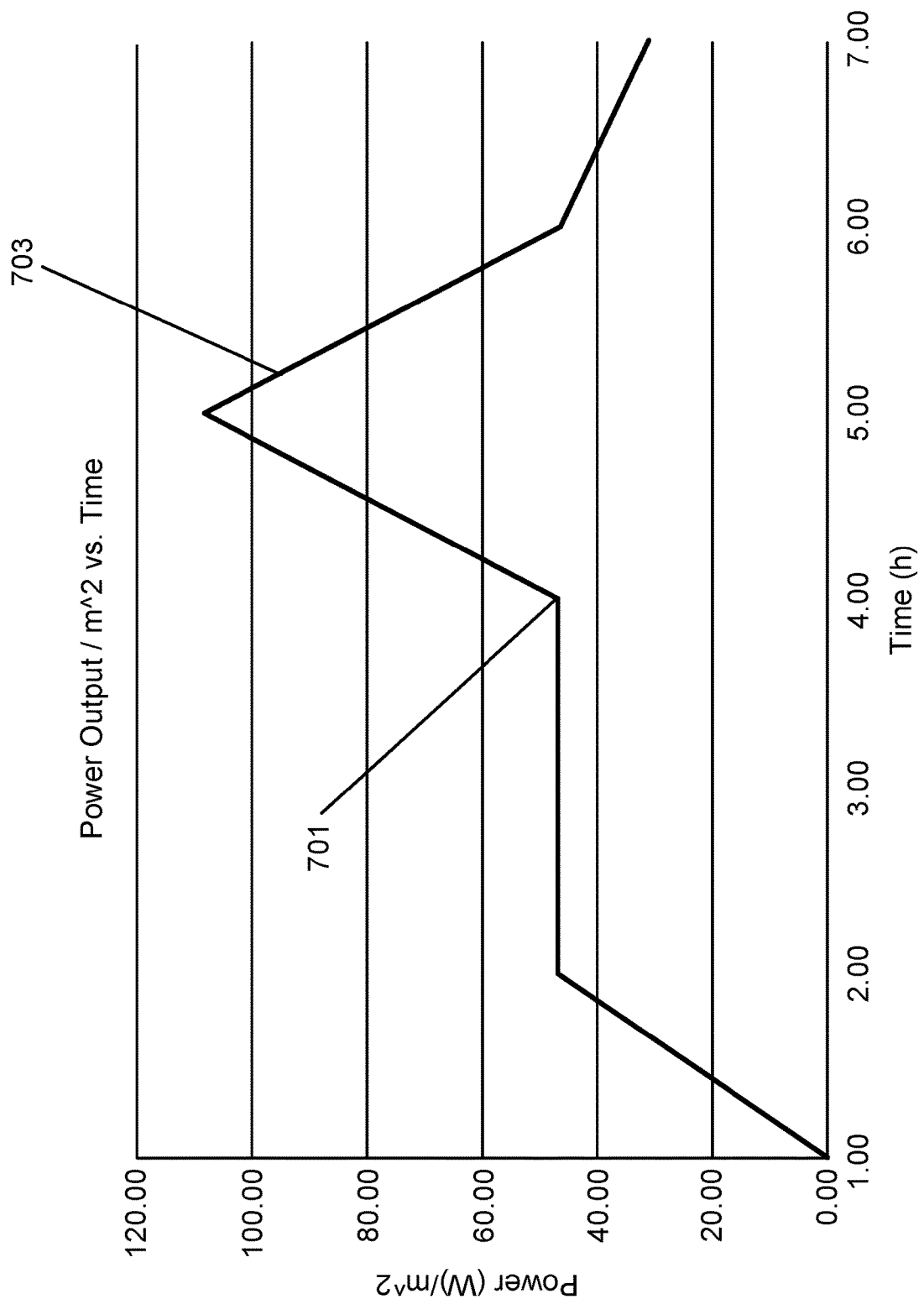

Further, in FIG. 20, a population of photosynthetic and non-photosynthetic microbes isolated from a brackish water source was mixed with an ionic buffer system and was then introduced into a clear polyethylene vessel with a removable lid. Placed inside the vessel were a conductive copper plate and a heat-treated conductive copper oxide plate with the face of each plate positioned parallel to one another and perpendicular with respect to the microbial population/buffer system. Both conductive metal plates had portions that were immersed in the microbial population/buffer system (0.25 inches) with the remaining portion exposed to the air. Measurement of voltage and current produced by the cell immediately upon introduction of the microbial population into the vessel is represented at time 0. The cell was then exposed to constant incandescent light and the amount of voltage and current was measured at regular intervals. At 4 hours, biologically-compatible L-Arginine-modified single-walled carbon nanotubes were introduced 701 to the microbial population in the energy conversion cell and resulted in a marked increase in detectable voltage and current. At 5 hours, the light was turned off 703 and the resulting power generated by the conversion cell decreased but did not return to baseline levels over several hours of darkness suggesting that the energy conversion cell was producing power from non-photosynthetic microbial metabolism.

Although the foregoing has been described in some detail to facilitate understanding, the described embodiments are to be considered illustrative and not limiting. It will be apparent to one of ordinary skill in the art that certain changes and modifications can be practiced within the scope of the appended claims.

What is claimed is:

1. A voltaic cell comprising:
   (a) an anode for receiving electrons and providing electrons to an external circuit or load;
   (b) a cathode for donating electrons to an electrochemical reaction.
   (c) a biofilm comprising a microbe, the biofilm in electrical contact with the anode or the cathode, wherein the microbe capable of transferring electrons, and wherein the biofilm is at least 50 microns thick;
   (d) a buffer comprising an ionically conductive medium in contact with the anode and the cathode;
   (e) a vessel at least partially containing the biofilm and the buffer;
   (f) a light-conversion system having a glass top plate;
   (g) one or more ultraviolet (UV) light-resistant gaskets which form a leak-proof seal around the glass top plate; and
   (h) a light-harvesting antennae component population arranged for light-absorption,
   wherein the light-harvesting antennae component population is juxtaposed to a layer of conductive nanomaterial.

2. The voltaic cell of claim 1, wherein the microbe has pili, fibrils, flagella, and/or a filamentous shape.

3. The voltaic cell of claim 1, wherein the microbe comprises pili that form a network in the biofilm.

4. The voltaic cell of claim 1, wherein the microbe is a *geobacter*.

5. The voltaic cell of claim 1, wherein the microbe is *geobacter sulfurreducens*.

6. The voltaic cell of claim 1, wherein the anode is a sole electron acceptor in the voltaic cell.

7. The voltaic cell of claim 1, wherein the biofilm is in contact with the anode comprising graphite.

8. The voltaic cell of claim 7, wherein the biofilm is grown on a surface in a flow-through system having the graphite electrode.

9. The voltaic cell of claim 7, wherein the graphite electrode comprises fumarate.

10. The voltaic cell of claim 1, further comprising an ion permeable and electron donor impermeable barrier separating the buffer into an anode compartment and a cathode compartment.

11. The voltaic cell of claim 10, wherein the ion permeable and electron donor impermeable barrier is electronically conductive.

12. The voltaic cell of claim 1, wherein the microbe comprises light harvesting antennae.

13. The voltaic cell of claim 1, wherein the microbe comprises a phototrophic or chemo-trophic microbe.

14. The voltaic cell of claim 1, wherein, during operation, electrons generated by the microbe are transferred along pili in the biofilm.

15. The voltaic cell of claim 1, wherein, during operation, the microbe transfers electrons through the biofilm to the anode.

16. The voltaic cell of claim 1, wherein at least one of the anode and the cathode comprises a metal.

* * * * *